United States Patent
Ishikawa et al.

(10) Patent No.: US 11,624,001 B2
(45) Date of Patent: Apr. 11, 2023

(54) LIGHT-SHIELDING COMPOSITION, CURED FILM, COLOR FILTER, LIGHT-SHIELDING FILM, SOLID-STATE IMAGING ELEMENT, AND IMAGE DISPLAY DEVICE

(71) Applicant: FUJIFILM Corporation, Tokyo (JP)

(72) Inventors: Tatsuo Ishikawa, Haibara-gun (JP); Yoshinori Taguchi, Haibara-gun (JP); Yuki Sakamoto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 332 days.

(21) Appl. No.: 17/130,760

(22) Filed: Dec. 22, 2020

(65) Prior Publication Data

US 2021/0108103 A1  Apr. 15, 2021

Related U.S. Application Data

(63) Continuation of application No. PCT/JP2019/030829, filed on Aug. 6, 2019.

(30) Foreign Application Priority Data

Sep. 11, 2018  (JP) .............................. JP2018-169573

(51) Int. Cl.
*C09D 151/08* (2006.01)
*G02B 1/04* (2006.01)
(Continued)

(52) U.S. Cl.
CPC ............. *C09D 151/08* (2013.01); *C09D 4/06* (2013.01); *C09D 5/32* (2013.01); *C09D 7/62* (2018.01);
(Continued)

(58) Field of Classification Search
CPC ... C09D 4/06; C09D 5/32; C09D 7/62; C09D 7/65; C09D 151/08; G02B 1/04; G02B 5/003
See application file for complete search history.

(56) References Cited

U.S. PATENT DOCUMENTS

2019/0185656 A1* 6/2019 Ogawa .................. H04N 5/225
2019/0256411 A1   8/2019 Disteldorf et al.

FOREIGN PATENT DOCUMENTS

CN   101942233 A   1/2011
CN   105814002 A   7/2016
(Continued)

OTHER PUBLICATIONS

International Search Report dated Oct. 21, 2019 from the International Searching Authority in International Application No. PCT/JP2019/030829.

(Continued)

*Primary Examiner* — Bijan Ahvazi
(74) *Attorney, Agent, or Firm* — Sughrue Mion, PLLC

(57) ABSTRACT

A light-shielding composition includes a light-shielding pigment, a resin, a polymerizable compound, which is a low-molecular-weight compound containing an ethylenically unsaturated group, and a polymerization initiator, in which the light-shielding pigment contains an inorganic particle, and an inorganic compound coating the inorganic particle, the inorganic particle contains one or more nitrogen-containing metal compounds selected from the group consisting of zirconium nitride, zirconium oxynitride, vanadium nitride, vanadium oxynitride, niobium nitride, and niobium oxynitride, the inorganic compound contains a silicon atom, and a contained atom number ratio of a total content of metallic atoms, which are selected from the group consisting of a zirconium atom, a vanadium atom, and a niobium atom, to a content of the silicon atom in a surface of the light-shielding pigment, as determined by X-ray photoelectron spectroscopy, is greater than 1.0.

13 Claims, 3 Drawing Sheets

(51) Int. Cl.
  *G02B 5/00*   (2006.01)
  *C09D 7/65*   (2018.01)
  *C09D 7/62*   (2018.01)
  *C09D 4/06*   (2006.01)
  *C09D 5/32*   (2006.01)
(52) U.S. Cl.
  CPC .............. *C09D 7/65* (2018.01); *G02B 1/04* (2013.01); *G02B 5/003* (2013.01)

(56) References Cited

FOREIGN PATENT DOCUMENTS

| JP | 2012-096945 A | 5/2012 | |
|---|---|---|---|
| JP | 2015-189947 A | 11/2015 | |
| WO | 2017/175550 A1 | 10/2017 | |
| WO | 2018/037913 A1 | 3/2018 | |
| WO | 2018037812 A1 | 3/2018 | |
| WO | WO-2018037913 A1 * | 3/2018 | ............... C08F 2/44 |
| WO | 2018061644 A1 | 4/2018 | |

OTHER PUBLICATIONS

Written Opinion dated Oct. 21, 2019 from the International Searching Authority in International Application No. PCT/JP2019/030829.
International Preliminary Report on Patentability dated Mar. 9, 2021 from the International Bureau in International Application No. PCT/JP2019/030829.
Communication dated Jan. 30, 2022 from the Chinese Patent Office in Chinese Application No. 201980045417.0.

* cited by examiner

LIGHT-SHIELDING COMPOSITION, CURED FILM, COLOR FILTER, LIGHT-SHIELDING FILM, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2019/030829 filed on Aug. 6, 2019, which claims priority under 35 U.S.C § 119(a) to Japanese Patent Application No. 2018-169573 filed on Sep. 11, 2018. Each of the above application(s) is hereby expressly incorporated by reference, in its entirety, into the present application.

BACKGROUND OF THE INVENTION

1. Field of the Invention

The present invention relates to a light-shielding composition, a cured film, a color filter, a light-shielding film, a solid-state imaging element, and an image display device.

2. Description of the Related Art

In the related art, as a black powder, a composition containing a titanium nitride is known. The composition containing a titanium nitride is used in various applications, and has been used, for example, for producing a light-shielding film provided in a liquid crystal display device, a solid-state imaging device, or the like.

Specifically, a color filter used in a liquid crystal display device comprises a light-shielding film which is called a black matrix, for the purpose of shielding light between colored pixels, enhancing contrast, and the like.

Furthermore, a solid-state imaging element is also provided with a light-shielding film for the purpose of preventing the generation of noise, improving image quality, and the like. Currently, a compact and thin imaging unit is mounted on a mobile terminal of electronic equipment such as a mobile phone and a personal digital assistant (PDA). In general, such an imaging unit comprises a solid-state imaging element such as a charge coupled device (CCD) image sensor and a complementary metal-oxide semiconductor (CMOS) image sensor, and a lens for forming a subject image on the solid-state imaging element.

In addition, in recent years, black powders other than a titanium nitride have also been investigated. For example, JP2012-096945A discloses a "blue color-shielding black powder consisting of one or two oxynitrides of vanadium or niobium, in which an oxygen content is equal to or less than 16 wt %, a nitrogen content is equal to or greater than 10 wt %, and a transmittance X at 450 nm in transmission spectra of a dispersion liquid having a powder concentration of 50 ppm is equal to or less than 10.0%".

SUMMARY OF THE INVENTION

The blue color-shielding black powder described in JP2012-096945A has excellent properties as a black pigment having high light-shielding properties. Incidentally, in recent years, there has been an increasing demand for an ability to manufacture products having stable quality even in a case where manufacturing conditions are varied. For example, a composition containing a black pigment is required to have stable quality even in a case where the composition is stored for a longer period of time than before.

Accordingly, an object of the present invention is to provide a light-shielding composition having excellent long-term temporal stability. Moreover, another object of the present invention is to provide a cured film, a color filter, a light-shielding film, a solid-state imaging element, and an image display device.

As a result of conducting an extensive investigation to achieve the objects, the present inventors have found that the objects can be achieved by the following constitution.

[1]

A light-shielding composition comprising: a light-shielding pigment; a resin; a polymerizable compound which is a low-molecular-weight compound containing an ethylenically unsaturated group: and a polymerization initiator, in which the light-shielding pigment contains an inorganic particle, and an inorganic compound coating the inorganic particle, the inorganic particle contains one or more nitrogen-containing metal compounds selected from the group consisting of zirconium nitride, zirconium oxynitride, vanadium nitride, vanadium oxynitride, niobium nitride, and niobium oxynitride, the inorganic compound contains a silicon atom, and a contained atom number ratio of a total content of metallic atoms, which are selected from the group consisting of a zirconium atom, a vanadium atom, and a niobium atom, to a content of the silicon atom in a surface of the light-shielding pigment, as determined by X-ray photoelectron spectroscopy, is greater than 1.0.

[2]

The light-shielding composition as described in [1], in which the nitrogen-containing metal compound is one or more selected from the group consisting of zirconium nitride and zirconium oxynitride.

[3]

The light-shielding composition as described in [1] or 121, in which the inorganic compound contains $SiO_2$.

[4]

The light-shielding composition as described in any one of [1] to [3], in which the nitrogen-containing metal compound is one or more selected from the group consisting of zirconium nitride and zirconium oxynitride, and the inorganic compound contains zirconium silicide.

[5]

The light-shielding composition as described in any one of [1] to [4], in which the contained atom number ratio is 1.5 to 3.0.

[6]

The light-shielding composition as described in any one of [1] to [5], in which the resin is a graft polymer.

[7]

The light-shielding composition as described in any one of [1] to [6], in which the resin contains an ethylenically unsaturated group.

[8]

The light-shielding composition as described in any one of [1] to [7], in which the polymerization initiator is an oxime compound.

[9]

A cured film formed of the light-shielding composition as described in any one of [1] to [8].

[10]

A color filter comprising the cured film as described in [9].

[11]

A light-shielding film comprising the cured film as described in [9].

[12]

A solid-state imaging element comprising the cured film as described in [9].

[13]

An image display device comprising the cured film as described in [9].

According to the present invention, it is possible to provide a light-shielding composition having excellent long-term temporal stability. Moreover, according to the present invention, it is possible to provide a cured film, a color filter, a light-shielding film, a solid-state imaging element, and an image display device.

DESCRIPTION OF THE PREFERRED EMBODIMENTS

Figure 1:
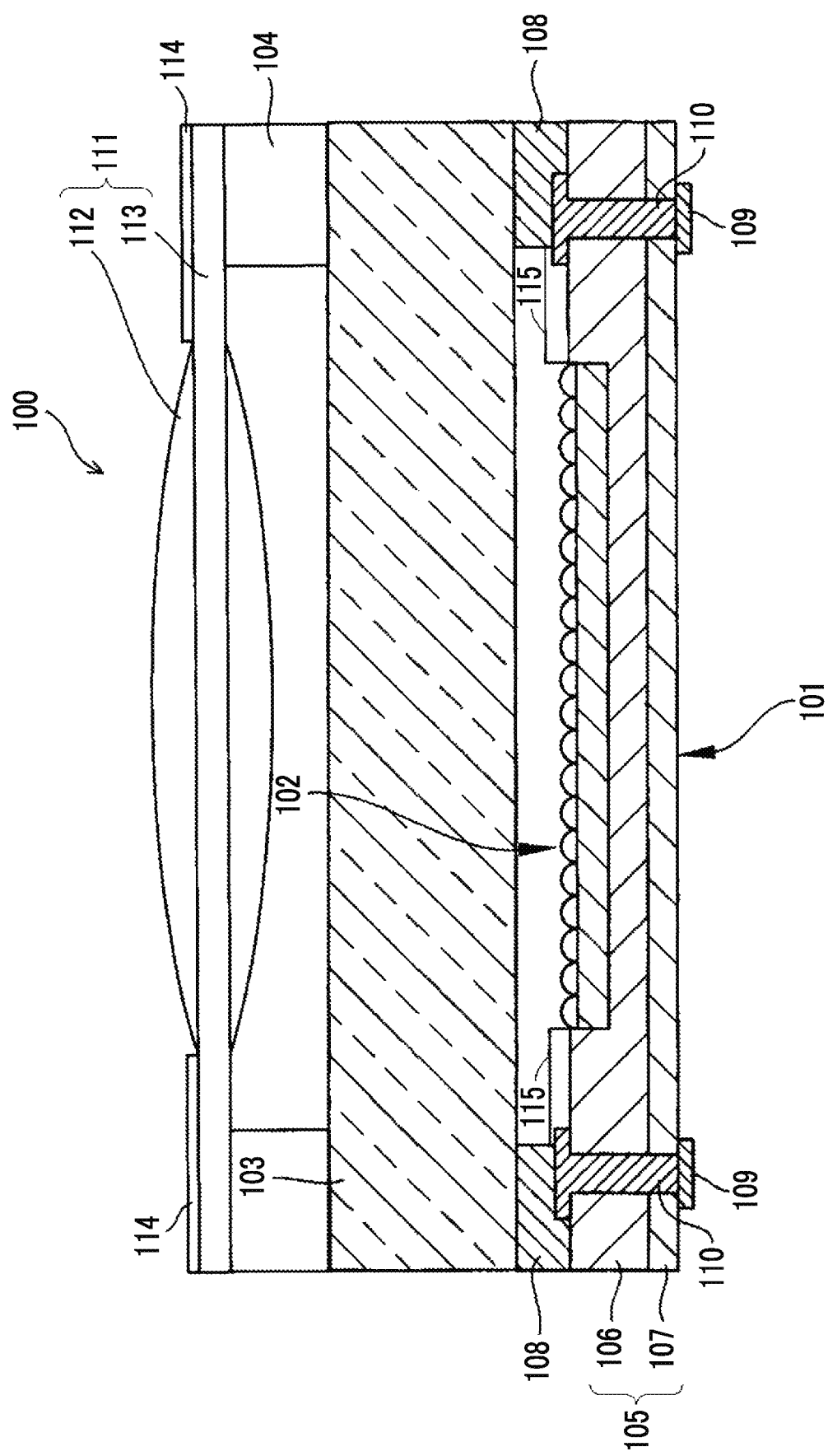
FIG. 1 is a schematic cross-sectional view showing an example of the constitution of a solid-state imaging device.

Hereinafter, the present invention will be described in detail.

The description of the following constituting requirements is made based on typical embodiments of the present invention in some cases, but the present invention is not limited to the embodiments.

Furthermore, in the present specification, a numerical range expressed using "to" means a range including numerical values described before and after "to" as a lower limit value and an upper limit value.

In the present specification, regarding the description of a group (atomic group), in a case where whether the group is substituted or unsubstituted is not described, the group includes a group which has a substituent as well as a group which does not have a substituent. For example, an "alkyl group" includes not only an alkyl group (unsubstituted alkyl group) which does not have a substituent but also an alkyl group (substituted alkyl group) which has a substituent.

In addition, in the present specification, "actinic rays" or "radiation" refers to, for example, far ultraviolet rays, extreme ultraviolet rays (EUV: extreme ultraviolet lithography), X-rays, electron beams, and the like. Moreover, in the present specification, "light" refers to actinic rays and radiation. In the present specification, unless otherwise specified, "exposure" includes not only exposure with far ultraviolet rays, X-rays, EUV light, or the like but also lithography by particle beams such as electron beams and ion beams.

In the present specification, "(meth)acrylate" represents acrylate and methacrylate. In the present specification, "(meth)acryl" represents acryl and methacryl. In the present specification, "(meth)acryloyl" represents acryloyl and methacryloyl. In the present specification. "(meth)acrylamide" represents acrylamide and methacrylamide. In the present specification, a "monomeric substance" and a "monomer" have the same definition.

In the present specification, a weight-average molecular weight (Mw) is a value in terms of polystyrene, as measured by a gel permeation chromatography (GPC) method.

In the present specification, the GPC method is based on a method in which HLC-8020 GPC (manufactured by TOSOH CORPORATION) is used, TSKge SuperHZM-H, TSKgel SuperHZ4000, and TSKgel SuperHZ2000 (manufactured by TOSOH CORPORATION, 4.6 mm ID×15 cm) are used as columns, and tetrahydrofuran (THF) is used as an eluent.

[Light-Shielding Composition]

A light-shielding composition (hereinafter, simply referred to as a "composition" as well) according to an embodiment of the present invention contains a light-shielding pigment, a resin, a polymerizable compound, which is a low-molecular-weight compound containing an ethylenically unsaturated group, and a polymerization initiator.

The light-shielding pigment contains an inorganic particle, and an inorganic compound coating the inorganic particle.

The inorganic particle contains one or more nitrogen-containing metal compounds selected from the group consisting of zirconium nitride, zirconium oxynitride, vanadium nitride, vanadium oxynitride, niobium nitride, and niobium oxynitride.

The inorganic compound contains a silicon atom.

Furthermore, in a case where a surface of the light-shielding pigment is analyzed using X-ray photoelectron spectroscopy, a contained atom number ratio of a total content of metallic atoms, which are selected from the group consisting of a zirconium atom, a vanadium atom, and a niobium atom, to a content of the silicon atom is greater than 1.0.

The mechanism by which the objects of the present invention are achieved with the composition having the constitution described above is not always clear, but the present inventors presume as follows.

The light-shielding pigment contained in the composition according to the embodiment of the present invention is a light-shielding pigment in which a content ratio of predetermined atoms is within a predetermined range in a case where the surface thereof is analyzed using the X-ray photoelectron spectroscopy. Such a light-shielding pigment easily interacts with other components (for example, a resin) in the composition, and has favorable dispersibility. For the reason, it is presumed that in the composition according to the embodiment of the present invention, the light-shielding pigment is less likely to be precipitated even with the lapse of time, and long-term temporal stability is favorable.

[Light-Shielding Pigment]

The composition according to the embodiment of the present invention contains a light-shielding pigment.

A content of the light-shielding pigment in the composition is preferably 10% to 90% by mass, more preferably 30% to 60% by mass, and even more preferably 40% to 70% by mass, with respect to a total mass of a solid content of the composition.

The "light shielding" using a cured film formed of the composition according to the embodiment of the present invention is a concept that also includes light attenuation in which light passes through the cured film while being attenuated. In a case where the cured film (light-shielding film) is used as a light-attenuating film having such a function, it is also preferable that the content of the light-shielding pigment in the composition is less than the above suitable range.

One light-shielding pigment may be used singly or two or more light-shielding pigments may be used.

Furthermore, in the present specification, the solid content of the composition refers to all components except a solvent in a case where the composition contains the solvent (an organic solvent, water, or the like), and as long as the component is a component other than the solvent, the component is considered to be a solid content even in a case where the component is a liquid component.

The light-shielding pigment contains the following components (1) and (2).

(1) Inorganic particle
(2) Inorganic compound coating the inorganic particle

Moreover, one of feature points of the light-shielding composition is that the contained atom number ratio (=total content of specific metallic atoms/content of silicon atom, and hereinafter, referred to as a "specific ratio" as well) of the total content of metallic atoms (hereinafter, referred to as "specific metallic atoms" as well), which are selected from the group consisting of a zirconium atom, a vanadium atom, and a niobium atom, to the content of the silicon atom in a surface of the light-shielding pigment, as determined by the X-ray photoelectron spectroscopy, is greater than 1.0.

In the present specification, the X-ray photoelectron spectroscopy (ESCA: electron spectroscopy for chemical analysis) is a method for analyzing the content (content based on the number of atoms of each atom: atomic %) of each atom present on a surface of an object to be measured (light-shielding pigment) by irradiating the object to be measured with X-rays, and measuring the intrinsic energy of the generated photoelectron, and is performed under the following conditions.

Device: Quantera-SXM (trade name) device manufactured by Physical Electronics, Inc.

X-ray source: Monochromatic Al Kα rays (1486.6 eV, 25 W, 15 kV, and beam diameter of 200 μmφ)

Measurement region: 200 μmφ

Measurement conditions: Pass Energy=140 eV, step=0.1 eV, and integrated number of times of 4 to 8

Measuring method: Particles are pressed using a press machine to obtain a thin pellet-shaped measurement sample. This measurement sample is set in the aforementioned device and measured with a photoelectron extraction angle of 10 degrees.

In addition, the light-shielding pigment can be separated from the light-shielding composition by the following method.

A dissolving solution is obtained by first adding an organic solvent containing chloroform to the light-shielding composition to dissolve components other than particles. The dissolving solution is subjected to centrifugal separation to obtain a precipitate. Next, the precipitate is heated and concentrated to obtain a light-shielding pigment.

According to the X-ray photoelectron spectroscopy, the content (unit: atomic %) of a silicon atom with respect to all atoms contained in the surface of the light-shielding pigment, and the total content (unit: atomic %) of the specific metallic atoms with respect to all atoms contained in the surface of the light-shielding pigment can be determined.

The specific ratio in the surface of the light-shielding pigment is calculated by the following expression.

Expression: Specific ratio=total content of specific metallic atoms (unit: atomic %)/content of silicon atom (unit: atomic %)

Furthermore, in the present specification, the surface refers to a region within a depth of 2 nm from the outermost surface of the light-shielding pigment.

The specific ratio of the light-shielding pigment is greater than 1.0, and from the viewpoint that temporal stability of the composition is superior, is preferably equal to or greater than 1.5 and more preferably equal to or greater than 2.0.

The upper limit value of the specific ratio is not particularly limited, but is preferably equal to or less than 4.0, more preferably less than 3.0, even more preferably less than 2.8, and particularly preferably less than 2.6, from the viewpoint that the temporal stability of the composition and resistance (heat resistance, light resistance, moisture resistance, and/or solvent resistance) of the obtained cured film are superior.

An average primary particle diameter of the light-shielding pigment is not particularly limited, but from the viewpoints that a cured film formed of the composition has excellent planarization properties and the temporal stability of the composition is superior, the average primary particle diameter is preferably 5 to 100 nm and more preferably 10 to 70 nm.

Furthermore, the average primary particle diameter in the present specification refers to an average primary particle diameter of particles measured by the following method. The average primary particle diameter can be measured using a transmission electron microscope (TEM). As the transmission electron microscope, for example, a transmission microscope HT7700 manufactured by Hitachi High-Technologies Corporation can be used.

A maximum length (Dmax: a maximum length between two points on a contour of the particle image) and a length vertical to the maximum length (DV-max: in a case where an image is sandwiched between two straight lines parallel to the maximum length, the shortest length that vertically connects the two straight lines) of a particle image obtained using the transmission electron microscope were measured, and a geometric mean value thereof $(Dmax \times DV\text{-}max)^{1/2}$ was taken as a particle diameter. Particle diameters of 100 particles were measured by this method, and an arithmetic mean value thereof was taken as an average primary particle diameter of particles.

<Inorganic Particle>

The inorganic particle contains a nitrogen-containing metal compound.

The nitrogen-containing metal compound is one or more selected from the group consisting of zirconium nitride, zirconium oxynitride, vanadium nitride, vanadium oxynitride, niobium nitride, and niobium oxynitride, and from the viewpoint that the temporal stability is superior, is preferably one or more selected from the group consisting of zirconium nitride, zirconium oxynitride, vanadium nitride, and vanadium oxynitride, more preferably one or more selected from the group consisting of zirconium nitride, zirconium oxynitride, and vanadium nitride, and even more preferably one or more selected from the group consisting of zirconium nitride and zirconium oxynitride.

One inorganic particle may be used singly or two or more inorganic particles may be used.

Moreover, one nitrogen-containing metal compound in the inorganic particle may be used singly or two or more nitrogen-containing metal compounds may be used.

The inorganic particle contains at least a nitrogen atom and a specific metallic atom, and one specific metallic atom in the inorganic particle may be used singly or two or more specific metallic atoms may be used.

It is also preferable to use the inorganic particles in combination, such as titanium black and silica-coated zirconium nitride, and titanium black and silica-coated zirconium oxynitride.

An average primary particle diameter of the inorganic particles is preferably 5 to 100 nm and more preferably 10 to 70 nm.

A content of the specific metallic atom in the inorganic particle is preferably 10% to 85% by mass and more preferably 50% to 80% by mass, with respect to the total mass of the inorganic particle. A content of the specific metallic atom in the light-shielding pigment is measured by an X-ray fluorescence (XRF) analysis method.

The specific metallic atom may be used singly or two or more specific metallic atoms are used, and in a case where two or more specific metallic atoms are used, the total content thereof is preferably within the above range.

A content of the nitrogen atom (N atom) in the inorganic particle is preferably 3% to 60% by mass and more preferably 5% to 30% by mass, with respect to the total mass of the inorganic particle. The content of the nitrogen atom is measured by an X-ray fluorescence (XRF) analysis method.

In a case where at least one of zirconium oxynitride, vanadium oxynitride, or niobium oxynitride is used as the nitrogen-containing metal compound, the inorganic particle also contains an oxygen atom.

Moreover, the inorganic particle contains a metal nitride as a main component and oxygen is mixed in during synthesis thereof, and/or the surface of the inorganic particle is oxidized, and as a result, the inorganic particle may partially contain an oxygen atom.

In a case where the inorganic particle contains an oxygen atom, the content of the oxygen atom is preferably 0.5% to 30% by mass and more preferably 1% to 15% by mass, with respect to the total mass of the inorganic particle.

The content of the oxygen atom is measured by an X-ray fluorescence (XRF) analysis method.

(Method for Producing Nitrogen-Containing Metal Compound)

A method for producing a nitrogen-containing metal compound (one or more selected from the group consisting of zirconium nitride, zirconium oxynitride, vanadium nitride, vanadium oxynitride, niobium nitride, and niobium oxynitride) is not particularly limited, and known methods can be used. Examples of the method for producing a nitrogen-containing metal compound include a gas-phase reaction method. Examples of the gas-phase reaction method include an electric furnace method and a thermal plasma method, but from the viewpoints that few impurities are mixed in, particle diameters are easily uniform, and productivity is high, a thermal plasma method is preferable.

In the thermal plasma method, the method for generating thermal plasma is not particularly limited, examples thereof include direct-current arc discharge, multi-layer arc discharge, radio-frequency (RF) plasma, and hybrid plasma, and a radio-frequency plasma in which few impurities are mixed in from an electrode is more preferable.

Here, the method for producing a nitrogen-containing metal compound is not limited to the aforementioned method, and the production method is not limited as long as a nitrogen-containing metal compound having desired physical properties can be obtained.

<Inorganic Compound>

The light-shielding pigment contains an inorganic compound.

The inorganic compound coats the inorganic particle. The inorganic compound may coat the entire surface of the inorganic particle, or may coat a part of the surface of the inorganic particle.

The inorganic compound contains a silicon atom.

As long as the inorganic compound contains a silicon atom and satisfies the requirement that the specific ratio is greater than 1.0, the type, contained components, and/or contained component contents of the inorganic compound are not particularly limited.

The silicon atom in the inorganic compound preferably forms a silicon-containing compound. That is, the inorganic compound preferably contains a silicon-containing compound.

As the silicon-containing compound, $SiO_2$ is more preferable.

Moreover, as the silicon-containing compound, a zirconium silicide compound is also preferable. The zirconium silicide compound may be present in a form of being deposited on the entire or a part of the surface of the inorganic compound (preferably, a silicon-containing compound other than a zirconium silicide compound such as $SiO_2$) coating the inorganic particle.

In particular, in a case where the nitrogen-containing metal compound is one or more selected from the group consisting of zirconium nitride and zirconium oxynitride, it is also preferable that the inorganic compound contains a zirconium silicide compound.

In a case where the inorganic particle is coated with an inorganic compound containing a silicon atom, a thickness of a coat formed of the inorganic compound is not particularly limited, but is preferably 1 to 10 nm.

Furthermore, a thickness of a coat formed of the silicon-containing compound can be measured by embedding particles in a resin, cutting the particles together with the resin with an ultramicrotome, observing the cut cross section with a transmission electron microscope (TEM), performing element mapping with an energy dispersion-type X-ray analyzer, and analyzing a coating state of a silicon-containing compound.

A method for coating an inorganic particle with an inorganic compound is not particularly limited, and known methods can be used.

Examples of the method for coating an inorganic particle with an inorganic compound include the method (method in which inorganic particles are used instead of fine titanium dioxide particles having an average particle diameter of 5 to 70 nm) described in paragraphs 0015 to 0043 of JP2008-069193A.

[Colorant]

The composition according to the embodiment of the present invention may contain a colorant in addition to the light-shielding pigment. The light-shielding characteristics of the cured film (light-shielding film) can be adjusted by using both the light-shielding pigment and one or more colorants. Moreover, for example, in a case where the cured film is used as a light-attenuating film, respective wavelengths of light containing a wide wavelength component are likely to be uniformly attenuated.

Examples of the colorant include a pigment and a dye. Moreover, the colorant may be a black colorant other than the aforementioned light-shielding pigment, and may be a black pigment or a black dye, for example.

In a case where the composition contains the colorant, the total content of the light-shielding pigment and the colorant is preferably 10% to 90% by mass, more preferably 30% to 70% by mass, and even more preferably 40% to 60% by mass, with respect to the total mass of the solid contents of the composition.

Furthermore, in a case where the cured film formed of the composition according to the embodiment of the present invention is used as a light-attenuating film, it is also preferable that the total content of the light-shielding pigment and the colorant is less than the above suitable range.

Moreover, a mass ratio (content of colorant/content of light-shielding pigment) of the content of the colorant to the content of the light-shielding pigment is preferably 0.1 to 9.0.

<Pigment>

The pigment may be an inorganic pigment or an organic pigment.

Inorganic Pigment

The inorganic pigment is not particularly limited, and known inorganic pigments can be used.

Examples of the inorganic pigment include zinc oxide, white lead, lithopone, titanium oxide, chromium oxide, iron oxide, precipitated barium sulfate and a barite powder, red lead, red iron oxide, chrome yellow, zinc yellow (zinc yellow type 1 and zinc yellow type 2), ultramarine blue, Prussian blue (potassium ferric ferrocyanide), zircon grey Praseodymium yellow, chromium titanium yellow, chrome green, peacock, Victoria green, iron blue (irrelevant to Prussian blue), vanadium zirconium blue, chrome tin pink, manganese pink, and salmon pink.

The inorganic pigment may be subjected to a surface modification treatment. For example, an inorganic pigment, which is subjected to a surface modification treatment with a surface-treating agent having both a silicone group and an alkyl group, is mentioned, and examples thereof include "KTP-09" series (produced by Shin-Etsu Chemical Co., Ltd.).

A pigment having infrared-absorbing properties can also be used.

As the pigment having infrared-absorbing properties, a tungsten compound, a metal boride, and the like are preferable. Among them, from the viewpoint that light-shielding properties at a wavelength in an infrared range are excellent, a tungsten compound is preferable. In particular, from the viewpoint that translucency in a visible light range and a light absorption wavelength range of an oxime-based polymerization initiator, which is related to curing efficiency due to exposure, is excellent, a tungsten compound is preferable.

These pigments may be used in combination of two or more thereof, and may be used in combination with a dye which will be described later. In order to adjust tint and to enhance light-shielding properties in a desired wavelength range, for example, an aspect in which a dye described later or a pigment which has a chromatic color such as red, green, yellow, orange, violet, and blue is mixed with a pigment which is black or has infrared ray-shielding properties can be mentioned. It is preferable that a red pigment or dye or a violet pigment or dye is mixed with the pigment having infrared ray-shielding properties, and more preferable that a red pigment is mixed with a pigment having infrared ray-shielding properties.

Furthermore, an infrared absorber, which will be described later, may be added.

Organic Pigment

Examples of organic pigments include: Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like;

C. I. Pigment Orange 2, 5, 13, 16, 17:1, 31, 34, 36, 38, 43, 46, 48, 49, 51, 52, 55, 59, 60, 61, 62, 64, 71, 73, and the like;

C. I. Pigment Red 1, 2, 3, 4, 5, 6·7, 9·10, 14, 17, 22, 23, 31, 38, 41, 48:1, 482, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, 294 (base on xanthene, Organo Ultramarine. Bluish Red), and the like;

C. I. Pigment Green 7, 10, 36, 37, 58, 59, and the like;

C. I. Pigment Violet 1, 19, 23, 27, 32, 37, 42, and the like; and

C. I. Pigment Blue 1, 2, 15, 15:1, 15:2, 15:3, 15:4, 15:6, 16, 22, 29, 60, 64, 66, 79, 80, 87 (based on monoazo), 88 (based on methine/polymethine), and the like. Furthermore, the pigments may be used singly or in combination of two or more thereof.

<Dye>

As a coloring dye, for example, the colorant described in paragraphs 0027 to 0200 of JP2014-042375A can also be used in addition to a dye (chromatic dye) having a chromatic color such as red (R), green (G), and blue (B). Moreover, a black dye can be used.

As the dye, for example, the coloring agents disclosed in JP1989-090403A (JP-S64-090403A), JP1989-091102A (JP-S64-091102A), JP1989-094301A (JP-H01-094301A), JP1994-011614A (JP-H06-011614A), JP2592207B, U.S. Pat. Nos. 4,808,501A, 5,667,920A, 0,505,950A. JP1993-333207A (JP-H05-333207A), JP1994-035183A (JP-H06-035183A), JP1994-051115A (JP-H06-051115A). JP1994-194828A (JP-H06-194828A), and the like can be used. In a case where the dyes are sorted based on the chemical structure, a pyrazole azo compound, a pyrromethene compound, an anilinoazo compound, a triphenylmethane compound, an anthraquinone compound, a benzylidene compound, an oxonol compound, a pyrazolotriazole azo compound, a pyridone azo compound, a cyanine compound, a phenothiazine compound, a pyrrolopyrazole azomethine compound, or the like can be used. Moreover, a coloring agent multimer may be used as the dye. Examples of the coloring agent multimer include the compounds described in JP2011-213925A and JP2013-041097A. Furthermore, a polymerizable dye having a polymerizable group in a molecule may be used, and examples of a commercial product thereof include RDW series produced by FUJIFILM Wako Pure Chemical Corporation.

<Infrared Absorber>

The colorant may further contain an infrared absorber.

The infrared absorber refers to a compound having absorption in a wavelength range of an infrared range (preferably, wavelengths of 650 to 1,300 nm). The infrared absorber is preferably a compound having a maximum absorption in a wavelength range of 675 to 900 nm.

Examples of a colorant having such spectral characteristics include a pyrrolopyrrole compound, a copper compound, a cyanine compound, a phthalocyanine compound, an iminium compound, a thiol complex-based compound, a transition metal oxide-based compound, a squarylium compound, a naphthalocyanine compound, a quaterrylene compound, a dithiol metal complex-based compound, and a croconium compound.

As the phthalocyanine compound, the naphthalocyanine compound, the iminium compound, the cyanine compound, the squarylium compound, and the croconium compound, the compounds disclosed in paragraphs 0010 to 0081 of JP2010-11750A may be used, the contents of which are incorporated into the present specification. Regarding the cyanine compound, reference can be made to, for example, "Functional Dyes, written by Makoto OKAWARA, Masaru MATSUOKA, Teijiro KITAO, and Tsuneaki HIRASHIMA, Kodansha Scientific Ltd", the contents of which are incorporated into the specification of the present application.

As the colorant having the spectral characteristics, the compound disclosed in paragraphs 0004 to 0016 of JP1995-164729A (JP-H07-164729A) and/or the compound disclosed in paragraphs 0027 to 0062 of JP2002-146254A, and the near-infrared absorption particles which are disclosed in paragraphs 0034 to 0067 of JP2011-164583A, consist of crystallites of an oxide containing Cu and/or P, and have a number-average aggregated particle diameter of 5 to 200 nm may be used.

As the compound having a maximum absorption in a wavelength range of 675 to 900 nm, at least one selected from the group consisting of a cyanine compound, a pyrrolopyrrole compound, a squarylium compound, a phthalocyanine compound, and a naphthalocyanine compound is preferable.

Furthermore, the infrared absorber is preferably a compound which is dissolved in an amount equal to or greater than 1% by mass in water at 25° C., and more preferably a compound which is dissolved in an amount equal to or greater than 10% by mass in water at 25° C. In a case where such a compound is used, solvent resistance is improved.

Regarding the pyrrolopyrrole compound, reference can be made to paragraphs 0049 to 0062 of JP2010-222557A, the contents of which are incorporated into the present specification. Regarding the cyanine compound and the squarylium compound, reference can be made to paragraphs 0022 to 0063 of WO2014/088063A, paragraphs 0053 to 0118 of WO2014/030628A, paragraphs 0028 to 0074 of JP2014-059550A, paragraphs 0013 to 0091 of WO2012/169447A, paragraphs 0019 to 0033 of JP2015-176046A, paragraphs 0053 to 0099 of JP2014-063144A, paragraphs 0085 to 0150 of JP2014-052431A, paragraphs 0076 to 0124 of JP2014-044301A, paragraphs 0045 to 0078 of JP2012-008532A, paragraphs 0027 to 0067 of JP2015-172102A, paragraphs 0029 to 0067 of JP2015-172004A, paragraphs 0029 to 0085 of JP2015-040895A, paragraphs 0022 to 0036 of JP2014-126642A, paragraphs 0011 to 0017 of JP2014-148567A, paragraphs 0010 to 0025 of JP2015-157893A, paragraphs 0013 to 0026 of JP2014-095007A, paragraphs 0013 to 0047 of JP2014-080487A, paragraphs 0007 to 0028 of JP2013-227403A, and the like, the contents of which are incorporated into the present specification.

[Resin]

The composition according to the embodiment of the present invention contains a resin. Examples of the resin include a dispersant and an alkali-soluble resin.

A content of the resin in the composition is not particularly limited, but is preferably 3% to 60% by mass, more preferably 10% to 40% by mass, and even more preferably 15% to 35% by mass, with respect to the total solid content of the composition. The resins may be used singly or in combination of two or more thereof. For example, as the resin, a dispersant, which will be described later, and an alkali-soluble resin, which will be described later, may be used in combination. In a case where two or more resins are used in combination, the total content thereof is preferably within the above range.

A molecular weight of the resin is greater than 2,000. Moreover, in a case where the molecular weight of the resin is polydisperse, a weight-average molecular weight thereof is greater than 2,000.

<Dispersant>

The composition preferably contains a dispersant. Moreover, in the present specification, a dispersant refers to a compound different from the alkali-soluble resin which will be described later.

A content of the dispersant in the composition is not particularly limited, but is preferably 2% to 40% by mass, more preferably 5% to 30% by mass, and even more preferably 10% to 20% by mass, with respect to the total solid content of the composition.

The dispersants may be used singly or in combination of two or more thereof. In a case where two or more dispersants are used in combination, the total content thereof is preferably within the above range.

Furthermore, in the composition, a mass ratio (content of dispersant/content of light-shielding pigment) of the content of the dispersant (preferably, a graft polymer) to the content of the light-shielding pigment is preferably 0.05 to 1.00, more preferably 0.05 to 0.35, and even more preferably 0.20 to 0.35.

As the dispersant, for example, known dispersants can be appropriately selected and used. Among them, a polymer compound is preferable.

Examples of the dispersant include a polymer dispersant [for example, polyamidoamine and a salt thereof, polycarboxylic acid and a salt thereof, high-molecular-weight unsaturated acid ester, modified polyurethane, modified polyester, modified poly(meth)acrylate, a (meth)acrylic copolymer, and a naphthalenesulfonic acid-formalin condensate], polyoxyethylene alkyl phosphoric acid ester, polyoxyethylene alkylamine, and a pigment derivative.

The polymer compound can be further classified into a linear polymer, a terminal-modified polymer, a graft polymer, and a block polymer based on the structure.

Polymer Compound

The polymer compound acts to prevent the reaggregation of a substance to be dispersed by being adsorbed onto a surface of the substance to be dispersed, such as the light-shielding pigment and another pigment (hereinafter, the light-shielding pigment and the other pigment are collectively and simply referred to as a "pigment" as well) used in combination if desired. Therefore, a terminal-modified polymer, a graft (containing a polymer chain) polymer, or a block polymer is preferable which contains a moiety anchored to the pigment surface.

The polymer compound may contain a curable group.

Examples of the curable group include an ethylenically unsaturated group (for example, a (meth)acryloyl group, a vinyl group, a styryl group, and the like), and a cyclic ether group (for example, an epoxy group, an oxetanyl group, and the like), but the present invention is not limited to these examples.

Among them, from the viewpoint that polymerization can be controlled by a radical reaction, as the curable group, an ethylenically unsaturated group is preferable, and a (meth) acryloyl group is more preferable.

The resin containing a curable group preferably has at least one selected from the group consisting of a polyester structure and a polyether structure. In this case, the polyester structure and/or the polyether structure may be included in a main chain, and as will be described later, in a case where the resin has a structural unit containing a graft chain, the polymer chain may have a polyester structure and/or a polyether structure.

As the resin, a resin in which the polymer chain has a polyester structure is more preferable.

The polymer compound preferably has a structural unit containing a graft chain. Moreover, in the present specification, the "structural unit" has the same definition as a "repeating unit".

Such a polymer compound having the structural unit containing a graft chain has an affinity with a solvent due to the graft chain, and thus is excellent in dispersibility of a pigment or the like and dispersion stability (temporal stability) after the lapse of time. Moreover, due to the presence of the graft chain, the polymer compound having the structural unit containing a graft chain has an affinity with a polymerizable compound or other resins which can be used in combination.

As a result, residues are less likely to be generated in alkali development.

In a case where the graft chain is prolonged, a steric repulsion effect is enhanced, and thus the dispersibility of the pigment or the like is improved. Meanwhile, in a case where the graft chain is too long, adsorptive power to the pigment or the like is reduced, and thus the dispersibility of the pigment or the like tends to be reduced. Therefore, the number of atoms excluding a hydrogen atom in the graft chain is preferably 40 to 10.000, more preferably 50 to 2,000, and even more preferably 60 to 500.

Herein, the graft chain refers to a portion from the base (in a group which is branched off from the main chain, an atom bonded to the main chain) of a main chain of the copolymer to the terminal of a group branched off from the main chain.

The graft chain preferably has a polymer structure, and examples of such a polymer structure include a poly(meth)acrylate structure (for example, a poly(meth)acryl structure), a polyester structure, a polyurethane structure, a polyurea structure, a polyamide structure, and a polyether structure.

In order to improve interactive properties between the graft chain and the solvent, and thus enhance the dispersibility of the pigment or the like, the graft chain is preferably a graft chain having at least one selected from the group consisting of a polyester structure, a polyether structure, and a poly(meth)acrylate structure, and more preferably a graft chain having at least one of a polyester structure or a polyether structure.

A macromonomer (a monomer which has a polymer structure and constitutes a graft chain by being bonded to the main chain of a copolymer) containing such a graft chain is not particularly limited, but a macromonomer containing a reactive double bond group can be suitably used.

As a commercial macromonomer, which corresponds to a structural unit containing a graft chain contained in the polymer compound and is suitably used for synthesizing the polymer compound, AA-6 (trade name, produced by TOAGOSEI CO., LTD.), AA-10 (trade name, produced by TOAGOSEI CO., LTD.), AB-6 (trade name, produced by TOAGOSEI CO., LTD.), AS-6 (trade name, produced by TOAGOSEI CO., LTD.), AN-6 (trade name, produced by TOAGOSEI CO., LTD.), AW-6 (trade name, produced by TOAGOSEI CO., LTD.), AA-714 (trade name, produced by TOAGOSEI CO., LTD.), AY-707 (trade name, produced by TOAGOSEI CO., LTD.), AY-714 (trade name, produced by TOAGOSEI CO., LTD.), AK-5 (trade name, produced by TOAGOSEI CO., LTD.), AK-30 (trade name, produced by TOAGOSEI CO., LTD.), AK-32 (trade name, produced by TOAGOSEI CO., LTD.), BLEMMER PP-100 (trade name, produced by NOF CORPORATION), BLEMMER PP-500 (trade name, produced by NOF CORPORATION), BLEMMER PP-800 (trade name, produced by NOF CORPORATION). BLEMMER PP-1000 (trade name, produced by NOF CORPORATION), BLEMMER 55-PET-800 (trade name, produced by NOF CORPORATION), BLEMMER PME-4000 (trade name, produced by NOF CORPORATION), BLEMMER PSE-400 (trade name, produced by NOF CORPORATION). BLEMMER PSE-1300 (trade name, produced by NOF CORPORATION), BLEMMER 43PAPE-600B (trade name, produced by NOF CORPORATION), or the like is used. Among them, AA-6 (trade name, produced by TOAGOSEI CO., LTD.), AA-10 (trade name, produced by TOAGOSEI CO., LTD.), AB-6 (trade name, produced by TOAGOSEI CO., LTD.), AS-6 (trade name, produced by TOAGOSEI CO., LTD.), AN-6 (trade name, produced by TOAGOSEI CO., LTD.), or BLEMMER PME-4000 (trade name, produced by NOF CORPORATION) is preferable.

The dispersant preferably has at least one structure selected from the group consisting of polymethyl acrylate, polymethyl methacrylate, and cyclic or chain-like polyester, more preferably has at least one structure selected from the group consisting of polymethyl acrylate, polymethyl methacrylate, and chain-like polyester, and even more preferably has at least one structure selected from the group consisting of a polymethyl acrylate structure, a polymethyl methacrylate structure, a polycaprolactone structure, and a polyvalerolactone structure. The dispersant may be a dispersant having the aforementioned structure alone in one dispersant, or may be a dispersant having a plurality of these structures in one dispersant.

Herein, the polycaprolactone structure refers to a structure containing a structure, which is obtained by ring opening of ε-caprolactone, as a repeating unit. The polyvalerolactone structure refers to a structure containing a structure, which is obtained by ring opening of δ-valerolactone, as a repeating unit.

Specific examples of the dispersant having a polycaprolactone structure include dispersants in which j and k in Formula (1) and Formula (2) are each 5. Moreover, specific examples of the dispersant having a polyvalerolactone structure include dispersants in which j and k in Formula (1) and Formula (2) are each 4.

Specific examples of the dispersant having a polymethyl acrylate structure include dispersants in which in Formula (4), $X^5$ is a hydrogen atom and $R^4$ is a methyl group. Moreover, specific examples of the dispersant having a polymethyl methacrylate structure include dispersants in which in Formula (4), $X^5$ is a methyl group and $R^4$ is a methyl group.

Structural Unit Containing Graft Chain

As the structural unit containing a graft chain, the polymer compound preferably has a structural unit represented by any one of Formula (1), . . . , or Formula (4), and more preferably has a structural unit represented by any one of Formula (1A), Formula (2A), Formula (3A), Formula (3B), or Formula (4).

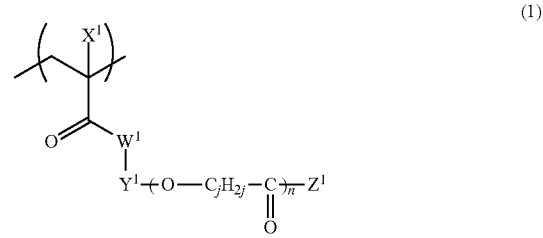

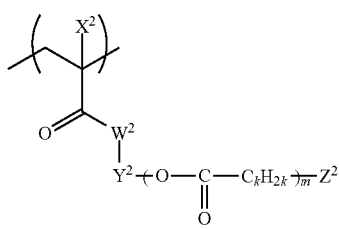
(2)

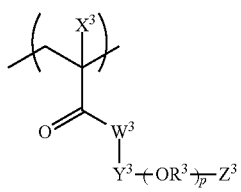
(3)

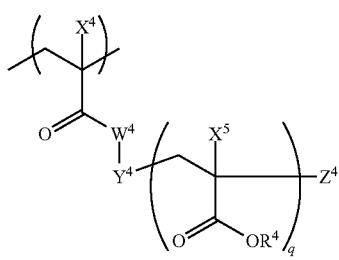
(4)

In Formulae (1) to (4), $W^1$, $W^2$, $W^3$, and $W^4$ each independently represent an oxygen atom or NH. $W^1$, $W^2$, $W^3$, and $W^4$ are each preferably an oxygen atom.

In Formulae (1) to (4), $X^1$, $X^2$, $X^3$, $X^4$, and $X^5$ each independently represent a hydrogen atom or a monovalent organic group. From the viewpoint of the restriction on synthesis, $X^1$, $X^2$, $X^3$, $X^4$, and $X^5$ are preferably each independently a hydrogen atom or an alkyl group having 1 to 12 carbon atoms (the number of carbon atoms), more preferably each independently a hydrogen atom or a methyl group, and even more preferably each independently a methyl group.

In Formulae (1) to (4), $Y^1$, $Y^2$, $Y^3$, and $Y^4$ each independently represent a divalent linking group, and the linking group has no particular restriction on a structure. Specific examples of the divalent linking groups represented by $Y^1$, $Y^2$, $Y^3$, and $Y^4$ include linking groups represented by the following (Y-1) to (Y-21). In the following structures, A and B refer to moieties bonded to the left terminals and the right terminals of $Y^1$, $Y^2$, $Y^3$, and $Y^4$ in Formulae (1) to (4), respectively. Among the following structures, from the viewpoint of simplicity of synthesis. (Y-2) or (Y-13) is more preferable.

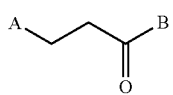
(Y-1)

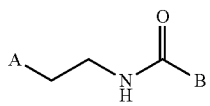
(Y-2)

(Y-3)

(Y-4)

(Y-5)

(Y-6)

(Y-7)

(Y-8)

(Y-9)

(Y-10)

(Y-11)

(Y-12)

(Y-13)

(Y-14)

(Y-15)

(Y-16)

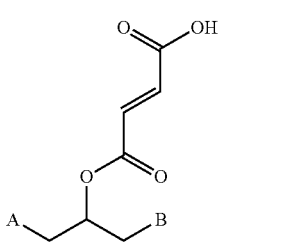
(Y-17)

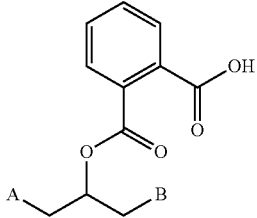
(Y-18)

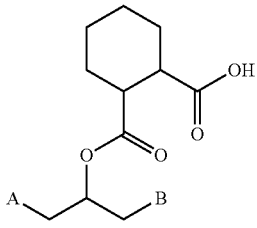
(Y-19)

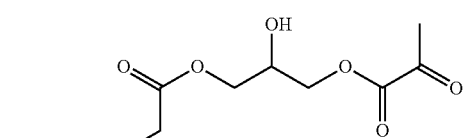
(Y-20)

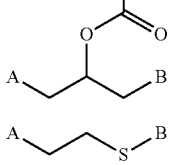
(Y-21)

In Formulae (1) to (4), $Z^1$, $Z^2$, $Z^3$ and $Z^4$ each independently represent a monovalent organic group. The structure of the organic group is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among them, particularly from the viewpoint of improvement in the dispersibility, the organic groups represented by $Z^1$, $Z^2$, $Z^3$, and $Z^4$ are each preferably a group exhibiting a steric repulsion effect, and more preferably each independently an alkyl group or alkoxy group having 5 to 24 carbon atoms, and, among them, in particular, even more preferably each independently a branched alkyl group having 5 to 24 carbon atoms, a cyclic alkyl group having 5 to 24 carbon atoms, or an alkoxy group having 5 to 24 carbon atoms. Furthermore, the alkyl group contained in the alkoxy group may be any one of linear, branched, or cyclic.

In Formulae (1) to (4), n, m, p, and q are each independently an integer of 1 to 500.

Furthermore, in Formulae (1) and (2), j and k each independently represent an integer of 2 to 8. From the viewpoints of the temporal stability and developability of the composition, j and k in Formulae (1) and (2) are each preferably an integer of 4 to 6 and more preferably 5.

In Formulae (1) and (2), n and m are each preferably an integer equal to or greater than 10 and more preferably an integer equal to or greater than 20. Moreover, in a case where the dispersant has a polycaprolactone structure and a polyvalerolactone structure, the sum of the repeating number of the polycaprolactone structure and the repeating number of the polyvalerolactone structure is preferably an integer equal to or greater than 10 and more preferably an integer equal to or greater than 20.

In Formula (3), $R^3$ represents a branched or linear alkylene group, and is preferably an alkylene group having 1 to 10 carbon atoms and more preferably an alkylene group having 2 or 3 carbon atoms. In a case where p is 2 to 500, a plurality of $R^3$'s may be the same as or different from each other.

In Formula (4), $R^4$ represents a hydrogen atom or a monovalent organic group, and the monovalent organic group has no particular limitation on a structure. As $R^4$, a hydrogen atom, an alkyl group, an aryl group, or a heteroaryl group is preferable, and a hydrogen atom or an alkyl group is more preferable. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is even more preferable. In a case where q in Formula (4) is 2 to 500, a plurality of $X^5$'s and a plurality of $R^4$'s in the graft copolymer may be respectively the same as or different from each other.

In addition, the polymer compound may have a structural unit which contains two or more different structures and contains a graft chain. That is, the structural units which are represented by Formulae (1) to (4) and have structures different from one another may be included in a molecule of the polymer compound, and in a case where n, m, p, and q in Formulae (1) to (4) each represent an integer equal to or greater than 2, in Formulae (1) and (2), structures in which j and k are different from each other may be included in the side chain, and in Formulae (3) and (4), a plurality of $R^3$'s, a plurality of $R^4$'s, and a plurality of $X^5$'s in the molecule may be respectively the same as or different from each other.

From the viewpoints of the temporal stability and developability of the composition, the structural unit represented by Formula (1) is more preferably a structural unit represented by Formula (1A).

Furthermore, from the viewpoints of the temporal stability and developability of the composition, the structural unit represented by Formula (2) is more preferably a structural unit represented by Formula (2A).

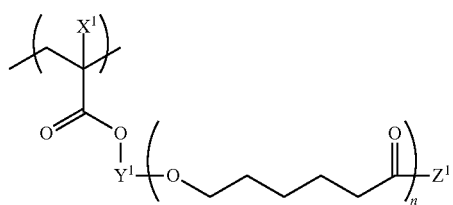
(1A)

-continued (2A)

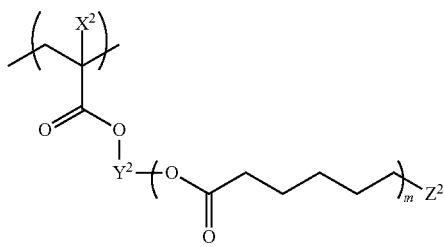

$X^1$, $Y^1$, $Z^1$, and n in Formula (1A) have the same definitions as $X^1$, $Y^1$, $Z^1$, and n in Formula (1), and preferred ranges thereof are also the same. $X^2$, $Y^2$, $Z^2$, and m in Formula (2A) have the same definitions as $X^2$, $Y^2$, $Z^2$, and m in Formula (2), and preferred ranges thereof are also the same.

In addition, from the viewpoints of the temporal stability and developability of the composition, the structural unit represented by Formula (3) is more preferably a structural unit represented by Formula (3A) or (3B).

(3A)

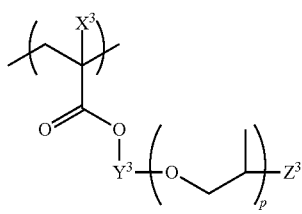

(3B)

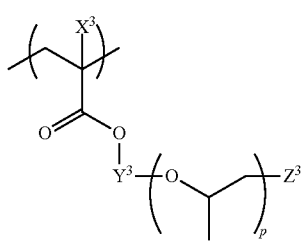

$X^3$, $Y^3$, $Z^3$, and p in Formula (3A) or (3B) have the same definitions as $X^3$, $Y^3$, $Z^3$, and p in Formula (3), and preferred ranges thereof are also the same.

The polymer compound more preferably has, as a structural unit containing a graft chain, the structural unit represented by Formula (1A).

The content of the structural unit (for example, the structural units represented by Formulae (1) to (4)) containing a graft chain in the polymer compound is preferably within a range of 2% to 90% by mass and more preferably within a range of 5% to 30% by mass, in terms of mass, with respect to the total mass of the polymer compound. In a case where the content of the structural unit containing a graft chain is within the above range, the dispersibility of the pigment is high and the developability in a case of forming a cured film is favorable.

Hydrophobic Structural Unit

The polymer compound preferably has a hydrophobic structural unit which is different from the structural unit (that is, the structural unit does not correspond to the structural unit containing a graft chain) containing a graft chain. Here, in the present specification, the hydrophobic structural unit is a structural unit which does not have an acid group (for example, a carboxylic acid group, a sulfonic acid group, a phosphoric acid group, a phenolic hydroxyl group, or the like).

As the hydrophobic structural unit, a structural unit derived from (corresponding to) a compound (monomer) having a ClogP value equal to or greater than 1.2 is preferable, and a structural unit derived from a compound having a ClogP value of 1.2 to 8 is more preferable. By doing so, the effect of the present invention can be more reliably exhibited.

The ClogP value is a value calculated by a program "CLOGP" available from Daylight Chemical Information System, Inc. This program provides a value of "calculated log P" calculated by the fragment approach (see the following documents) of Hansch and Leo. The fragment approach is based on a chemical structure of a compound, and the log P value of the compound is estimated by dividing the chemical structure into partial structures (fragments) and summing up degrees of contribution to log P which are assigned to the fragments. Details of the method are described in the following documents. In the present specification, a ClogP value calculated by a program CLOGP v4.82 is used.

A. J. Leo, Comprehensive Medicinal Chemistry, Vol. 4, C. Hansch, P. G. Sammnens, J. B. Taylor and C. A. Ramsden, Eds., p. 295, Pergamon press, 1990, C. Hansch & A. J. Leo. Substituent Constants For Correlation Analysis in Chemistry and Biology. John Wiley & Sons. A. J. Leo. Calculating logPoct from structure. Chem. Rev., 93, 1281 to 1306, 1993.

The log P refers to a common logarithm of a partition coefficient P, is a physical property value that shows how a certain organic compound is partitioned in an equilibrium of a two-phase system consisting of oil (generally, 1-octanol) and water by using a quantitative numerical value, and is expressed by the following expression.

$$\log P = \log(C \text{oil}/C \text{water})$$

In the expression, Coil represents a molar concentration of a compound in an oil phase, and Cwater represents a molar concentration of the compound in a water phase.

The greater the positive log P value based on 0, the higher the oil solubility, and the greater the absolute value of negative log P, the higher the water solubility. Accordingly, the value of log P has a negative correlation with the water solubility of an organic compound and is widely used as a parameter for estimating the hydrophilicity and hydrophobicity of an organic compound.

The polymer compound preferably has, as a hydrophobic structural unit, one or more structural units selected from structural units derived from monomers represented by Formulae (i) to (iii).

(i)

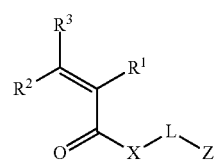

(ii)

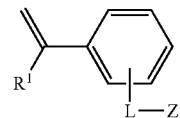

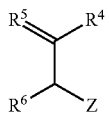
(iii)

In Formulae (i) to (iii), $R^1$, $R^2$, and $R^3$ each independently represent a hydrogen atom, a halogen atom (for example, a fluorine atom, a chlorine atom, a bromine atom, or the like), or an alkyl group (for example, a methyl group, an ethyl group, a propyl group, or the like) having 1 to 6 carbon atoms.

$R^1$, $R^2$, and $R^3$ are each preferably a hydrogen atom or an alkyl group having 1 to 3 carbon atoms, and more preferably a hydrogen atom or a methyl group. $R^2$ and $R^3$ are each even more preferably a hydrogen atom.

X represents an oxygen atom (—O—) or an imino group (—NH—), and is preferably an oxygen atom.

L is a single bond or a divalent linking group. Examples of the divalent linking group include a divalent aliphatic group (for example, an alkylene group, a substituted alkylene group, an alkenylene group, a substituted alkenylene group, an alkynylene group, or a substituted alkynylene group), a divalent aromatic group (for example, an arylene group or a substituted arylene group), a divalent heterocyclic group, an oxygen atom (—O—), a sulfur atom (—S—), an imino group (—NH—), a substituted imino group (—NR$^{31}$—, where R$^{31}$ is an aliphatic group, an aromatic group, or a heterocyclic group), a carbonyl group (—CO—), and a combination thereof.

The divalent aliphatic group may have a cyclic structure or a branched structure. The number of carbon atoms in the aliphatic group is preferably 1 to 20, more preferably 1 to 15, and even more preferably 1 to 10. The aliphatic group may be an unsaturated aliphatic group or a saturated aliphatic group, but is preferably a saturated aliphatic group. Moreover, the aliphatic group may have a substituent. Examples of the substituent include a halogen atom, an aromatic group, and a heterocyclic group.

The number of carbon atoms in the divalent aromatic group is preferably 6 to 20, more preferably 6 to 15, and even more preferably 6 to 10. Moreover, the aromatic group may have a substituent. Examples of the substituent include a halogen atom, an aliphatic group, an aromatic group, and a heterocyclic group.

The divalent heterocyclic group preferably contains a 5-membered ring or a 6-membered ring as a heterocyclic ring. The heterocyclic ring may be fused with another heterocyclic ring, an aliphatic ring, or an aromatic ring. Moreover, the heterocyclic group may have a substituent. Examples of the substituent include a halogen atom, a hydroxyl group, an oxo group (=O), a thioxo group (=S), an imino group (=NH), a substituted imino group (=N—R$^{32}$, where R$^{32}$ is an aliphatic group, an aromatic group, or a heterocyclic group), an aliphatic group, an aromatic group, and a heterocyclic group.

L is preferably a single bond, an alkylene group, or a divalent linking group having an oxyalkylene structure. The oxyalkylene structure is more preferably an oxyethylene structure or an oxypropylene structure. Moreover, L may have a polyoxyalkylene structure which contains two or more repeating oxyalkylene structures. As the polyoxyalkylene structure, a polyoxyethylene structure or a polyoxypropylene structure is preferable. The polyoxyethylene structure is represented by —(OCH$_2$CH$_2$)n-, and n is preferably an integer equal to or greater than 2 and more preferably an integer of 2 to 10.

Examples of Z include an aliphatic group (for example, an alkyl group, a substituted alkyl group, an unsaturated alkyl group, or a substituted unsaturated alkyl group), an aromatic group (for example, an aryl group, a substituted aryl group, an arylene group, or a substituted arylene group), a heterocyclic group, and a combination thereof. These groups may contain an oxygen atom (—O—), a sulfur atom (—S—), an imino group (—NH—), a substituted imino group (—NR$^{31}$—, where R$^{31}$ is an aliphatic group, an aromatic group, or a heterocyclic group), or a carbonyl group (—CO—).

The aliphatic group may have a cyclic structure or a branched structure. The number of carbon atoms in the aliphatic group is preferably 1 to 20, more preferably 1 to 15, and even more preferably 1 to 10. The aliphatic group further contains a ring-aggregated hydrocarbon group or a crosslinked cyclic hydrocarbon group, and examples of the ring-aggregated hydrocarbon group include a bicyclohexyl group, a perhydronaphthalenyl group, a biphenyl group, and a 4-cyclohexylphenyl group. Examples of a crosslinked cyclic hydrocarbon ring include a bicyclic hydrocarbon ring such as pinane, bornane, norpinane, norbornane, and bicyclooctane rings (a bicyclo[2.2.2]octane ring, a bicyclo[3.2.1] octane ring, or the like); a tricyclic hydrocarbon ring such as homobredane, adamantane, tricyclo[5.2.1.0$^{2,6}$]decane, and tricyclo[4.3.1.1$^{2,5}$]undecane rings; and a tetracyclic hydrocarbon ring such as tetracyclo[4.4.0.1$^{2,5}$]dodecane and perhydro-1,4-methano-5,8-methanonaphthalene rings. Moreover, the crosslinked cyclic hydrocarbon ring also includes a fused cyclic hydrocarbon ring, for example, a fused ring in which a plurality of 5- to 8-membered cycloalkane rings, such as perhydronaphthalene (decalin), perhydroanthracene, perhydrophenanthrene, perhydroacenaphthene, perhydrofluorene, perhydroindene, and perhydrophenalene rings, are fused.

As the aliphatic group, a saturated aliphatic group is more preferable to an unsaturated aliphatic group. Moreover, the aliphatic group may have a substituent. Examples of the substituent include a halogen atom, an aromatic group, and a heterocyclic group. Here, the aliphatic group does not have an acid group as a substituent.

The number of carbon atoms in the aromatic group is preferably 6 to 20, more preferably 6 to 15, and even more preferably 6 to 10. Moreover, the aromatic group may have a substituent. Examples of the substituent include a halogen atom, an aliphatic group, an aromatic group, and a heterocyclic group. Here, the aromatic group does not have an acid group as a substituent.

The heterocyclic group preferably contains a 5-membered ring or a 6-membered ring as a heterocyclic ring. The heterocyclic ring may be fused with another heterocyclic ring, an aliphatic ring, or an aromatic ring. Moreover, the heterocyclic group may have a substituent. Examples of the substituent include a halogen atom, a hydroxyl group, an oxo group (=O), a thioxo group (=S), an imino group (=NH), a substituted imino group (=N—R$^{32}$, where R$^{32}$ is an aliphatic group, an aromatic group, or a heterocyclic group), an aliphatic group, an aromatic group, and a heterocyclic group. Here, the heterocyclic group does not have an acid group as a substituent.

In Formula (iii), $R^4$, $R^5$, and $R^6$ each independently represent a hydrogen atom, a halogen atom (for example, a fluorine atom, a chlorine atom, a bromine atom, or the like), an alkyl group (for example, a methyl group, an ethyl group, a propyl group, or the like) having 1 to 6 carbon atoms, Z, or L-Z. Herein, L and Z have the same definitions as L and Z described above. As $R^4$, $R^5$, and $R^6$, a hydrogen atom or an alkyl group having 1 to 3 carbon atoms is preferable, and a hydrogen atom is more preferable.

The monomer represented by Formula (i) is preferably a compound in which $R^1$, $R^2$, and $R^3$ are each a hydrogen atom or a methyl group, L is a single bond, an alkylene group, or a divalent linking group having an oxyalkylene structure, X is an oxygen atom or an imino group, and Z is an aliphatic group, a heterocyclic group, or an aromatic group.

The monomer represented by Formula (ii) is preferably a compound in which $R^1$ is a hydrogen atom or a methyl group, L is an alkylene group, and Z is an aliphatic group, a heterocyclic group, or an aromatic group. Moreover, the monomer represented by Formula (iii) is preferably a compound in which $R^4$, $R^5$, and $R^6$ are each a hydrogen atom or a methyl group, and Z is an aliphatic group, a heterocyclic group, or an aromatic group.

Examples of typical compounds represented by Formulae (i) to (iii) include radically polymerizable compounds selected from acrylic acid esters, methacrylic acid esters, and styrenes.

Furthermore, regarding the examples of the typical compounds represented by Formulae (i) to (iii), reference can be made to the compounds described in paragraphs 0089 to 0093 of JP2013-249417A, the contents of which are incorporated into the present specification.

The content of the hydrophobic structural unit in the polymer compound is preferably within a range of 10% to 90% and more preferably within a range of 20% to 80%, in terms of mass, with respect to the total mass of the polymer compound. In a case where the content is within the above range, sufficient pattern formation can be obtained.

Functional Group Capable of Forming Interaction with Pigment or the Like

A functional group capable of forming interaction with the pigment or the like (for example, a light-shielding pigment) can be introduced into the polymer compound. Herein, it is preferable that the polymer compound further has a structural unit containing a functional group capable of forming interaction with the pigment or the like.

Examples of the functional group capable of forming interaction with the pigment or the like include an acid group, a basic group, a coordinating group, and a reactive functional group.

In a case where the polymer compound contains an acid group, a basic group, a coordinating group, or a reactive functional group, it is preferable that the polymer compound contains a structural unit containing an acid group, a structural unit containing a basic group, a structural unit containing a coordinating group, or a reactive structural unit.

In particular, in a case where the polymer compound further contains, as an acid group, an alkali-soluble group such as a carboxylic acid group, developability for forming a pattern by alkali development can be imparted to the polymer compound.

That is, in a case where an alkali-soluble group is introduced into the polymer compound, in the composition, the polymer compound as a dispersant making a contribution to the dispersion of the pigment or the like has alkali solubility. The composition containing such a polymer compound is excellent in light-shielding properties of a cured film formed by exposure, and improves alkali developability of an unexposed portion.

Furthermore, in a case where the polymer compound has a structural unit containing an acid group, the polymer compound is easily compatible with the solvent, and coating properties also tend to be improved.

It is presumed that this is because the acid group in the structural unit containing an acid group easily interacts with the pigment or the like, the polymer compound stably disperses the pigment or the like, the viscosity of the polymer compound dispersing the pigment or the like is reduced, and thus the polymer compound is also easily dispersed in a stable manner.

Here, the structural unit containing an alkali-soluble group as an acid group may be the same as or different from the structural unit containing a graft chain, but the structural unit containing an alkali-soluble group as an acid group is a structural unit different from the hydrophobic structural unit (that is, the structural unit does not correspond to the hydrophobic structural unit).

Examples of the acid group, which is the functional group capable of forming interaction with the pigment or the like, include a carboxylic acid group, a sulfonic acid group, a phosphoric acid group, and a phenolic hydroxyl group, at least one of a carboxylic acid group, a sulfonic acid group, or a phosphoric acid group is preferable, and a carboxylic acid group is more preferable. The carboxylic acid group has favorable adsorptive power to the pigment or the like and high dispersibility.

That is, it is preferable that the polymer compound further has a structural unit containing at least one of a carboxylic acid group, a sulfonic acid group, or a phosphoric acid group.

The polymer compound may have one or more structural units containing an acid group.

The polymer compound may or may not contain the structural unit containing the acid group, but in a case where the polymer compound contains the structural unit containing the acid group, the content thereof, in terms of mass, with respect to the total mass of the polymer compound is preferably 5% to 80% by mass, and more preferably 10% to 60% by mass from the viewpoint of suppressing damage of the image intensity by alkali development.

Examples of the basic group, which is the functional group capable of forming interaction with the pigment or the like, include a primary amino group, a secondary amino group, a tertiary amino group, a hetero ring containing a N atom, and an amide group, and a preferred basic group is a tertiary amino group from the viewpoints of favorable adsorptive power to the pigment or the like and high dispersibility. The polymer compound may contain one or more of these basic groups.

The polymer compound may or may not contain the structural unit containing the basic group, but in a case where the polymer compound contains the structural unit containing the basic group, the content thereof, in terms of mass, with respect to the total mass of the polymer compound is preferably 0.01% to 50% by mass, and more preferably 0.01% to 30% by mass from the viewpoint of suppressing developability inhibition.

Examples of the coordinating group and the reactive functional group, which are the functional groups capable of forming interaction with the pigment or the like, include an acetyl acetoxy group, a trialkoxysilyl group, an isocyanate group, an acid anhydride, and an acid chloride. A preferred functional group is an acetyl acetoxy group from the viewpoints of favorable adsorptive power to the pigment or the like and high dispersibility of the pigment or the like. The polymer compound may have one or more of these groups.

The polymer compound may or may not contain the structural unit containing the coordinating group or the structural unit containing the reactive functional group, but in a case where the polymer compound contains the structural unit containing the coordinating group or the structural unit containing the reactive functional group, the content thereof, in terms of mass, with respect to the total mass of the polymer compound is preferably 10% to 80% by mass, and more preferably 20% to 60% by mass from the viewpoint of suppressing developability inhibition.

In a case where the polymer compound contains, other than the graft chain, the functional group capable of forming interaction with the pigment or the like, the functional groups capable of forming interaction with various pigments or the like may be contained, the way these functional groups are introduced is not particularly limited, but it is preferable that the polymer compound has one or more structural units selected from structural units derived from monomers represented by Formulae (iv) to (vi).

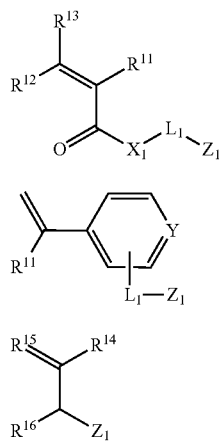

In Formulae (iv) to (vi), $R^{11}$, $R^{12}$, and $R^{13}$ each independently represent a hydrogen atom, a halogen atom (for example, a fluorine atom, a chlorine atom, a bromine atom, or the like), or an alkyl group (for example, a methyl group, an ethyl group, a propyl group, or the like) having 1 to 6 carbon atoms.

In Formulae (iv) to (vi), $R^{11}$, $R^{12}$, and $R^{13}$ are preferably each independently a hydrogen atom or an alkyl group having 1 to 3 carbon atoms, and more preferably each independently a hydrogen atom or a methyl group. In Formula (iv), $R^{12}$ and $R^{13}$ are each even more preferably a hydrogen atom.

In Formula (iv), $X_1$ represents an oxygen atom (—O—) or an imino group (—NH—), and is preferably an oxygen atom.

Moreover, in Formula (v), Y represents a methine group or a nitrogen atom.

In addition, in Formulae (iv) and (v), $L_1$ represents a single bond or a divalent linking group. The divalent linking group has the same definition as the divalent linking group represented by L in Formula (i).

$L_1$ is preferably a single bond, an alkylene group, or a divalent linking group having an oxyalkylene structure. The oxyalkylene structure is more preferably an oxyethylene structure or an oxypropylene structure. Moreover, $L_1$ may have a polyoxyalkylene structure which contains two or more repeating oxyalkylene structures. As the polyoxyalkylene structure, a polyoxyethylene structure or a polyoxypropylene structure is preferable. The polyoxyethylene structure is represented by —(OCH$_2$CH$_2$)n-, and n is preferably an integer equal to or greater than 2 and more preferably an integer of 2 to 10.

In Formulae (iv) to (vi), $Z_1$ represents a functional group capable of forming interaction with the pigment or the like other than a graft chain, and is preferably a carboxylic acid group or a tertiary amino group and more preferably a carboxylic acid group.

In Formula (vi), $R^{14}$, $R^{15}$, and $R^{16}$ each independently represent a hydrogen atom, a halogen atom (for example, a fluorine atom, a chlorine atom, a bromine atom, and the like), an alkyl group (for example, a methyl group, an ethyl group, a propyl group, and the like) having 1 to 6 carbon atoms, —$Z_1$, or $L_1$-$Z_1$. Herein, $L_1$ and $Z_1$ have the same definitions as $L_1$ and $Z_1$ described above, and preferred examples thereof are also the same. $R^{14}$, $R^{15}$, and $R^{16}$ are preferably each independently a hydrogen atom or an alkyl group having 1 to 3 carbon atoms, and more preferably each independently a hydrogen atom.

The monomer represented by Formula (iv) is preferably a compound in which $R^{11}$, $R^{12}$, and $R^{13}$ are each independently a hydrogen atom or a methyl group, $L_1$ is an alkylene group or a divalent linking group having an oxyalkylene structure, $X_1$ is an oxygen atom or an imino group, and $Z_1$ is a carboxylic acid group.

Moreover, the monomer represented by Formula (v) is preferably a compound in which $R^{11}$ is a hydrogen atom or a methyl group, $L_1$ is an alkylene group, $Z_1$ is a carboxylic acid group, and Y is a methine group.

Furthermore, the monomer represented by Formula (vi) is preferably a compound in which $R^{14}$, $R^{15}$, and $R^{16}$ are each independently a hydrogen atom or a methyl group, $L_1$ is a single bond or an alkylene group, and $Z_1$ is a carboxylic acid group.

Typical examples of the monomers (compounds) represented by Formulae (iv) to (vi) are shown below.

Examples of the monomers include methacrylic acid, crotonic acid, isocrotonic acid, a reaction product of a compound (for example, 2-hydroxyethyl methacrylate) containing an addition polymerizable double bond and a hydroxyl group in a molecule with a succinic acid anhydride, a reaction product of a compound containing an addition polymerizable double bond and a hydroxyl group in a molecule with a phthalic acid anhydride, a reaction product of a compound containing an addition polymerizable double bond and a hydroxyl group in a molecule with a tetrahydroxyphthalic acid anhydride, a reaction product of a compound containing an addition polymerizable double bond and a hydroxyl group in a molecule with trimellitic acid anhydride, a reaction product of a compound containing an addition polymerizable double bond and a hydroxyl group in a molecule with a pyromellitic acid anhydride, acrylic acid, an acrylic acid dimer, an acrylic acid oligomer, maleic acid, itaconic acid, fumaric acid, 4-vinylbenzoic acid, vinyl phenol, and 4-hydroxyphenyl methacrylamide.

From the viewpoints of the interaction with the pigment or the like, the temporal stability, and the permeability into a developer, the content of the structural unit containing a functional group capable of forming interaction with the pigment or the like is preferably 0.05% to 90% by mass, more preferably 1.0% to 80% by mass, and even more preferably 10% to 70% by mass, with respect to the total mass of the polymer compound.

Other Structural Units

In addition, for the purpose of improving various performances such as image intensity, as long as the effects of the present invention are not impaired, the polymer compound may further have other structural units (for example, a structural unit containing a functional group or the like having an affinity with the solvent which will be described later) which have various functions and are different from the structural unit containing a graft chain, the hydrophobic structural unit, and the structural unit containing a functional group capable of forming interaction with the pigment or the like.

Examples of such other structural units include structural units derived from radically polymerizable compounds selected from acrylonitriles and methacrylonitriles.

The polymer compound may have one or more of these other structural units, and the content thereof is preferably 0% to 80% by mass and more preferably 10% to 60% by mass, in terms of mass, with respect to the total mass of the polymer compound. In a case where the content is within the above range, sufficient pattern formability is maintained.

Physical Properties of Polymer Compound

An acid value of the polymer compound is preferably 0 to 250 mg KOH/g, more preferably 10 to 200 mg KOH/g, even more preferably 30 to 180 mg KOHg, and particularly preferably in a range of 70 to 120 mg KOH/g.

In a case where the acid value of the polymer compound is equal to or lower than 160 mg KOH/g, pattern peeling during development in a case of forming a cured film is more effectively suppressed. Moreover, in a case where the acid value of the polymer compound is equal to or higher than 10 mg KOH/g, the alkali developability is improved. Furthermore, in a case where the acid value of the polymer compound is equal to or higher than 20 mg KOH/g, the precipitation of the pigment or the like can be further suppressed, the number of coarse particles can be further reduced, and the temporal stability of the composition can be further improved.

In the present specification, the acid value can be calculated, for example, from the average content of acid groups in the compound. Moreover, a resin having a desired acid value can be obtained by changing the content of the structural unit containing an acid group, which is a constituent component of the resin.

A weight-average molecular weight of the polymer compound is preferably 4,000 to 300,000, more preferably 5,000 to 200,000, even more preferably 6,000 to 100,000, and particularly preferably 10,000 to 50,000.

The polymer compound can be synthesized based on known methods.

Specific examples of the polymer compound include "DA-7301" produced by Kusumoto Chemicals, Ltd., "Disperbyk-101 (polyamidoamine phosphate), 107 (carboxylic acid ester), 110 (copolymer containing an acid group), 111 (phosphoric acid-based dispersant), 130 (polyamide), 161, 162, 163, 164, 165, 166, 170, and 190 (polymeric copolymer)" and "BYK-P104 and P105 (high-molecular-weight unsaturated polycarboxylic acid)" produced by BYK-Chemie GmbH, "EFKA 4047, 4050 to 4010 to 4165 (based on polyurethane), EFKA 4330 to 4340 (block copolymer), 4400 to 4402 (modified polyacrylate), 5010 (polyester amide), 5765 (high-molecular-weight polycarboxylate), 6220 (fatty acid polyester), 6745 (phthalocyanine derivative), and 6750 (azo pigment derivative)" produced by EFKA "AJISPER PB821, PB822, PB880, and PB881" produced by Ajinomoto Fine-Techno Co., Inc., "FLOWLEN TG-710 (urethane oligomer)" and "POLYFLOW No. 50E and No. 300 (acrylic copolymer)" produced by KYOEISHA CHEMICAL Co., LTD., "DISPARLON KS-860, 873SN, 874, #2150 (aliphatic polyvalent carboxylic acid), #7004 (polyether ester), DA-703-50, DA-705, and DA-725" produced by Kusumoto Chemicals, Ltd., "DEMOL RN, N (naphthalenesulfonic acid-formalin polycondensate), MS, C, and SN—B (aromatic sulfonic acid-formalin polycondensate)", "HOMOGENOL L-18 (polymeric polycarboxylic acid)", "EMULGEN 920, 930, 935, and 985 (polyoxyethylene nonylphenyl ether)", and "ACETAMIN 86 (stearylamine acetate)" produced by Kao Corporation, "SOLSPERSE 5000 (phthalocyanine derivative), 22000 (azo pigment derivative), 13240 (polyester amine), 3000, 12000, 17000, 20000, 27000 (polymer containing a functional portion on a terminal portion), 24000, 28000, 32000, and 38500 (graft copolymer)" produced by Lubrizol Japan Limited, "NIKKOL T106 (polyoxyethylene sorbitan monooleate), and MYS-IEX (polyoxyethylene monostearate)" produced by Nikko Chemicals Co., Ltd., HINOACT T-8000E and the like produced by Kawaken Fine Chemicals Co., Ltd., an organosiloxane polymer KP-341 produced by Shin-Etsu Chemical Co., Ltd., "W001: cationic surfactant", nonionic surfactants such as polyoxyethylene lauryl ether, polyoxyethylene stearyl ether, polyoxyethylene oleyl ether, polyoxyethylene octyl phenyl ether, polyoxyethylene nonylphenyl ether, polyethylene glycol dilaurate, polyethylene glycol distearate, and a sorbitan fatty acid ester, and anionic surfactants such as "W004, W005, and W017" produced by Yusho Co., Ltd., "EFKA-46, EFKA-47, EFKA-47EA, EFKA polymer 100, EFKA polymer 400, EFKA polymer 401, and EFKA polymer 450" produced by MORISHITA & CO., LTD., polymer dispersants such as "DISPERSE AID 6. DISPERSE AID 8, DISPERSE AID 15, and DISPERSE AID 9100" produced by SAN NOPCO LIMITED, "ADEKA PLURONIC L31, F38, L42, L44, L61, L64, F68, L72, P95, F77, P84, F87, P94, L101, P103, F108, L121, and P-123" produced by ADEKA CORPORATION, and "IONET (trade name) S-20" produced by Sanyo Chemical Industries, Ltd. Moreover, ACRYBASE FFS-6752 and ACRYBASE FFS-187 can also be used.

In addition, it is also preferable that an amphoteric resin containing an acid group and a basic group is used. The amphoteric resin is preferably a resin having an acid value equal to or higher than 5 mg KOH/g and an amine value equal to or higher than 5 mg KOH/g.

Examples of commercial products of the amphoteric resin include DISPERBYK-130, DISPERBYK-140, DISPERBYK-142, DISPERBYK-145, DISPERBYK-180, DISPERBYK-187, DISPERBYK-191, DISPERBYK-2001, DISPERBYK-2010, DISPERBYK-2012, DISPERBYK-2025, and BYK-9076 produced by BYK-Chemie GmbH, and AJISPER PB821, AJISPER PB822, and AJISPER PB881 produced by Ajinomoto Fine-Techno Co., Inc.

These polymer compounds may be used singly or in combination of two or more thereof.

Furthermore, regarding specific examples of the polymer compound, reference can be made to the polymer compound described in paragraphs 0127 to 0129 of JP2013-249417A, the contents of which are incorporated into the present specification.

In addition, as the dispersant, in addition to the aforementioned polymer compounds, the graft copolymer described in paragraphs 0037 to 0115 of JP2010-106268A (corresponding to paragraphs 0075 to 0133 of US2011/0124824A) can be used, the contents of which can be incorporated by reference into the present specification.

Moreover, in addition to the aforementioned dispersant, the polymer compound described in paragraphs 0028 to 0084 of JP2011-153283A (corresponding to paragraphs 0075 to 0133 of US2011/0279759A) which contains a constituent component having a side chain structure formed by bonding of acidic groups through a linking group can be used, the contents of which can be incorporated by reference into the present specification.

Furthermore, as the dispersant, the resin described in paragraphs 0033 to 0049 of JP2016-109763A can also be used, the contents of which are incorporated into the present specification.

<Alkali-Soluble Resin>

The composition preferably contains an alkali-soluble resin. In the present specification, the alkali-soluble resin refers to a resin containing a group (an alkali-soluble group, for example, an acid group such as a carboxylic acid group) which promotes alkali solubility, and refers to a resin different from the dispersant described above.

A content of the alkali-soluble resin in the composition is not particularly limited, but is preferably 1% to 30% by mass, more preferably 2% to 20% by mass, and even more preferably 3% to 15% by mass, with respect to the total solid content of the composition.

The alkali-soluble resins may be used singly or in combination of two or more thereof. In a case where two or more alkali-soluble resins are used in combination, the total content thereof is preferably within the above range.

An acid value of the alkali-soluble resin is not particularly limited, but is preferably 30 to 500 mg KOH/g and more preferably 50 to 200 mg KOH/g, in general.

As the alkali-soluble resin, a resin containing at least one alkali-soluble group in a molecule is mentioned, and examples thereof include a polyhydroxystyrene resin, a polysiloxane resin, a (meth)acrylic resin, a (meth)acrylamide resin, a (meth)acryl/(meth)acrylamide copolymer resin, an epoxy-based resin, and a polyimide resin.

Specific examples of the alkali-soluble resin include a copolymer of an unsaturated carboxylic acid and an ethylenically unsaturated compound.

The unsaturated carboxylic acid is not particularly limited, but examples thereof include monocarboxylic acids such as (meth)acrylic acid, crotonic acid, and vinyl acetate; dicarboxylic acid such as itaconic acid, maleic acid, and fumaric acid or an acid anhydride thereof; and polyvalent carboxylic acid monoesters such as mono(2-(meth)acryloyloxyethyl)phthalate.

Examples of a copolymerizable ethylenically unsaturated compound include methyl (meth)acrylate. Moreover, the compounds described in paragraph 0027 of JP2010-097210A and paragraphs 0036 and 0037 of JP2015-068893A can also be used, the contents of which are incorporated into the present specification.

Furthermore, copolymerizable ethylenically unsaturated compounds containing an ethylenically unsaturated group in a side chain may be used in combination. As the ethylenically unsaturated group, a (meth)acrylic acid group is preferable. An acrylic resin containing an ethylenically unsaturated group in a side chain can be obtained, for example, by addition-reacting a carboxylic acid group of an acrylic resin containing the carboxylic acid group with an ethylenically unsaturated compound containing a glycidyl group or an alicyclic epoxy group.

As the alkali-soluble resin, an alkali-soluble resin containing a curable group is also preferable.

As the curable group, the curable groups, which may be contained in the aforementioned polymer compound, are also mentioned, and preferred ranges are also the same.

The alkali-soluble resin containing a curable group is preferably an alkali-soluble resin having a curable group in the side chain, or the like. Examples of the alkali-soluble resin containing a curable group include DIANAL NR series (produced by Mitsubishi Rayon Co., Ltd.), Photomer 6173 (COOH-containing polyurethane acrylic oligomer, produced by Diamond Shamrock Co., Ltd.), VISCOAT R-264 and KS resist 106 (all produced by OSAKA ORGANIC CHEMICAL INDUSTRY LTD.), CYCLOMER P series (for example, ACA230AA) and PLACCEL CF200 series (all produced by DAICEL CORPORATION), Ebecryl 3800 (produced by DAICEL-ALLNEX LTD.), and ACRYCURE RD-F8 (produced by NIPPON SHOKUBAI CO., LTD.).

As the alkali-soluble resin, for example, the radical polymers which contain a carboxylic acid group in a side chain and are described in JP1984-044615A (JP-S59-044615A), JP1979-034327B (JP-S54-034327B), JP1983-012577B (JP-S58-012577B), JP1979-025957B (JP-S54-025957B), JP1979-092723A (JP-S54-092723A). JP1984-053836A (JP-S59-053836A), and JP1984-071048A (JP-S59-071048A): the acetal-modified polyvinyl alcohol-based binder resins which contain an alkali-soluble group and are described in EP993966B, EP124000B, and JP2001-318463A; polyvinyl pyrrolidone: polyethylene oxide; polyether or the like which is a reaction product of alcohol-soluble nylon, 2,2-bis-(4-hydroxyphenyl)-propane, and epichlorohydrin: the polyimide resin described in WO2008/123097A; and the like can be used.

As the alkali-soluble resin, for example, the compound described in paragraphs 0225 to 0245 of JP2016-075845A can also be used, the contents of which are incorporated into the present specification.

As the alkali-soluble resin, a copolymer of [benzyl (meth)acrylate(meth)acrylic acid/another addition polymerizable vinyl monomer, if necessary], and a copolymer of [allyl (meth)acrylate/(meth)acrylic acid/another addition polymerizable vinyl monomer, if necessary] are suitable because the copolymers have an excellent balance of film hardness, sensitivity, and developability.

The other addition polymerizable vinyl monomer may be used singly or two or more other addition polymerizable vinyl monomers may be used.

It is also preferable that the copolymer has a curable group (preferably, an ethylenically unsaturated group such as a (meth)acryloyl group). For example, a curable group may be introduced into a copolymer by using a monomer having the curable group as the other addition polymerizable vinyl monomer. Furthermore, a curable group (preferably, an ethylenically unsaturated group such as a (meth)acryloyl group) may be introduced into a part or all of one or more of units derived from (meth)acrylic acid in the copolymer and/or units derived from the other addition polymerizable vinyl monomer.

Examples of the other addition polymerizable vinyl monomer include methyl (meth)acrylate, a styrene-based monomer (hydroxystyrene or the like), and an ether dimer.

Examples of the ether dimer include a compound represented by General Formula (ED1) and a compound represented by General Formula (ED2).

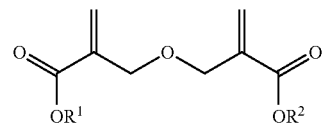

(ED1)

In General Formula (ED1), $R^1$ and $R^2$ each independently represent a hydrogen atom or a hydrocarbon group having 1 to 25 carbon atoms.

(ED2)

In General Formula (ED2), R represents a hydrogen atom or an organic group having 1 to 30 carbon atoms. Regarding specific examples of General Formula (ED2), reference can be made to the description of JP2010-168539A.

Regarding specific examples of the ether dimer, reference can be made to, for example, paragraph 0317 of JP2013-029760A, the contents of which are incorporated into the present specification. One ether dimer may be used singly or two or more ether dimers may be used.

As the alkali-soluble resin, a polyimide precursor can also be used. The polyimide precursor refers to a resin obtained by causing an addition polymerization reaction between a compound containing an acid anhydride group and a diamine compound at a temperature of 40° C. to 100° C.

Examples of the polyimide precursor include a resin having a repeating unit represented by Formula (1). Examples of the polyimide precursor include polyimide precursors containing an amic acid structure represented by Formula (2), and imide structures represented by Formula (3) obtained in a case where imide ring closure occurs in a portion of an amic acid structure and Formula (4) obtained in a case where imide ring closure occurs in the entirety of an amic acid structure.

Furthermore, in the present specification, the polyimide precursor having an amic acid structure is referred to as polyamic acid in some cases.

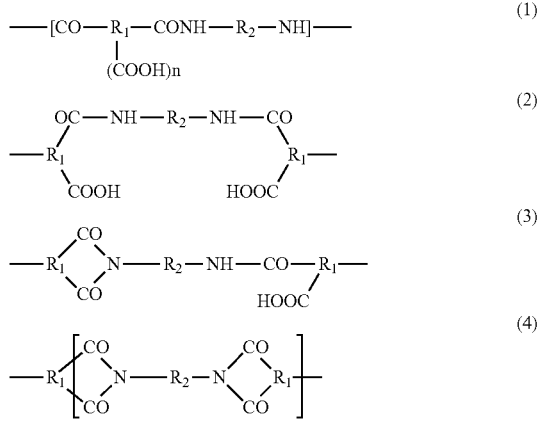

In Formulae (1) to (4), $R_1$ represents a tetravalent organic group having 2 to 22 carbon atoms, $R_2$ represents a divalent organic group having 1 to 22 carbon atoms, and n represents 1 or 2.

Specific examples of the polyimide precursor include the compound described in paragraphs 0011 to 0031 of JP2008-106250A, the compound described in paragraphs 0022 to 0039 of JP2016-122101A, and the compound described in paragraphs 0061 to 0092 of JP2016-068401A, the contents of which are incorporated into the present specification.

From the viewpoint that a pattern shape of a pattern-like cured film formed of the composition is superior, it is also preferable that the alkali-soluble resin contains at least one selected from the group consisting of a polyimide resin and a polyimide precursor.

The polyimide resin containing the alkali-soluble group is not particularly limited, and known polyimide resins containing the alkali-soluble group can be used. Examples of the polyimide resin include the resin described in paragraph 0050 of JP2014-137523A, the resin described in paragraph 0058 of JP2015-187676A, and the resin described in paragraphs 0012 and 0013 of JP2014-106326A, the contents of which are incorporated into the present specification.

(Resin Containing Ethylenically Unsaturated Group)

From the viewpoint that rectangularity of a cross-sectional shape of the obtained cured film is superior, the composition used in the production method of the present invention preferably contains a resin containing an ethylenically unsaturated group. The resin containing an ethylenically unsaturated group may be a dispersant or an alkali-soluble resin. Moreover, the resin containing an ethylenically unsaturated group may be a resin other than the dispersant or the alkali-soluble resin.

The lower limit of a content of the resin containing an ethylenically unsaturated group in the composition is preferably equal to or greater than 30% by mass, more preferably equal to or greater than 50% by mass, even more preferably equal to or greater than 65% by mass, and particularly preferably equal to or greater than 85% by mass, with respect to the total mass of the resins contained in the composition.

The upper limit of the content of the resin containing an ethylenically unsaturated group in the composition is preferably equal to or less than 100% by mass with respect to the total mass of the resins contained in the composition.

One resin containing an ethylenically unsaturated group may be used singly or two or more resins containing an ethylenically unsaturated group may be used, and in a case where two or more resins containing an ethylenically unsaturated group are used, the total content thereof is preferably within the above range.

Furthermore, the resin containing an ethylenically unsaturated group refers to a resin containing one or more ethylenically unsaturated groups in one molecule.

The content of the resin containing an ethylenically unsaturated group may be calculated from the charged amount of raw materials.

In addition, the content of the ethylenically unsaturated group with respect to the total resin mass is not particularly limited, but is preferably 0.001 to 5.00 mmol/g, more preferably 0.10 to 3.00 mmol/g, and even more preferably 0.26 to 2.50 mmol/g. In a case where the content of the ethylenically unsaturated group is within a range of 0.10 to 3.00 mmol/g, the rectangularity of the cross-sectional shape of the cured film formed of the composition is superior.

Furthermore, the total resin mass means the total mass of the resins contained in the composition, and for example, in a case where the composition contains a resin containing an ethylenically unsaturated group and a resin containing no ethylenically unsaturated group, the total mass of both resins corresponds to the total mass of the resins.

Therefore, the content of the ethylenically unsaturated group represents the content of the ethylenically unsaturated group in the resin, which contains the ethylenically unsaturated group, with respect to the total resin mass.

Moreover, the resin refers to a component which is dissolved in the composition and has a weight-average molecular weight greater than 2,000.

In the present specification, the content of the ethylenically unsaturated group is referred to as a "C=C value" in some cases.

In the present specification, the content (C=C value) of the ethylenically unsaturated group means a value measured by the following method. Moreover, in a case where a resin containing an ethylenically unsaturated group is synthesized, the content (C=C value) may be calculated from the charged amount of raw materials and substituted for measurement.

Furthermore, in a case where the composition contains a plurality of resins and the C=C value of each resin is clear, the C=C value as the total resin mass in the composition may be calculated and determined from a formulation ratio of each resin.

As a method for measuring the content of the ethylenically unsaturated group in the resin, the following method is used in a case where the ethylenically unsaturated group is a (meth)acryloyl group.

First, solid components (a black pigment or the like) in the composition are precipitated by a centrifugal separation method, and the remaining liquid components are fractionated. Components having a weight-average molecular weight greater than 2,000 are further fractionated from the obtained liquid components by the GPC method, and used as a resin to be measured.

Subsequently, 0.25 mg of the resin to be measured is dissolved in 50 mL of tetrahydrofuran (THF), and 15 mL of methanol is further added to produce a solution.

To the produced solution is added 10 mL of 4N aqueous sodium hydroxide solution to obtain a mixed solution. Subsequently, the mixed solution is stirred at a liquid temperature of 40° C. for 2 hours. Moreover, 10.2 mL of 4N aqueous methanesulfonic acid solution is added to the mixed solution, followed by stirring. Furthermore, 5 mL of demineralized water is added to the mixed solution, and subsequently, 2 mL of methanol is added to prepare a measurement solution.

A content of (meth)acrylic acid in the measurement solution is measured by the high performance liquid chromatography (HPLC) method (absolute calibration curve method), and then the content of the ethylenically unsaturated group is calculated.

HPLC measurement condition column: Synergi 4µ Polar-RP 80A (4.6 mm×250 mm) manufactured by Phenomenex Inc.

Column temperature: 40° C.
Flow rate: 1.0 mL/min
Wavelength of detector: 210 nm
Eluent: 55 of tetrahydrofuran (THF, for HPLC)/45 of buffer water (buffer water aqueous solution of 0.2%—phosphoric acid and 0.2%—triethylamine)
Injection volume; 5 µL As the method for measuring the content of the ethylenically unsaturated group in the resin, a method for measuring bromination of the resin to be measured, which is fractionated by the aforementioned method, can be used in a case where the ethylenically unsaturated group is a group other than a (meth)acryloyl group, or is a combination of a (meth)acryloyl group and a group other than a (meth) acryloyl group. A bromine value is measured in accordance with JIS K 2605:1996.

Herein, the content of the ethylenically unsaturated group is a value obtained by converting the number of grams ($gBr_2/10$ g) of bromine (Br), which is added to 100 g of a resin to be measured and obtained from the aforementioned bromine value, into the number of moles of bromine ($Br_2$) added per 1 g of the resin.

[Polymerizable Compound]

The composition according to the embodiment of the present invention preferably contains a polymerizable compound.

In the present specification, the polymerizable compound refers to a compound which is polymerized by the action of the polymerization initiator, which will be described later, and refers to a component different from the aforementioned dispersant and alkali-soluble resin.

Moreover, the polymerizable compound refers to a component different from an epoxy group-containing compound which will be described later.

A content of the polymerizable compound in the composition is not particularly limited, but is preferably 5% to 35% by mass, more preferably 10% to 30% by mass, and even more preferably 15% to 25% by mass, with respect to the total solid content of the composition. The polymerizable compounds may be used singly or in combination of two or more thereof. In a case where two or more polymerizable compounds are used in combination, the total content thereof is preferably within the above range.

The polymerizable compound is a low-molecular-weight compound, and the low-molecular-weight compound mentioned here is a compound having a molecular weight equal to or less than 2.000.

The polymerizable compound is preferably a compound which contains a group (hereinafter, simply referred to as an "ethylenically unsaturated group" as well) containing an ethylenically unsaturated bond.

That is, the composition according to the embodiment of the present invention preferably contains, as a polymerizable compound, a low-molecular-weight compound containing an ethylenically unsaturated group.

The polymerizable compound is preferably a compound containing one or more ethylenically unsaturated bonds, more preferably a compound containing two or more ethylenically unsaturated bonds, even more preferably a compound containing three or more ethylenically unsaturated bonds, and particularly preferably a compound containing five or more ethylenically unsaturated bonds. The upper limit thereof is equal to or smaller than 15, for example. Examples of the ethylenically unsaturated group include a vinyl group, a (meth)allyl group, and a (meth)acryloyl group.

As the polymerizable compound, for example, the compounds described in paragraph 0050 of JP2008-260927A and paragraph 0040 of JP2015-068893A can be used, the contents of which are incorporated into the present specification.

The polymerizable compound may be in any chemical form such as a monomer, a prepolymer, an oligomer, a mixture thereof, and a multimer thereof.

The polymerizable compound is preferably a tri- to pentadeca-functional (meth)acrylate compound, and more preferably a tri- to hexa-functional (meth)acrylate compound.

As the polymerizable compound, a compound which contains one or more ethylenically unsaturated groups and has a boiling point equal to or higher than 100° C. under normal pressure is also preferable. Reference can be made to, for example, the compounds described in paragraph 0227 of JP2013-029760A and paragraphs 0254 to 0257 of JP2008-292970A, the contents of which are incorporated into the present specification.

As the polymerizable compound, dipentaerythritol triacrylate (as a commercial product, KAYARAD D-330; produced by Nippon Kayaku Co., Ltd.), dipentaerythritol tetraacrylate (as a commercial product, KAYARAD D-320; produced by Nippon Kayaku Co., Ltd.), dipentaerythritol penta(meth)acrylate (as a commercial product, KAYARAD D-310; produced by Nippon Kayaku Co., Ltd.), dipentaerythritol hexa(meth)acrylate (as a commercial product, KAYARAD DPHA: produced by Nippon Kayaku Co., Ltd., and A-DPH-12E: produced by Shin-Nakamura Chemical Co., Ltd.) and a structure (for example, SR454 and SR499 commercially available from Sartomer) in which an ethylene glycol residue or a propylene glycol residue is between these (meth)acryloyl groups are preferable. Oligomer types thereof can also be used. Moreover, NK ESTER A-TMMT (pentaerythritol tetraacrylate, produced by Shin-Nakamura Chemical Co., Ltd.), KAYARAD RP-1040, KAYARAD DPEA-12LT, KAYARAD DPHA LT, KAYARAD RP-3060, and KAYARAD DPEA-12 (produced by Nippon Kayaku Co., Ltd.), and the like may be used.

The preferred aspects of the polymerizable compound are shown below.

The polymerizable compound may have an acid group such as a carboxylic acid group, a sulfonic acid group, and a phosphoric acid group. The polymerizable compound containing an acid group is preferably an ester of an aliphatic polyhydroxy compound and an unsaturated carboxylic acid, more preferably a polymerizable compound having an acid group by reacting a nonaromatic carboxylic acid anhydride with an unreacted hydroxyl group of an aliphatic polyhydroxy compound, and even more preferably a compound in which the aliphatic polyhydroxy compound in the ester is pentaerythritol and/or dipentaerythritol. Examples of a commercial product thereof include ARONIX TO-2349, M-305, M-510, and M-520 produced by TOAGOSEI CO., LTD.

The acid value of the polymerizable compound containing an acid group is preferably 0.1 to 40 mg KOH/g and more preferably 5 to 30 mg KOH/g. Ina case where the acid value of the polymerizable compound is equal to or greater than 0.1 mg KOH/g, development dissolution characteristics are favorable, and in a case where the acid value is equal to or less than 40 mg KOH/g, the polymerizable compound is advantageous in terms of production and/or handling. Moreover, a photopolymerization performance is favorable, and curing properties are excellent.

As the polymerizable compound, a compound having a caprolactone structure is also a preferred aspect.

The compound having a caprolactone structure is not particularly limited as long as the compound has a caprolactone structure in a molecule, but examples thereof include ε-caprolactone-modified polyfunctional (meth)acrylate which is obtained by esterifying polyhydric alcohol such as trimethylolethane, ditrimethylolethane, trimethylolpropane, ditrimethylolpropane, pentaerythritol, dipentaerythritol, tripentaerythritol, glycerin, diglycerol, and trimethylol melamine, (meth)acrylic acid, and ε-caprolactone. Among them, a compound which has a caprolactone structure and is represented by Formula (Z-1) is preferable.

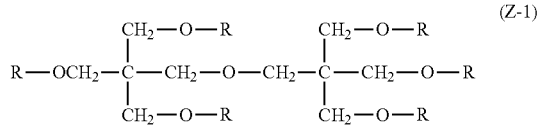

(Z-1)

In Formula (Z-1), all six R's are groups represented by Formula (Z-2), or one to five R's among the six R's are groups represented by Formula (Z-2) and the others are groups represented by Formula (Z-3).

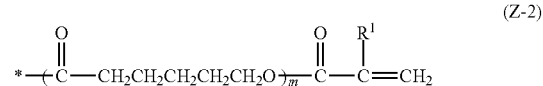

(Z-2)

In Formula (Z-2), $R^1$ represents a hydrogen atom or a methyl group, m represents a number of 1 or 2, and "*" represents a bond.

(Z-3)

In Formula (Z-3), $R^1$ represents a hydrogen atom or a methyl group, and "*" represents a bond.

The polymerizable compound having a caprolactone structure is commercially available, for example, as KAYARAD DPCA series from Nippon Kayaku Co., Ltd., and examples thereof include DPCA-20 (a compound in which m in Formulae (Z-1) to (Z-3) is 1, the number of groups represented by Formula (Z-2) is 2, and all of $R^1$'s represent hydrogen atoms), DPCA-30 (a compound in which m in Formulae (Z-1) to (Z-3) is 1, the number of groups represented by Formula (Z-2) is 3, and all of $R^1$'s represent hydrogen atoms), DPCA-60 (a compound in which m in Formulae (Z-1) to (Z-3) is 1, the number of groups represented by Formula (Z-2) is 6, and all of $R^1$'s represent hydrogen atoms), and DPCA-120 (a compound in which m in Formulae (Z-1) to (Z-3) is 2, the number of groups represented by Formula (Z-2) is 6, and all of $R^1$'s represent hydrogen atoms).

As the polymerizable compound, a compound represented by Formula (Z-4) or (Z-5) can also be used.

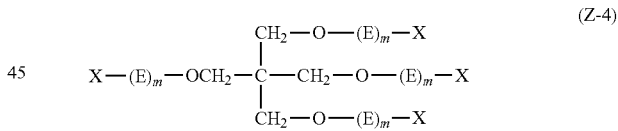

(Z-4)

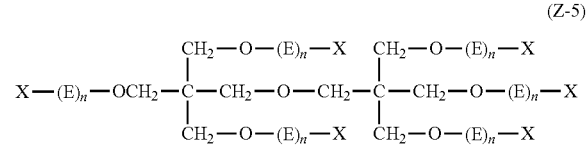

(Z-5)

In Formulae (Z-4) and (Z-5). E's each independently represent —$((CH_2)_yCH_2O)$— or —$((CH_2)_yCH(CH_3)O)$—, y's each independently represent an integer of 0 to 10, and X's each independently represent a (meth)acryloyl group, a hydrogen atom, or a carboxylic acid group.

In Formula (Z-4), the total number of (meth)acryloyl groups is 3 or 4, m's each independently represent an integer of 0 to 10, and the total number of m's is an integer of 0 to 40.

In Formula (Z-5), the total number of (meth)acryloyl groups is 5 or 6, n's each independently represent an integer of 0 to 10, and the total number of n's is an integer of 0 to 60.

In Formula (Z-4), m is preferably an integer of 0 to 6 and more preferably an integer of 0 to 4.

Moreover, the total number of m's is preferably an integer of 2 to 40, more preferably an integer of 2 to 16, and even more preferably an integer of 4 to 8.

In Formula (Z-5), n is preferably an integer of 0 to 6 and more preferably an integer of 0 to 4.

Moreover, the total number of n's is preferably an integer of 3 to 60, more preferably an integer of 3 to 24, and even more preferably an integer of 6 to 12.

Furthermore, an aspect in which a terminal on the oxygen atom side of —(($CH_2$)$_y$$CH_2$O)— or (($CH_2$)CH($CH_3$)O)— in Formula (Z-4) or Formula (Z-5) is bonded to X is preferable.

The compounds represented by Formula (Z-4) or Formula (Z-5) may be used singly or in combination of two or more thereof. In particular, an aspect in which all of six X's in Formula (Z-5) are acryloyl groups, or a mixture of a compound in which all of six X's in Formula (Z-5) are acryloyl groups and a compound in which at least one among the six X's is a hydrogen atom is preferable. By adopting such an aspect, the developability can be further improved.

Furthermore, the total content of the compounds represented by Formula (Z-4) or Formula (Z-5) in the polymerizable compound is preferably equal to or greater than 20% by mass and more preferably equal to or greater than 50% by mass.

Among the compounds represented by Formula (Z-4) or Formula (Z-5), a pentaerythritol derivative and/or a dipentaerythritol derivative is more preferable.

In addition, the polymerizable compound may have a cardo skeleton.

As the polymerizable compound having a cardo skeleton, a polymerizable compound having a 9,9-bisarylfluorene skeleton is preferable.

The polymerizable compound having a cardo skeleton is not limited, but examples thereof include ONCOAT EX series (produced by NAGASE & CO., LTD.), and OGSOL (produced by Osaka Gas Chemicals Co., Ltd.).

As the polymerizable compound, a compound having an isocyanuric acid skeleton as a core is also preferable. Examples of such a polymerizable compound include NK ESTER A-9300 (produced by Shin-Nakamura Chemical Co., Ltd.).

The content (which means a value obtained by dividing the number of ethylenically unsaturated groups in the polymerizable compound by the molecular weight (g/mol) of the polymerizable compound) of the ethylenically unsaturated group in the polymerizable compound is preferably equal to or greater than 5.0 mmol/g. The upper limit thereof is not particularly limited, but is generally equal to or less than 20.0 mmol/g.

Furthermore, in a case where the composition contains a plurality of polymerizable compounds and double bond equivalents of respective polymerizable compounds are not the same, a value obtained by summing up products of mass ratios of respective polymerizable compounds in all the polymerizable compounds and double bond equivalents of respective polymerizable compounds is preferably within the above range.

[Polymerization Initiator]

The composition according to the embodiment of the present invention preferably contains a polymerization initiator.

The polymerization initiator is not particularly limited, and known polymerization initiators can be used. Examples of the polymerization initiator include a photopolymerization initiator and a thermal polymerization initiator, and a photopolymerization initiator is preferable. Moreover, as the polymerization initiator, a so-called radical polymerization initiator is preferable.

A content of the polymerization initiator in the composition is not particularly limited, but is preferably 0.5% to 20% by mass, more preferably 1.0% to 10% by mass, and even more preferably 1.5% to 8% by mass, with respect to the total solid content of the composition. The polymerization initiators may be used singly or in combination of two or more thereof. In a case where two or more polymerization initiators are used in combination, the total content thereof is preferably within the above range.

<Thermal Polymerization Initiator>

Examples of the thermal polymerization initiator include an azo compound such as 2,2'-azobisisobutyronitrile (AIBN), 3-carboxypropionitrile, azobismalononitrile, and dimethyl-(2,2')-azobis(2-methylpropionate) [V-601] and an organic peroxide such as benzoyl peroxide, lauroyl peroxide, and potassium persulfate.

Specific examples of the thermal polymerization initiator include the polymerization initiator described in pp. 65 to 148 of "Ultraviolet Curing System" (published by Sogo Gijutsu Center, 1989) written by Kiyomi KATO.

<Photopolymerization Initiator>

The composition preferably contains a photopolymerization initiator.

The photopolymerization initiator is not particularly limited as long as the photopolymerization initiator can initiate the polymerization of the polymerizable compound, and known photopolymerization initiators can be used. As the photopolymerization initiator, for example, a photopolymerization initiator exhibiting photosensitivity from an ultraviolet range to a visible light range is preferable. Moreover, the photopolymerization initiator may be an activator which generates active radicals by causing a certain action with a photoexcited sensitizer, or an initiator which initiates cationic polymerization according to the type of the polymerizable compound.

Furthermore, the photopolymerization initiator preferably contains at least one compound having a molar absorption coefficient of at least 50 within a range of 300 to 800 nm (more preferably 330 to 500 nm).

A content of the photopolymerization initiator in the composition is not particularly limited, but is preferably 0.5% to 20% by mass, more preferably 1.0% to 10% by mass, and even more preferably 1.5% to 8% by mass, with respect to the total solid content of the composition. The photopolymerization initiators may be used singly or in combination of two or more thereof. In a case where two or more photopolymerization initiators are used in combination, the total content thereof is preferably within the above range.

Examples of the photopolymerization initiator include a halogenated hydrocarbon derivative (for example, a compound having a triazine skeleton, a compound having an oxadiazole skeleton, or the like), an acyl phosphine compound such as acyl phosphine oxide, hexaaryl biimidazole, an oxime compound such as an oxime derivative, an organic peroxide, a thio compound, a ketone compound, an aromatic onium salt, an aminoacetophenone compound, and hydroxyacetophenone.

Regarding specific examples of the photopolymerization initiator, reference can be made to, for example, paragraphs 0265 to 0268 of JP2013-029760A, the contents of which are incorporated into the present specification.

More specifically, as the photopolymerization initiator, for example, the aminoacetophenone-based initiator described in JP1998-291969A (JP-H10-291969A) and the acyl phosphine oxide-based initiator described in JP4225898B can also be used.

As the hydroxyacetophenone compound, for example, IRGACURE-184, DAROCUR-1173, IRGACURE-500, IRGACURE-2959, and IRGACURE-127 (trade names: all produced by BASF SE) can be used.

As the aminoacetophenone compound, for example, IRGACURE-907, IRGACURE-369, and IRGACURE-379EG (trade names: all produced by BASF SE), which are commercial products, can be used. As the aminoacetophenone compound, the compound which is described in JP2009-191179A and whose absorption wavelength is matched to a light source having a long wavelength such as a wavelength of 365 nm or a wavelength of 405 nm can also be used.

As the acyl phosphine compound. IRGACURE-819 and IRGACURE-TPO (trade names: all produced by BASF SE), which are commercial products, can be used.

(Oxime Compound)

As the photopolymerization initiator, an oxime ester-based polymerization initiator (oxime compound) is more preferable. In particular, an oxime compound has high sensitivity and high polymerization efficiency, easily designs the content of the light-shielding pigment in the composition to be high, and thus is preferable.

As specific examples of the oxime compound, the compound described in JP2001-233842A, the compound described in JP2000-080068A, or the compound described in JP2006-342166A can be used.

Examples of the oxime compound include 3-benzoyloxy-iminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Furthermore, the compounds described in J. C. S. Perkin II (1979) pp. 1653 to 1660, J. C. S. Perkin II (1979) pp. 156 to 162, Journal of Photopolymer Science and Technology (1995) pp. 202 to 232, JP2000-066385A, JP2000-080068A, JP2004-534797A, and JP2006-342166A can also be mentioned.

Among commercial products, IRGACURE-OXE01 (produced by BASF SE), IRGACURE-OXE02 (produced by BASF SE), IRGACURE-OXE03 (produced by BASF SE), or IRGACURE-OXE04 (produced by BASF SE) is also preferable. Moreover, TR-PBG-304 (produced by TRONLY), ADEKA ARKLS NCI-831 and ADEKA ARKLS NC-930 (produced by ADEKA CORPORATION), or N-1919 (carbazole and oxime ester skeleton-containing photoinitiator (produced by ADEKA CORPORATION)) can also be used.

In addition, as oxime compounds other than the aforementioned oxime compounds, the compound which is described in JP2009-519904A and in which oxime is linked to a N-position of carbazole; the compound which is described in U.S. Pat. No. 7,626,957B and in which a hetero substituent is introduced into a benzophenone moiety; the compounds which are described in JP2010-015025A and US2009/0292039A and in which a nitro group is introduced into the moiety of a coloring agent; the ketoxime compound described in W2009/131189A; the compound which is described in U.S. Pat. No. 7,556,910B and contains a triazine skeleton and an oxime skeleton in the same molecule: the compound which is described in JP2009-221114A, has absorption maximum at 405 nm, and exhibits favorable sensitivity with respect to a light source of a g-line; and the like may be used.

Reference can be made to, for example, paragraphs 0274 and 0275 of JP2013-029760A, the contents of which are incorporated into the present specification.

Specifically, as the oxime compound, a compound represented by Formula (OX-1) is preferable. Moreover, a N—O bond in the oxime compound may be an (E) isomer, a (Z) isomer, or a mixture of an (E) isomer and a (Z) isomer.

(OX-1)

In Formula (OX-1), R and B each independently represent a monovalent substituent, A represents a divalent organic group, and Ar represents an aryl group.

In Formula (OX-1), the monovalent substituent represented by R is preferably a group of monovalent nonmetallic atoms.

Examples of the group of monovalent nonmetallic atoms include an alkyl group, an aryl group, an acyl group, an alkoxycarbonyl group, an aryloxycarbonyl group, a heterocyclic group, an alkylthiocarbonyl group, and an arylthiocarbonyl group. Moreover, these groups may have one or more substituents. Furthermore, each of the substituents may be further substituted with another substituent.

Examples of the substituent include a halogen atom, an aryloxy group, an alkoxycarbonyl group or an aryloxycarbonyl group, an acyloxy group, an acyl group, an alkyl group, and an aryl group.

As the monovalent substituent represented by B in Formula (OX-1), an aryl group, a heterocyclic group, an arylcarbonyl group, or a heterocyclic carbonyl group is preferable, and an aryl group or a heterocyclic group is more preferable. These groups may have one or more substituents. Examples of the substituents include the aforementioned substituents.

As the divalent organic group represented by A in Formula (OX-1), an alkylene group having 1 to 12 carbon atoms, a cycloalkylene group, or an alkynylene group is preferable. These groups may have one or more substituents. Examples of the substituents include the aforementioned substituents.

As the photopolymerization initiator, a fluorine atom-containing oxime compound can also be used. Specific examples of the fluorine atom-containing oxime compound include the compound described in JP2010-262028A; the compounds 24 and 36 to 40 described in JP2014-500852A; and the compound (C-3) described in JP2013-164471A. The contents thereof are incorporated into the present specification.

As the photopolymerization initiator, compounds represented by Formulae (1) to (4) can also be used.

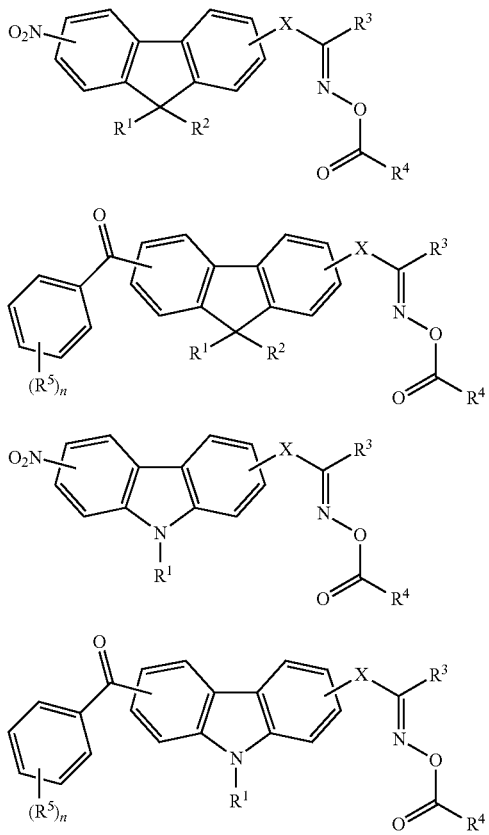

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an aryl alkyl group having 7 to 30 carbon atoms, in a case where $R^1$ and $R^2$ each represent a phenyl group, the phenyl groups may be bonded to each other to form a fluorene group, $R^3$ and $R^4$ each independently represent a hydrogen atom, an alkyl group having 1 to 20 carbon atoms, an aryl group having 6 to 30 carbon atoms, an aryl alkyl group having 7 to 30 carbon atoms, or a heterocyclic group having 4 to 20 carbon atoms, and X represents a direct bond or a carbonyl group.

In Formula (2), $R^1$, $R^2$, $R^3$, and $R^4$ have the same definitions as $R^1$, $R^2$, $R^3$, and $R^4$ in Formula (1), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, R represents an alkyl group having 1 to 20 carbon atoms, an aryl group having 6 to 30 carbon atoms, an aryl alkyl group having 7 to 30 carbon atoms, or a heterocyclic group having 4 to 20 carbon atoms, X represents a direct bond or a carbonyl group, and a represents an integer of 0 to 4.

In Formula (3), $R^1$ represents an alkyl group having 1 to 20 carbon atoms, an alicyclic hydrocarbon group having 4 to 20 carbon atoms, an aryl group having 6 to 30 carbon atoms, or an aryl alkyl group having 7 to 30 carbon atoms, $R^3$ and $R^4$ each independently represent a hydrogen atom, an alkyl group having 1 to 20 carbon atoms, an aryl group having 6 to 30 carbon atoms, an aryl alkyl group having 7 to 30 carbon atoms, or a heterocyclic group having 4 to 20 carbon atoms, and X represents a direct bond or a carbonyl group.

In Formula (4), $R^1$, $R^3$, and $R^4$ have the same definitions as $R^1$, $R^3$, and $R^4$ in Formula (3), R represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents an alkyl group having 1 to 20 carbon atoms, an aryl group having 6 to 30 carbon atoms, an aryl alkyl group having 7 to 30 carbon atoms, or a heterocyclic group having 4 to 20 carbon atoms, X represents a direct bond or a carbonyl group, and a represents an integer of 0 to 4.

In Formulae (1) and (2). $R^1$ and $R^2$ are preferably each independently a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group.

$R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Furthermore, in Formulae (3) and (4), $R^1$'s are preferably each independently a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Specific examples of the compounds represented by Formula (1) and Formula (2) include the compound described in paragraphs 0076 to 0079 of JP2014-137466A. The contents thereof are incorporated into the present specification.

Specific examples of an oxime compound preferably used in the composition are shown below. Among the oxime compounds shown below, an oxime compound represented by General Formula (C-13) is more preferable.

Furthermore, as the oxime compound, the compounds described in Table 1 of WO2015/036910A can also be used, the contents of which are incorporated into the present specification.

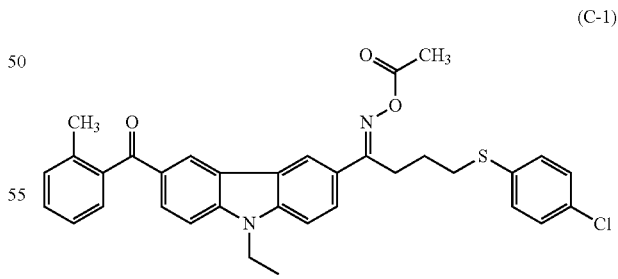

(C-1)

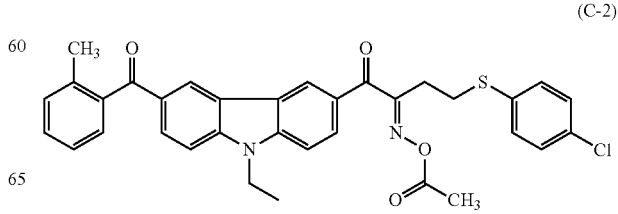

(C-2)

-continued
(C-3)
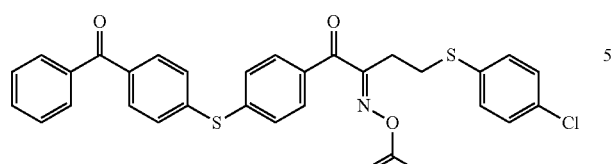
(C-4)
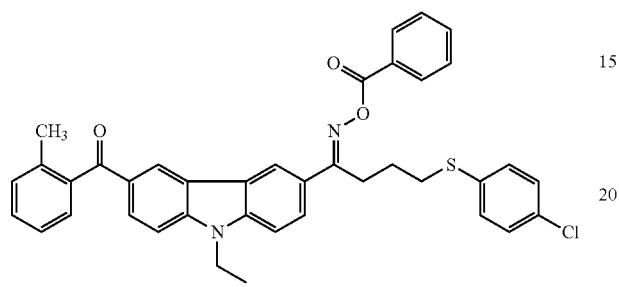
(C-5)
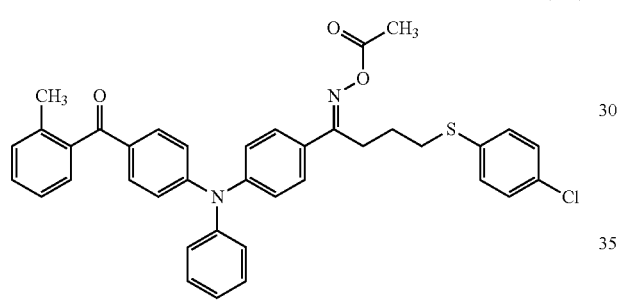
(C-6)
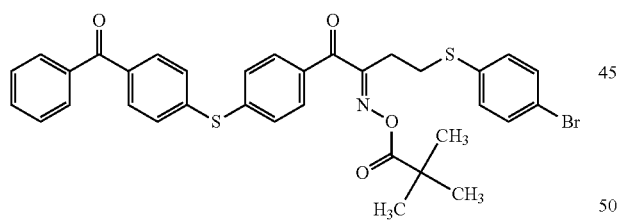
(C-7)
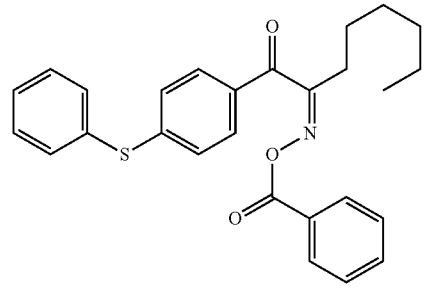
-continued
(C-8)
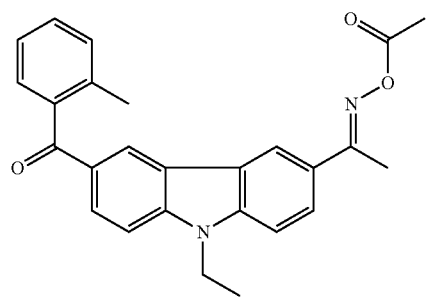
(C-9)
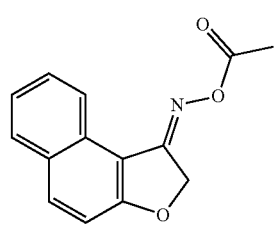
(C-10)
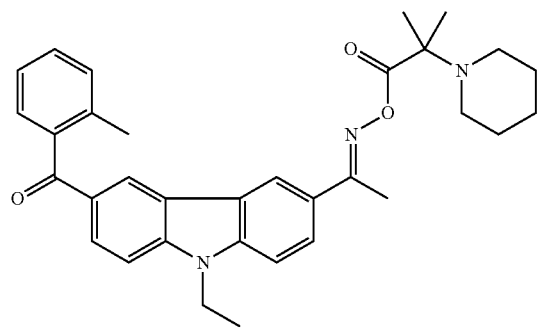
(C-11)
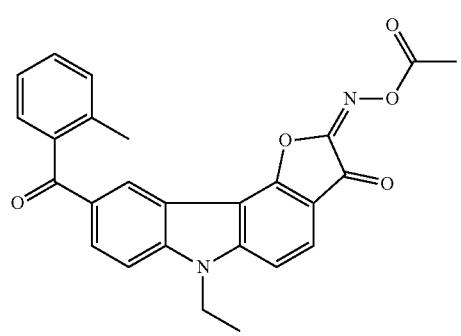
(C-12)
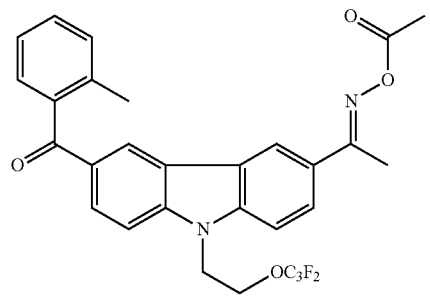

-continued

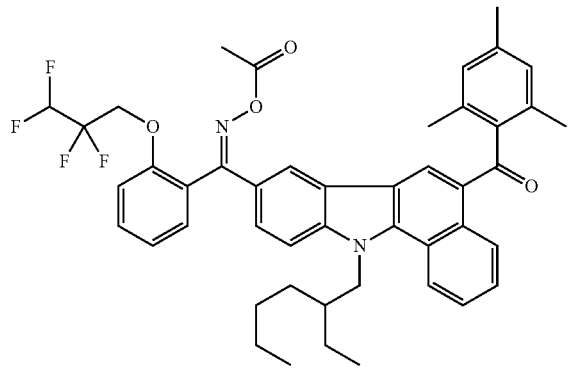

(C-13)

The oxime compound preferably has a maximum absorption in a wavelength range of 350 to 500 nm, more preferably has a maximum absorption in a wavelength range of 360 to 480 nm, and even more preferably has a high absorbance at wavelengths of 365 nm and 405 nm.

From the viewpoint of sensitivity, a molar absorption coefficient of the oxime compound at 365 nm or 405 nm is preferably 1,000 to 300,000, more preferably 2,000 to 300,000, and even more preferably 5,000 to 200,000.

The molar absorption coefficient of the compound can be measured by known methods, but for example, it is preferable that the measurement is carried out with an ultraviolet and visible spectrophotometer (Cary-5 spectrophotometer manufactured by Varian, Inc.) at a concentration of 0.01 g/L using ethyl acetate.

If necessary, two or more photopolymerization initiators may be used in combination.

In addition, as the photopolymerization initiator, the compounds described in paragraph 0052 of JP2008-260927A, paragraphs 0033 to 0037 of JP2010-097210A, and paragraph 0044 of JP2015-068893A can also be used, the contents of which are incorporated into the present specification.

[Epoxy Group-Containing Compound]

The composition according to the embodiment of the present invention may contain an epoxy group-containing compound.

Examples of the epoxy group-containing compound include compounds having one or more epoxy groups in one molecule, and compounds having two or more epoxy groups in one molecule are preferable. It is preferable that 1 to 100 epoxy groups are contained in one molecule. The upper limit thereof may be equal to or smaller than 10 or equal to or smaller than 5, for example. The lower limit thereof is preferably equal to or more than 2.

In addition, the epoxy group-containing compound refers to a component different from the aforementioned dispersant, alkali-soluble resin, and polymerizable compound.

An epoxy equivalent (=molecular weight of epoxy group-containing compound/the number of epoxy groups) of the epoxy group-containing compound is preferably equal to or less than 500 g/equivalent, more preferably 100 to 400 g/equivalent, and even more preferably 100 to 30 g/equivalent.

The epoxy group-containing compound may be a low-molecular-weight compound (for example, the molecular weight is less than 2,000), or a polymer compound (macromolecule) (for example, the molecular weight is equal to or greater than 2,000, and in a case of a polymer, the weight-average molecular weight is equal to or greater than 2,000). A weight-average molecular weight of the epoxy group-containing compound is preferably 200 to 100.000 and more preferably 500 to 50,000. The upper limit of the weight-average molecular weight is more preferably equal to or less than 10,000, even more preferably equal to or less than 5,000, and particularly preferably equal to or less than 3,000.

A commercial product may be used for the epoxy group-containing compound. Examples thereof include EHPE3150 (produced by DAICEL CORPORATION) and EPICLON N-695 (produced by DIC CORPORATION). Moreover, as the epoxy group-containing compound, the compounds described in paragraphs 0034 to 0036 of JP2013-011869A, paragraphs 0147 to 0156 of JP2014-043556A, and paragraphs 0085 to 0092 of JP2014-089408A may be used.

The contents thereof are incorporated into the present specification.

A content of the epoxy group-containing compound in the composition is preferably 0.1% to 10% by mass, more preferably 0.5% to 8% by mass, and even more preferably 1.0% to 6% by mass, with respect to the total solid content in the composition.

One epoxy group-containing compound may be used singly or two or more epoxy group-containing compounds may be used.

In a case where the composition contains two or more epoxy group-containing compounds, the total content thereof is preferably within the above range.

[Ultraviolet Absorber]

The composition may contain an ultraviolet absorber. By doing so, a pattern shape of a cured film can be made into a superior (fine) shape.

As the ultraviolet absorber, salicylate-based, benzophenone-based, benzotriazole-based, substituted acrylonitrile-based, and triazine-based ultraviolet absorbers can be used. As specific examples thereof, the compound described in paragraphs 0137 to 0142 of JP2012-068418A (corresponding to paragraphs 0251 to 0254 of US2012/0068292A) can be used, the contents of which can be incorporated by reference into the present specification.

In addition to the aforementioned compounds, a diethyl-amino-phenylsulfonyl-based ultraviolet absorber (produced by DAITO CHEMICAL CO., LTD., trade name: UV-503) or the like is also suitably used.

Examples of the ultraviolet absorber include the compounds exemplified in paragraphs 0134 to 0148 of JP2012-032556A.

A content of the ultraviolet absorber is preferably 0.001% to 15% by mass, more preferably 0.01% to 10% by mass, and even more preferably 0.1% to 5% by mass, with respect to the total solid content of the composition.

[Silane Coupling Agent (Adhesive Agent)]

The composition may contain a silane coupling agent.

The silane coupling agent functions as an adhesive agent which improves adhesiveness between a substrate and a cured film in a case where the cured film is formed on the substrate.

The silane coupling agent is a compound containing a hydrolyzable group and other functional groups in a molecule. Moreover, the hydrolyzable group such as an alkoxy group is bonded to the silicon atom.

The hydrolyzable group refers to a substituent which is directly bonded to a silicon atom and can form a siloxane bond by a hydrolysis reaction and/or a condensation reaction. Examples of the hydrolyzable group include a halogen atom, an alkoxy group, an acyloxy group, and an alkenyloxy group. In a case where the hydrolyzable group contains a carbon atom, the number of carbon atoms is preferably equal to or smaller than 6 and more preferably equal to or smaller than 4. In particular, an alkoxy group having 4 or less carbon atoms or an alkenyloxy group having 4 or less carbon atoms is preferable.

Furthermore, in a case where a cured film is formed on a substrate, in order to improve adhesiveness between the substrate and the cured film, the silane coupling agent preferably does not contain a fluorine atom and a silicon atom (here, a silicon atom to which a hydrolyzable group is bonded is excluded), and desirably does not contain a fluorine atom, a silicon atom (here, a silicon atom to which a hydrolyzable group is bonded is excluded), an alkylene group substituted with a silicon atom, a linear alkyl group having 8 or more carbon atoms, and a branched alkyl group having 3 or more carbon atoms.

The silane coupling agent may contain an ethylenically unsaturated group such as a (meth)acryloyl group. In a case where the silane coupling agent contains an ethylenically unsaturated group, the number thereof is preferably 1 to 10 and more preferably 4 to 8. Moreover, the silane coupling agent (for example, a compound which contains a hydrolyzable group and an ethylenically unsaturated group and has a molecular weight equal to or less than 2,000) containing an ethylenically unsaturated group does not correspond to the aforementioned polymerizable compound.

A content of the silane coupling agent in the composition is preferably 0.1% to 10% by mass, more preferably 0.5% to 8% by mass, and even more preferably 1.0% to 6% by mass, with respect to the total solid content in the composition.

The composition may contain one silane coupling agent singly or two or more silane coupling agents. In a case where the composition contains two or more silane coupling agents, the total amount thereof may be within the above range.

Examples of the silane coupling agent include 3-glycidoxypropyl trimethoxysilane, 3-glycidoxypropyl triethoxysilane, 3-glycidoxypropyl methyldimethoxysilane, 3-glycidoxypropyl methyldiethoxysilane, vinyltrimethoxysilane, and vinyltriethoxysilane.

[Surfactant]

The composition may contain a surfactant. The surfactant contributes to improvement in coating properties of the composition.

In a case where the composition contains a surfactant, a content of the surfactant is preferably 0.001% to 2.0% by mass, more preferably 0.005% to 0.5% by mass, and even more preferably 0.01% to 0.1% by mass, with respect to the total solid content of the composition.

The surfactants may be used singly or in combination of two or more thereof. In a case where two or more surfactants are used in combination, the total amount thereof is preferably within the above range.

Examples of the surfactant include a fluorine-based surfactant, a nonionic surfactant, a cationic surfactant, an anionic surfactant, and a silicone-based surfactant.

For example, in a case where the composition contains a fluorine-based surfactant, liquid characteristics (particularly, fluidity) of the composition are further improved. That is, in a case where a film is formed of the composition containing the fluorine-based surfactant, an interfacial tension between a surface to be coated and a coating liquid is reduced, and accordingly, wettability with respect to the surface to be coated is improved, and coating properties to the surface to be coated are improved. Therefore, even in a case where a thin film having a thickness of about several micrometers is formed with a small amount of a liquid, the fluorine-based surfactant is effective from the viewpoint that a film having a uniform thickness and small thickness unevenness is more suitably formed.

A content ratio of fluorine in the fluorine-based surfactant is preferably 3% to 40% by mass, more preferably 5% to 30% by mass, and even more preferably 7% to 25% by mass. A fluorine-based surfactant having a content ratio of fluorine within the above range is effective from the viewpoint of uniformity of the thickness of the coating film and/or liquid saving properties, and also has favorable solubility in the composition.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, and MEGAFACE F780 (all produced by DIC Corporation), FLUORAD FC430, FLUORAD FC431, and FLUORAD FC171 (all produced by Sumitomo 3M Limited), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all produced by ASAHI GLASS CO., LTD.), and PF636, PF656, PF6320, PF6520, and PF7002 (produced by OMNOVA Solutions Inc.).

As the fluorine-based surfactant, a block polymer can also be used, and specific examples thereof include the compound described in JP2011-089090A.

[Polymerization Inhibitor]

The composition may contain a polymerization inhibitor.

The polymerization inhibitor is not particularly limited, and known polymerization inhibitors can be used. Examples of the polymerization inhibitor include a phenolic polymerization inhibitor (for example, p-methoxyphenol, 2,5-di-tert-buty-4-methylphenol, 2,6-di-tert-butyl-4-methylphenol, 4,4'-thiobis(3-methyl-6-t-butylphenol), 2,2'-methylenebis (4-methyl-6-t-butylphenol), 4-methoxynaphthol, and the like); a hydroquinone-based polymerization inhibitor (for example, hydroquinone, 2,6-di-tert-butylhydroquinone, and the like); a quinone-based polymerization inhibitor (for example, benzoquinone and the like); a free radical-based polymerization inhibitor (for example, 2,2,6,6-tetramethylpiperidine 1-oxyl free radical, 4-hydroxy-2,2,6,6-tetramethylpiperidine 1-oxyl free radicals, and the like); a nitrobenzene-based polymerization inhibitor (for example, nitrobenzene, 4-nitrotoluene, and the like); and a phenothiazine-based polymerization inhibitor (for example, phenothiazine, 2-methoxyphenothiazine, and the like).

Among them, from the viewpoint that the light-shielding composition has a superior effect, a phenolic polymerization inhibitor or a free radical-based polymerization inhibitor is preferable.

In a case where the polymerization inhibitor is used together with a resin containing a curable group, the effect thereof is remarkable.

A content of the polymerization inhibitor in the light-shielding composition is not particularly limited, but is preferably 0.0001% to 0.5% by mass, more preferably 0.0002% to 0.2% by mass, and even more preferably 0.0003% to 0.01% by mass, with respect to the total solid content of the composition. One polymerization inhibitor may be used singly or two or more polymerization inhibitors may be used. In a case where two or more polymerization inhibitors are used, the total content thereof is preferably within the above range.

[Solvent]

The composition preferably contains a solvent.

The solvent is not particularly limited, and known solvents can be used.

A content of the solvent in the composition is not particularly limited, but is preferably an amount such that the solid content of the composition is 10% to 90% by mass, more preferably an amount such that the solid content of the composition is 10% to 40% by mass, and even more preferably an amount such that the solid content of the composition is 15% to 35% by mass.

The solvents may be used singly or in combination of two or more thereof. In a case where two or more solvents are used in combination, the content thereof is preferably adjusted so that the total solid content of the composition is within the above range.

Examples of the solvent include water and an organic solvent.

Examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, 7-butyrolactone, butyl acetate, methyl lactate, N-methyl-2-pyrrolidone, and ethyl lactate, but the present invention is not limited to these examples.

(Water)

In a case where the composition contains water, a content thereof is preferably 0.001% to 5.0% by mass, more preferably 0.01% to 3.0% by mass, and even more preferably 0.1% to 1.0% by mass, with respect to the total mass of the composition.

In particular, in a case where the content of the water is equal to or less than 3.0% by mass (more preferably equal to or less than 1.0% by mass) with respect to the total mass of the composition, deterioration of the viscosity stability over time due to hydrolysis or the like of the components in the composition is easily suppressed, and in a case where the content is equal to or greater than 0.01% by mass (preferably equal to or greater than 0.1% by mass), precipitation stability over time is easily improved.

[Other Optional Components]

The composition may further contain optional components other than the aforementioned components. Examples thereof include a sensitizer, a co-sensitizer, a crosslinking agent, a curing accelerator, a filler, a heat curing accelerator, a plasticizer, a diluent, and an oil sensitizer, and known additives such as an adhesion promoter to the surface of the substrate and other auxiliaries (for example, conductive particles, a filling agent, an anti-foaming agent, a flame retardant, a leveling agent, a peeling accelerator, an antioxidant, a fragrance, a surface tension adjuster, a chain transfer agent, and the like) may be added, if necessary.

Regarding these components, reference can be made to, for example, the descriptions in paragraphs 0183 to 0228 of JP2012-003225A (corresponding to paragraphs 0237 to 0309 of US2013/0034812A), paragraphs 0101, 0102, 0103, 0104, and 0107 to 0109 of JP2008-250074A, and paragraphs 0159 to 0184 of JP2013-195480A, the contents of which are incorporated into the specification of the present application.

[Method for Producing Composition]

The composition is preferably obtained by first producing a dispersion composition in which a light-shielding pigment and a colorant are dispersed, and further mixing the obtained dispersion composition with other components.

The dispersion composition is preferably prepared by mixing a light-shielding pigment, a colorant, a resin (preferably, a dispersant), and a solvent. Moreover, it is also preferable that a polymerization inhibitor is incorporated into the dispersion composition.

The dispersion composition can be prepared by mixing the aforementioned respective components by known mixing methods (for example, mixing methods using a stirrer, a homogenizer, a high-pressure emulsification device, a wet-type pulverizer, a wet-type disperser, or the like).

In a case of preparing the composition, the respective components may be formulated at once, or each of the components may be dissolved or dispersed in a solvent and then sequentially formulated. Moreover, the input order and the operation conditions during the formulation are not particularly limited.

For the purpose of removing foreign substances, reducing defects, and the like, the composition is preferably filtered with a filter.

The filter can be used without particular limitation as long as the filter has been used in the related art in a filtration application or the like. Examples of the filter include filters made of a fluorine resin such as polytetrafluoroethylene (PTFE), a polyamide-based resin such as nylon, a polyolefin-based resin (having a high density and an ultrahigh molecular weight) such as polyethylene and polypropylene (PP), or the like. Among these materials, polypropylene (including high-density polypropylene) and nylon are preferable.

A pore size of the filter is preferably 0.1 to 7.0 µm, more preferably 0.2 to 2.5 µm, even more preferably 0.2 to 1.5 µm, and particularly preferably 0.3 to 0.7 µm. In a case where the pore size is within the above range, it is possible to reliably remove fine foreign substances such as impurities and aggregates contained in a pigment while suppressing filtration clogging of the pigment (including a light-shielding pigment).

In a case of using a filter, different filters may be combined. In this case, filtering with a first filter may be performed only once, or may be performed twice or more times. In a case where filtering is performed twice or more times with a combination of different filters, the pore sizes of the filters used in the second and subsequent filtering are preferably the same as or larger than the pore size of the filter used in the first filtering. Moreover, the first filters having different pore sizes within the above range may be combined. Regarding the pore size mentioned here, reference can be made to nominal values of filter manufacturers. A commercial filter can be selected from, for example, various filters provided by Nihon Pall Ltd., Advantec Toyo Kaisha, Ltd., Nihon Entegris K. K. (formerly Nippon Microlith Co., Ltd.), Kitz Micro Filter Corporation, and the like.

As a second filter, a filter formed of the same material as that of the first filter, or the like can be used. A pore size of the second filter is preferably 0.2 to 10.0 μM more preferably 0.2 to 7.0 μm, and even more preferably 0.3 to 6.0 μm.

The composition preferably does not contain impurities such as a metal, a halogen-containing metal salt, an acid, and an alkali. A content of impurities contained in these materials is preferably equal to or less than 1 ppm by mass, more preferably equal to or less than 1 ppb by mass, even more preferably equal to or less than 100 ppt by mass, and particularly preferably equal to or less than 10 ppt by mass, and it is most preferable that the impurities are substantially not contained (the content is equal to or less than the detection limit of the measuring device).

Furthermore, the impurities can be measured using an inductively coupled plasma mass spectrometer (manufactured by Agilent Technologies, Inc., Agilent 7500cs model).

[Method for Manufacturing Cured Film]

A composition layer formed of the composition is cured to obtain a cured film (including a pattern-like cured film).

The method for manufacturing a cured film is not particularly limited, but preferably includes the following steps.

Composition layer forming step
Exposure step
Development step

Hereinafter, each of the steps will be described.

<Composition Layer Forming Step>

In the composition layer forming step, prior to exposure, the composition is applied on a support or the like to form a layer (composition layer) of the composition. As the support, for example, a substrate for a solid-state imaging element, in which an imaging element (light-receiving element) such as a charge coupled device (CCD) and a complementary metal-oxide semiconductor (CMOS) is provided on a substrate (for example, a silicon substrate), can be used. Moreover, in order to improve adhesion with the upper layer, prevent the diffusion of substances, and planarize the surface of the substrate, an undercoat layer may be provided on the support, if necessary.

As a method for applying the composition onto the support, various coating methods such as a slit coating method, an ink jet method, a spin coating method, a cast coating method, a roll coating method, and a screen printing method can be applied. The film thickness of the composition layer is preferably 0.1 to 10 μm, more preferably 0.2 to 5 μm, and even more preferably 0.2 to 3 μm. The composition layer applied on the support can be dried (pre-baked) at a temperature of 50° C. to 140° C. for 10 to 300 seconds using a hot plate, an oven, or the like.

[Exposure Step]

In the exposure step, the composition layer formed in the composition layer forming step is exposed by irradiation with actinic rays or radiation, and the composition layer irradiated with light is cured.

The method of light irradiation is not particularly limited, but light irradiation is preferably performed through a photo mask having a pattern-like opening part.

The exposure is preferably performed by irradiation with radiation, ultraviolet rays such as a g-line, an h-line, and an i-line are particularly preferable as the radiation which can be used during the exposure, and a high-pressure mercury lamp is preferable as a light source. The irradiation intensity is preferably 5 to 1,500 mJ/cm$^2$ and more preferably 10 to 1,000 mi/cm$^2$.

In addition, in a case where the composition contains a thermal polymerization initiator, the composition layer may be heated in the exposure step. A heating temperature is not particularly limited, but is preferably 80° C. to 250° C. A heating time is not particularly limited, but is preferably 30 to 300 seconds.

Furthermore, in a case where the composition layer is heated in the exposure step, the exposure step may serve as a post-heating step which will be described later. In other words, in a case where the composition layer is heated in the exposure step, the method for manufacturing a cured film may not include the post-heating step.

[Development Step]

The development step is a step of developing the exposed composition layer to form a cured film. By this step, the composition layer in a portion which is not irradiated in the exposure step is eluted, only a photo-cured portion remains, and thus a pattern-like cured film can be obtained.

A type of a developer used in the development step is not particularly limited, but an alkaline developer which does not damage the underlying imaging element and circuit or the like is desirable.

The development temperature is 20° C. to 30° C., for example.

The development time is 20 to 90 seconds, for example. In order to further remove the residues, in recent years, the development may be performed for 120 to 180 seconds. Furthermore, in order to further improve residue removability, a step of shaking off the developer every 60 seconds and further supplying a fresh developer may be repeated several times.

The alkaline developer is preferably an alkaline aqueous solution which is prepared by dissolving an alkaline compound in water so that the concentration thereof is 0.001% to 10% by mass (preferably 0.01% to 5% by mass).

Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammoniumhydroxide, tetraethylammonium hydroxide, tetrapropylammonium hydroxide, tetrabutylammonium hydroxide, benzyltrimethylammonium hydroxide, choline, pyrrole, piperidine, and 1,8-diazabicyclo[5.4.0]-7-undecene (among them, organic alkalis are preferable).

Furthermore, in a case where the alkaline compound is used as an alkaline developer, the alkaline compound is generally subjected to a washing treatment with water after development.

[Post-Baking]

A heating treatment (post-baking) is preferably performed after the exposure step. The post-baking is a heating treatment after development in order to complete the curing. The heating temperature is preferably equal to or lower than 240° C. and more preferably equal to or lower than 220° C. The lower limit thereof is not particularly limited, but is preferably equal to or higher than 50° C. and more preferably equal to or higher than 100° C., in consideration of an efficient and effective treatment.

The post-baking can be performed continuously or batchwise by using a heating unit such as a hot plate, a convection oven (hot-air circulating dryer), and a radio-frequency heater.

The post-baking is preferably performed in an atmosphere of a low oxygen concentration. The oxygen concentration is preferably equal to or lower than 19% by volume, more preferably equal to or lower than 15% by volume, even more preferably equal to or lower than 10% by volume, particularly preferably equal to or lower than 7% by volume, and most preferably equal to or lower than 3% by volume. The lower limit thereof is not particularly limited, but is practically equal to or higher than 10 ppm by volume.

In addition, the curing may be completed by irradiation with ultraviolet rays (UV) instead of the post-baking by heating.

In this case, it is preferable that the composition further contains a UV curing agent. The UV curing agent is preferably a UV curing agent which can be cured at a wavelength shorter than 365 nm that is an exposure wavelength of a polymerization initiator added for a lithography step by ordinary i-line exposure. Examples of the UV curing agent include CIBA IRGACURE 2959 (trade name). In a case where UV irradiation is performed, the composition layer is preferably a material which is cured at a wavelength equal to or less than a wavelength of 340 nm. The lower limit value of the wavelength is not particularly limited, but is generally equal to or greater than 220 nm. Moreover, an exposure amount of the UV irradiation is preferably 100 to 5.000 mJ, more preferably 300 to 4,000 m and even more preferably 800 to 3,500 mJ. The UV curing step is preferably performed after the lithography step because low-temperature curing is more effectively performed. As an exposure light source, an ozoneless mercury lamp is preferably used.

[Physical Properties of Cured Film and Application of Cured Film]

[Physical Properties of Cured Film]

From the viewpoint that excellent light-shielding properties are exhibited, in a cured film formed of the composition according to the embodiment of the present invention, an optical density (OD) per film thickness of 1.0 m in a wavelength range of 400 to 1,200 nm is preferably equal to or higher than 2.0 and more preferably equal to or higher than 3.0. Moreover, the upper limit value thereof is not particularly limited, but is preferably equal to or lower than 10, in general. The cured film can be preferably used as a light-shielding film.

Furthermore, in a case where the cured film (light-shielding film) is used as a light-attenuating film, the optical density per film thickness of 1.0 μm in a wavelength range of 400 to 1,200 nm is preferably 0.1 to 1.5 and more preferably 0.2 to 1.0, for example.

In the present specification, the expression that the optical density per film thickness of 1.0 μm in a wavelength range of 400 to 1,200 nm is equal to or higher than 3.0 means that an optical density per film thickness of 1.0 μm in the entire wavelength range of 400 to 1,200 nm is equal to or higher than 3.0.

Moreover, in the present specification, as a method for measuring the optical density of the cured film, a cured film is first formed on a glass substrate, measurement using a transmission densitometer (X-rite 361T (visual) densitometer) is performed, the film thickness at a measurement location is also measured, and an optical density per predetermined film thickness is calculated.

The film thickness of the cured film is preferably 0.1 to 4.0 μm and more preferably 1.0 to 2.5 μm, for example. The cured film may be thinner or thicker than the above range depending on the application.

Furthermore, in a case where the cured film is used as a light-attenuating film, it is also preferable that the light-shielding properties are adjusted by making the cured film thinner (for example, 0.1 to 0.5 μm) than the above range.

In addition, it is also preferable that the cured film has a rugged surface structure. This makes it possible to reduce the reflectivity of the cured film in a case where the cured film is used as a light-shielding film. The surface of the cured film may have a rugged structure, or another layer may be provided on the cured film to impart a rugged structure. A shape of the rugged surface structure is not particularly limited, but it is preferable that the surface roughness is within a range of 0.55 μm to 1.5 μm.

The reflectivity of the cured film is preferably equal to or less than 5%, more preferably equal to or less than 3%, and even more preferably equal to or less than 2%.

A method for forming the rugged surface structure is not particularly limited, but may be a method for incorporating an organic filler and/or an inorganic filler into the cured film or other layers, a lithography method utilizing exposure development, or a method for roughening the surface of the cured film or other layers by an etching method, a sputtering method, a nanoimprint method, and the like.

Furthermore, examples of the method for reducing the reflectivity of the cured film include, in addition to the aforementioned method, a method for providing a layer of low refractive index on the cured film, a method for further providing a plurality of layers (for example, layers of high refractive index) having different refractive indices, and a method which is for forming a low-optical-density layer and a high-optical-density layer and described in JP2015-001654A.

In addition, the cured film is suitable for a light-shielding member, a light-shielding film, an antireflection member, and an antireflection film of optical filters and modules used in portable instruments such as a personal computer, a tablet PC, a mobile phone, a smartphone, and a digital camera: office automation (OA) instruments such as a printer composite machine and a scanner: industrial instruments such as monitoring camera, a barcode reader, an automated teller machine (ATM), a high-speed camera, and an instrument having a personal authentication function using face image authentication; in-vehicle camera instruments; medical camera instruments such as an endoscope, a capsule endoscope, and a catheter; a biosensor, a military reconnaissance camera, a camera for a three-dimensional map, a camera for observing weather and sea, a camera for a land resource exploration, and space instruments such as an exploration camera for the astronomy of the space and a deep space target; and the like.

The cured film can also be used in applications of a micro light emitting diode (LED), a micro organic light emitting diode (OLED), and the like. The cured film is suitable for an optical filter and an optical film used in the micro LED and the micro OLED as well as a member which imparts a light-shielding function or an antireflection function.

Examples of the micro LED and the micro OLED include the examples described in JP2015-500562A and JP2014-533890A.

The cured film is also suitable as an optical filter and an optical film used in a quantum dot sensor and a quantum dot solid-state imaging element. Moreover, the cured film is suitable as a member which imparts a light-shielding function or an antireflection function. Examples of the quantum dot sensor and the quantum dot solid-state imaging element include the examples described in US2012/0037789A and WO2008/131313A.

The cured film can also be used for an in-vehicle lighting tool. The cured film is suitable as a light-shielding film used for an in-vehicle lighting tool, for the purpose of controlling a light distribution pattern.

[Light-Shielding Film, Solid-State Imaging Element, and Solid-State Imaging Device]

It is also preferable that the cured film according to the embodiment of the present invention is used as a so-called light-shielding film. It is also preferable that such a light-shielding film is used in a solid-state imaging element.

Furthermore, the light-shielding film is one of the preferable applications in the cured film according to the embodiment of the present invention, and the light-shielding film according to the embodiment of the present invention can be manufactured in the same manner as the method for manufacturing a cured film. Specifically, a light-shielding film can be manufactured by applying the composition to a substrate to form a composition layer, and performing exposure and development on the composition layer.

In addition, the solid-state imaging element according to the embodiment of the present invention is a solid-state imaging element which includes the cured film (light-shielding film) according to the embodiment of the present invention.

As described above, the solid-state imaging element according to the embodiment of the present invention includes the cured film (light-shielding film). An aspect in which the solid-state imaging element includes the cured film (light-shielding film) is not particularly limited, and examples thereof include an aspect in which a plurality of photodiodes and light-receiving elements consisting of polysilicon or the like, which constitute a light-receiving area of a solid-state imaging element (a CCD image sensor, a CMOS image sensor, or the like), are provided on a substrate, and solid-state imaging element includes the cured film on a surface side (for example, a portion other than light receiving sections and/or pixels for adjusting color) of a support on which the light-receiving elements are formed or on a side opposite to the surface on which the light-receiving elements are formed.

Moreover, in a case where the cured film (light-shielding film) is used as a light-attenuating film, for example, by disposing a light-attenuating film so that a part of light passes through the light-attenuating film and then is incident on a light-receiving element, the dynamic range of the solid-state imaging element can be improved.

The solid-state imaging device includes the aforementioned solid-state imaging element.

Figure 2:
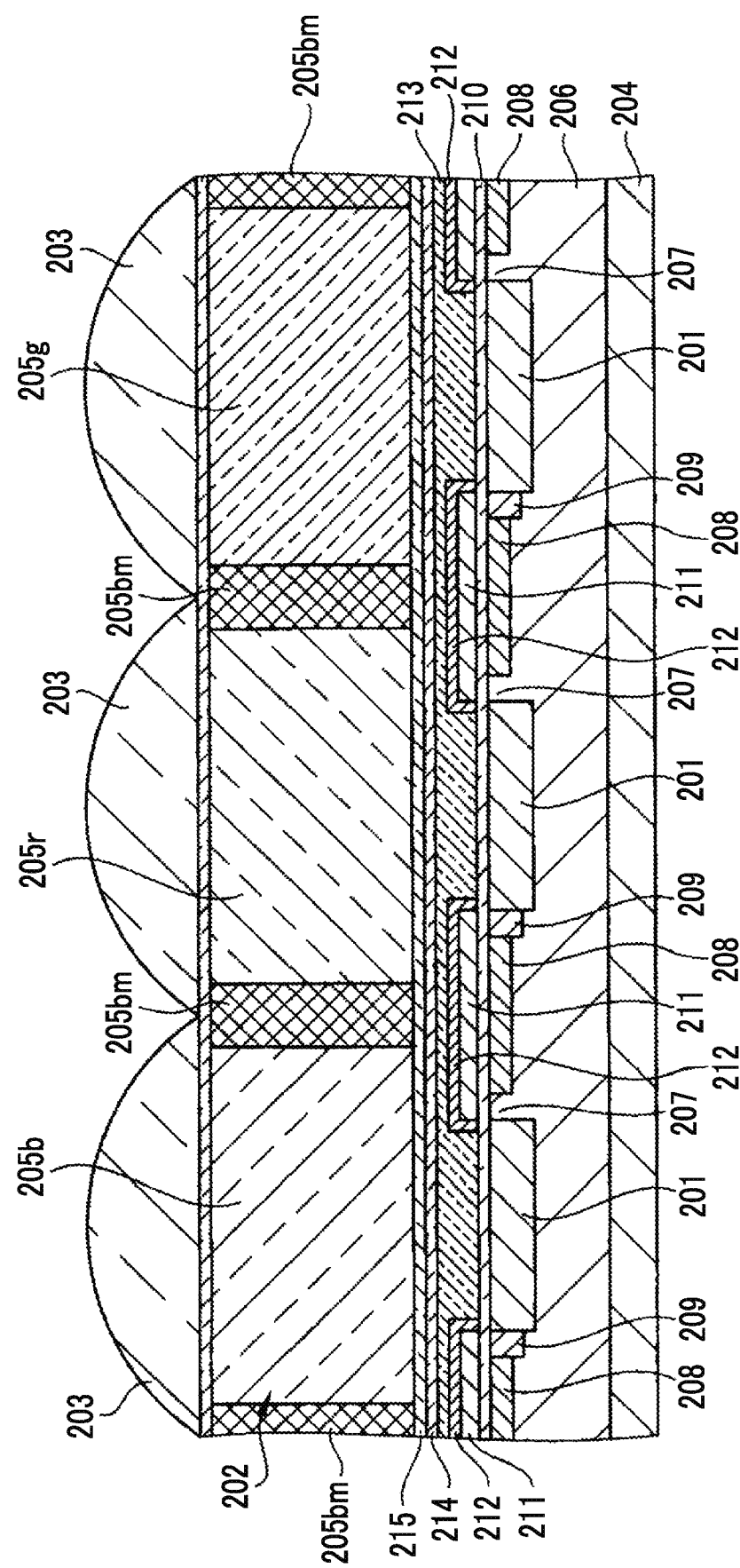
FIG. 2 is a schematic cross-sectional view showing an imaging part in FIG. 1 in an enlarged manner.

Examples of the constitutions of the solid-state imaging device and the solid-state imaging element will be described with reference to FIGS. 1 and 2. In FIGS. 1 and 2, in order that each part is clearly seen, some parts are magnified in disregard of a thickness ratio and/or a width ratio between the parts.

As shown in FIG. 1, a solid-state imaging device 100 comprises a rectangular solid-state imaging element 101 and a transparent cover glass 103 which is held above the solid-state imaging element 101 and seals the solid-state imaging element 101. Moreover, on the cover glass 103, a lens layer 111 is superposably provided through a spacer 104. The lens layer 111 includes a support 113 and a lens material 112. The lens layer 111 may have a constitution in which the support 113 and the lens material 112 are integrally formed. In a case where stray light is incident on the peripheral edge region of the lens layer 111, due to the diffusion of light, an effect of light condensation on the lens material 112 is weakened, and thus the light reaching an imaging part 102 is reduced. Moreover, noise is also generated due to the stray light. Therefore, a light-shielding film 114 is provided in the peripheral edge region of the lens layer 111 so that light is shielded. The cured film according to the embodiment of the present invention can also be used as the light-shielding film 114.

The solid-state imaging element 101 performs photoelectric conversion on an optical image formed on the imaging part 102 serving as a light-receiving surface of the solid-state imaging element 101, and outputs the converted optical image as an image signal. The solid-state imaging element 101 comprises a laminated substrate 105 obtained by laminating two sheets of substrates. The laminated substrate 105 consists of a chip substrate 106 and a circuit substrate 107 which have the same size and a rectangular shape, and the circuit substrate 107 is laminated on the rear surface of the chip substrate 106.

A material of the substrate used as the chip substrate 106 is not particularly limited, and known materials can be used.

The imaging part 102 is provided in the central part of the surface of the chip substrate 106. Moreover, in a case where stray light is incident on the peripheral edge region of the imaging part 102, a dark current (noise) is generated from the circuit in the peripheral edge region, and thus a light-shielding film 115 is provided in the peripheral edge region so that light is shielded. The cured film according to the embodiment of the present invention is preferably used as the light-shielding film 115.

A plurality of electrode pads 108 are provided at an edge part of the surface of the chip substrate 106. The electrode pads 108 are electrically connected to the imaging part 102 through a signal wire (a bonding wire can also be used) (not shown) provided on the surface of the chip substrate 106.

On the rear surface of the circuit substrate 107, external connection terminals 109 are provided at positions approximately below the electrode pads 108, respectively. The external connection terminals 109 are respectively connected to the electrode pads 108 through a through electrode 110 vertically passing through the laminated substrate 105. Moreover, the external connection terminals 109 are connected to a control circuit controlling the driving of the solid-state imaging element 101, an image processing circuit performing image processing on an imaging signal output from the solid-state imaging element 101, and the like through wiring (not shown).

As shown in FIG. 2, the imaging part 102 includes the parts, such as a light-receiving element 201, a color filter 202, and a microlens 203, provided on a substrate 204. The color filter 202 has a blue pixel 205b, a red pixel 205r, a green pixel 205g, and a black matrix 205bm. The cured film according to the embodiment of the present invention may be used as the black matrix 205bm.

As the material of the substrate 204, the same material as that of the chip substrate 106 can be used. On the surface layer of the substrate 204, a p-well layer 206 is formed. In the p-well layer 206, the light-receiving elements 201, which consist of an n-type layer and generate and accumulate signal charges by photoelectric conversion, are formed to be arranged in the form of square grids.

On one lateral side of each light-receiving element 201, through a reading gate part 207 on the surface layer of the p-well layer 206, a vertical electric charge transfer path 208 consisting of an n-type layer is formed. Moreover, on the other lateral side of each light-receiving element 201, through an element separation region 209 consisting of a p-type layer, a vertical electric charge transfer path 208 belonging to the adjacent pixel is formed. The reading gate part 207 is a channel region for the signal charges accumulated in the light-receiving element 201 to be read out toward the vertical electric charge transfer path 208.

On the surface of the substrate 204, a gate insulating film 210 consisting of an oxide-nitride-oxide (ONO) film is formed. On the gate insulating film 210, vertical electric charge transfer electrodes 211 consisting of polysilicon or amorphous silicon are formed to cover the portions which are approximately immediately above the vertical electric charge transfer path 208, the reading gate part 207, and the element separation region 209. The vertical electric charge transfer electrodes 211 function as driving electrodes for driving the vertical electric charge transfer path 208 and performing charge transfer and as reading electrodes for driving the reading gate part 207 and reading out signal charges. The signal charges are transferred to a horizontal electric charge transfer path and an output part (floating diffusion amplifier), which are not shown in the drawing, in this order from the vertical electric charge transfer path 208, and then output as voltage signals.

On each of the vertical electric charge transfer electrodes 211, a light-shielding film 212 is formed to cover the surface of the electrode. The light-shielding film 212 has an opening part at a position immediately above the light-receiving element 201 and shields a region other than the opening part from light. The cured film according to the embodiment of the present invention may be used as the light-shielding film 212.

On the light-shielding film 212, a transparent interlayer which consists of an insulating film 213 consisting of borophosphosilicate glass (BPSG), an insulating film (passivation film) 214 consisting of P—SiN, and a planarization film 215 consisting of a transparent resin or the like is provided. The color filter 202 is formed on the interlayer.

[Image Display Device]

An image display device according to the embodiment of the present invention includes the cured film according to the embodiment of the present invention.

Furthermore, the method for manufacturing the image display device according to the embodiment of the present invention is preferably a method for manufacturing an image display device including the cured film, which includes a step of manufacturing a cured film through the aforementioned manufacturing method of the present invention.

Examples of the aspect in which the image display device includes a cured film include an aspect in which a cured film is contained in a black matrix and a color filter including such a black matrix is used in an image display device.

Next, a black matrix and a color filter including the black matrix will be described, and a liquid crystal display device including such a color filter will be described as a specific example of the image display device.

<Black Matrix>

It is also preferable that the cured film according to the embodiment of the present invention is contained in the black matrix. The black matrix is incorporated into a color filter, a solid-state imaging element, and an image display device such as a liquid crystal display device in some cases.

Examples of the black matrix include those described above; a black rim provided in the peripheral edge part of an image display device such as a liquid crystal display device; a lattice-like and/or stripe-like black portion between pixels of red, blue, and green; and a dot-like and/or linear black pattern for shielding a thin film transistor (TFT) from light. The definition of the black matrix is described in, for example, "Glossary of liquid crystal display manufacturing device", written by Yasuhira KANNO, 2nd edition, NIK-KAN KOGYO SHIMBUN, LTD., 1996, p. 64.

In order to improve the display contrast and to prevent image quality deterioration resulting from current leakage of light in a case of an active matrix driving-type liquid crystal display device using a thin film transistor (TFT), the black matrix preferably has high light-shielding properties (the optical density OD is equal to or higher than 3).

The method for manufacturing the black matrix is not particularly limited, but the black matrix can be manufactured in the same manner as the method for manufacturing the cured film. Specifically, by applying the composition on a substrate to form a composition layer and performing exposure and development on the composition layer, a pattern-like cured film (black matrix) can be manufactured. Moreover, the film thickness of the cured film used as the black matrix is preferably 0.1 to 4.0 μm.

The material of the substrate is not particularly limited, but preferably has a transmittance equal to or greater than 80% for visible light (wavelength of 400 to 800 nm). Specific examples of such a material include glass such as soda lime glass, alkali-free glass, quartz glass, and borosilicate glass; and plastic such as a polyester-based resin and a polyolefin-based resin, and from the viewpoints of chemical resistance and heat resistance, alkali-free glass, quartz glass, or the like is preferable.

<Color Filter>

It is also preferable that the cured film according to the embodiment of the present invention is included in a color filter.

The aspect in which the color filter includes the cured film is not particularly limited, but examples thereof include a color filter comprising a substrate and the aforementioned black matrix. That is, examples thereof include a color filter comprising colored pixels of red, green, and blue which are formed in the opening part of the black matrix formed on a substrate.

The color filter including a black matrix (cured film) can be manufactured, for example, by the following method.

First, in an opening part of a pattern-like black matrix formed on a substrate, a coating film (composition layer) of a composition containing pigments corresponding to the colored pixels of the color filter is formed. Moreover, the composition for each color is not particularly limited, known compositions can be used, but in the composition described in the present specification, it is preferable that a composition in which the light-shielding pigment is replaced with a colorant corresponding to each pixel is used.

Subsequently, the composition layer is subjected to exposure through a photo mask having a pattern corresponding to the opening part of the black matrix. Next, colored pixels can be formed in the opening part of the black matrix by removing an unexposed portion by a development treatment, and then performing baking. In a case where the series of operations are performed using, for example, a composition for each color containing red, green, and blue pigments, a color filter having red, green, and blue pixels can be manufactured.

<Liquid Crystal Display Device>

It is also preferable that the cured film according to the embodiment of the present invention is included in a liquid crystal display device. The aspect in which the liquid crystal display device includes the cured film is not particularly limited, but examples thereof include an aspect in which a liquid crystal display device includes the color filter including the black matrix (cured film) described above.

Examples of the liquid crystal display device according to the present embodiment include an aspect in which a liquid crystal display device comprises a pair of substrates disposed to face each other and a liquid crystal compound sealed into the space between the substrates. The substrates are as described above as the substrate for a black matrix.

Examples of a specific aspect of the liquid crystal display device include a laminate having polarizing plate/substrate/color filter/transparent electrode layer/alignment film/liquid crystal layer/alignment film/transparent electrode layer/thin film transistor (TFT) element/substrate/polarizing plate/backlight unit in this order from the user side.

In addition, the liquid crystal display device is not limited to the aforementioned liquid crystal display devices, and examples thereof include the liquid crystal display devices described in "Electronic display device (written by Akio SASAKI, Kogyo Chosakai Publishing Co., Ltd., published in 1990)", "Display device (written by Sumiaki IBUKI, Sangyo Tosho Publishing Co., Ltd., published in 1989)", or the like. Moreover, examples thereof include the liquid crystal display device described in "Next-Generation Liquid Crystal Display Technology (edited by Tatsuo UCHIDA, Kogyo Chosakai Publishing Co., Ltd., published in 1994)".

[Infrared Sensor]

It is also preferable that the cured film according to the embodiment of the present invention is included in an infrared sensor.

The infrared sensor according to the embodiment will be described with reference to FIG. 3. In an infrared sensor 300 shown in FIG. 3, a reference 310 represents a solid-state imaging element.

An imaging region provided on the solid-state imaging element 310 is constituted with a combination of an infrared absorption filter 311 and a color filter 312 according to the embodiment of the present invention.

The infrared absorption filter 311 is a film which transmits light (for example, light having wavelengths of 400 to 700 nm) in the visible light range and shields light (for example, light having wavelengths of 800 to 1,300 nm, preferably light having wavelengths of 900 to 1,200 nm, and more preferably light having wavelengths of 900 to 1,000 nm) in the infrared range, and a cured film containing an infrared absorber (the aspect of the infrared absorber is as described above) as a colorant can be used.

The color filter 312 is a color filter in which pixels transmitting or absorbing light having a specific wavelength in the visible light range are formed, a color filter in which pixels of red (R), green (G), and blue (B) are formed, or the like is used as an example of the color filter, and the aspect thereof is as described above.

Between an infrared transmission filter 313 and the solid-state imaging element 310, a resin film 314 (for example, a transparent resin film or the like), which transmits light having a wavelength transmitted through the infrared transmission filter 313, is disposed.

The infrared transmission filter 313 is a filter which has visible light-shielding properties and transmits infrared rays having a specific wavelength, and a cured film which contains a colorant (for example, a perylene compound and/or a bisbenzofuranone compound) which absorbs light in a visible light range, and an infrared absorber (for example, a pyrrolopyrrole compound, a phthalocyanine compound, a naphthaocyanine compound, a polymethine compound, and the like) can be used. It is preferable that the infrared transmission filter 313 shields light having wavelengths of 400 to 830 nm and transmits light having wavelengths of 900 to 1,300 nm, for example.

On an incidence ray hv side of the color filter 312 and the infrared transmission filter 313, microlenses 315 are arranged. A planarization film 316 is formed to cover the microlenses 315.

Figure 3:
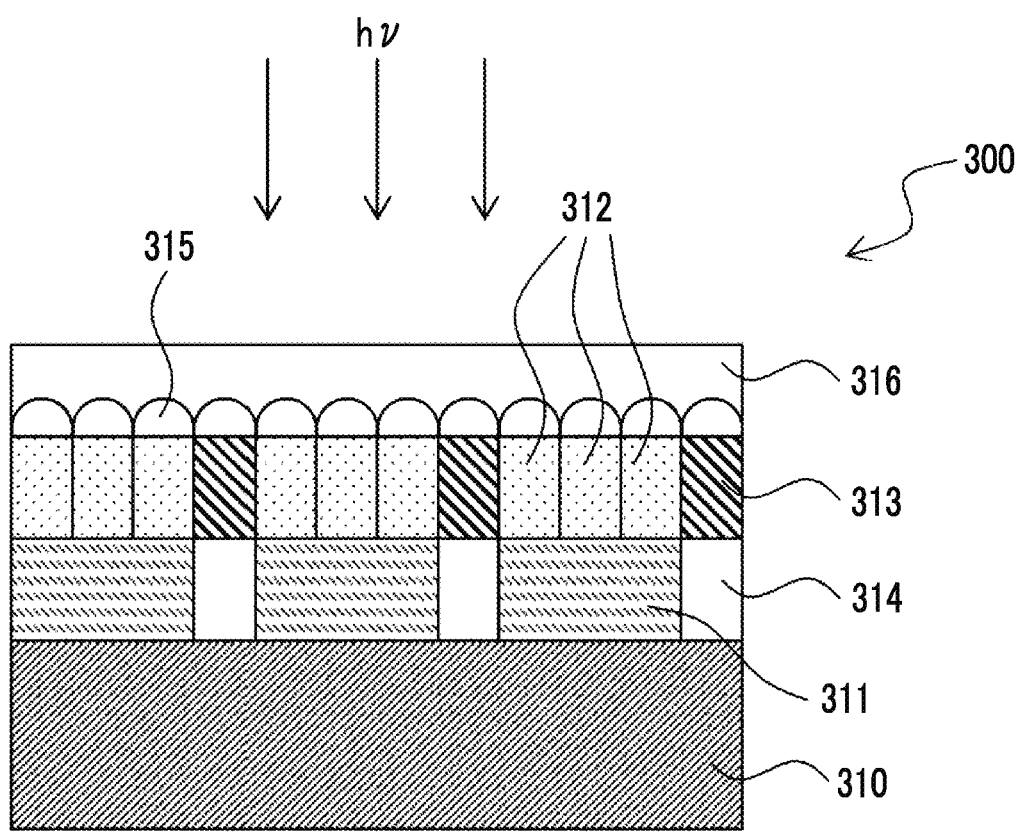
FIG. 3 is a schematic cross-sectional view showing an example of the constitution of an infrared sensor.

In the aspect shown in FIG. 3, the resin film 314 is disposed, but the infrared transmission filter 313 may be formed instead of the resin film 314. That is, on the solid-state imaging element 310, the infrared transmission filter 313 may be formed.

In the aspect shown in FIG. 3, the film thickness of the color filter 312 is the same as the film thickness of the infrared transmission filter 313, but both the film thicknesses may be different from each other.

In the aspect shown in FIG. 3, the color filter 312 is provided to be closer to the incidence ray hv side than the infrared absorption filter 311, but the order of the infrared absorption filter 311 and the color filter 312 may be switched so that the infrared absorption filter 311 is provided to be closer to the incidence ray hv side than the color filter 312.

In the aspect shown in FIG. 3, the infrared absorption filter 311 and the color filter 312 are laminated to be adjacent to each other, but both the filters are not necessarily adjacent to each other, and another layer may be provided between the filters. The cured film according to the embodiment of the present invention can be used as a light-shielding film on an edge of the surface and/or a lateral surface of the infrared absorption filter 311, and, by being used as a device inner wall of an infrared sensor, can prevent internal reflection and/or unintended incidence of light on the light receiving section and can improve sensitivity.

According to the infrared sensor, image information can be simultaneously taken in, and thus motion sensing or the like by which a subject whose movement is to be detected is recognized can be carried out. Furthermore, because distance information can be obtained, images including 3D information and the like can also be captured.

Next, a solid-state imaging device to which the aforementioned infrared sensor is applied will be described.

The solid-state imaging device includes a lens optical system, a solid-state imaging element, an infrared light-emitting diode, and the like. Furthermore, regarding each of the constituents of the solid-state imaging device, reference can be made to paragraphs 0032 to 0036 of JP2011-233983A, the contents of which are incorporated into the specification of the present application.

EXAMPLES

Hereinafter, the present invention will be described in more detail based on Examples. The materials, the amounts of the materials used, the proportions, the treatment contents, the treatment procedure, and the like shown in the following Examples can be appropriately modified as long as the gist of the present invention is maintained. Accordingly, the scope of the present invention will not be restrictively interpreted by the following Examples.

[Production of Light-Shielding Pigment]

Light-shielding pigments used in Examples were produced according to the following procedure.

<Production of Metal Nitride-Containing Particles (Inorganic Particles)>

For the production of metal nitride-containing particles (inorganic particles), the device described in paragraph 0042 and FIG. 1 of JP2005-343784A was used. Specifically, metal nitride-containing particles were produced by using the device (hereinafter, referred to as a "nanoparticle production device") which is shown in FIG. 1 of JP2005-343784A and in which a stainless steel-made vacuum chamber (manufactured by FUKUSHIN KOUGYO Co., Ltd.) was used as a discharge container 1. First, air in the vacuum chamber was exhausted by an exhaust pump. Subsequently, a mixed gas (a mixing ratio in a standard state was 50/50% by volume) of a helium (He) gas (purity of 99.99%) and an argon gas was supplied to the vacuum chamber until the pressure reached 600 Torr (79.99 kPa).

As a discharge electrode of the nanoparticle production device, an electrode obtained by molding tungsten into a rod shape having a length of 500 mm, a diameter of 12 mm, and a hollow structure with a hollow diameter of 6 mm was used. The arrangement of the discharge electrodes was the same as in FIG. 1 of JP2005-343784A. Specifically, 12 discharge electrodes were arranged in two stages, each stage having six discharge electrodes. Moreover, a distance between the upper stage and the lower stage was set to about 160 mm.

The discharge electrode having a hollow structure was connected to a raw material supplying device so that a raw material gas can be supplied into the vacuum chamber from a hollow portion of the discharge electrode.

The discharge is initiated in a state where tips of the respective discharge electrodes are in contact while applying an alternating current (voltage of 20 to 40 V and current of 70 to 100 A) with a phase difference to each discharge electrode. After arc discharge occurred, the tips of the respective discharge electrodes were moved outward so as to be spaced from each other, and set at positions where a distance between the tips of the adjacent discharge electrodes was 5 to 10 mm, and the arc discharge was continued.

After performing the arc discharge for 15 minutes, a supply tank of the raw material supplying device was heated, and the raw material gas was introduced into the vacuum chamber. First, a $NH_3$ gas (liquid ammonium ECOAN, produced by SHOWA DENKO K.K.) was introduced at 0.5 atm, a $H_2$ gas (hydrogen gas, SHOWA DENKO GAS PRODUCTS CO., LTD.) was introduced at 0.1 atm, and an Ar gas (argon gas, TAIYO NIPPON SANSO CORPORATION) was introduced at 0.4 atm. Subsequently, zirconium powders (zirconium powders produced by FUJIFILM Wako Pure Chemical Corporation) were introduced together with a nitrogen gas using a powder supplying device TP-99010FDR (manufactured by JEOL Ltd.). After introducing the nitrogen gas into the vacuum chamber for 1 hour, the voltage application from the alternating current power source was stopped, and the supply of the gas was stopped. Next, particles attached to an inner wall of the vacuum chamber were collected.

Thereafter, the obtained particles were placed in an airtight container into which a nitrogen ($N_2$) gas of which the $O_2$ content and the moisture content were each controlled to be equal to or less than 100 ppm was introduced, and left to stand for 24 hours.

The particles obtained above were heated at 200° C. using a decompression oven VAC-101P (manufactured by ESPEC Corp.) to obtain a zirconium nitride-containing particles (inorganic particles). Moreover, internal pressure of the decompression oven during heating was $1.0 \times 10^3$ Pa.

Similarly, production was performed in the same manner as in a case of the aforementioned zirconium nitride-containing particles, except that vanadium powders (vanadium metal powder VHO produced by TAIYO KOKO Co., Ltd.) and niobium powders (niobium (powder)<100 to 325 mesh> produced by Mitsuwa Chemicals Co., Ltd.) were introduced into the powder supplying device TP-99010FDR (manufactured by JEOL Ltd.) instead of the introduction of the zirconium powders, and thus vanadium nitride-containing particles and niobium nitride-containing particles were obtained, respectively.

In addition, the zirconium nitride-containing particles, the vanadium nitride-containing particles, and the niobium nitride-containing particles, which were obtained by the aforementioned method, were analyzed using an X-ray fluorescence analyzer, and as a result, a content of an oxygen atom was 1% to 5% by mass with respect to the total mass of the particles.

Moreover, in the production of the zirconium nitride-containing particles, the particles were produced by adjusting conditions so that the content of the oxygen atom was 5% to 30% by mass with respect to the total mass of the particles. The obtained particles were used as zirconium oxynitride-containing particles.

Average primary particle diameters of the obtained particles (inorganic particles) were all 30 nm.

<Production of Light-Shielding Pigments P1 to P7 and P9>

Light-shielding pigments P1 to P7 and P9 were produced by coating the inorganic particles obtained by the aforementioned production method with inorganic compounds with reference to paragraphs 0045 and 0048 (and further paragraph 0046, if necessary) of JP2008-006913A. Here, in the production of the light-shielding pigments, the inorganic particles obtained by the aforementioned production method were used instead of the fine titanium dioxide particles in JP2008-006913A, and the conditions were adjusted so that the type of the inorganic particles, the type of the inorganic compound, and the specific ratios would be as shown in Table 1 shown in the latter part.

<Production of Light-Shielding Pigment P8 (Zirconium Nitride)>

The fine zirconium nitride particles used in the production of the light-shielding pigment P1 were used as a light-shielding pigment P8.

The specific ratios of the produced light-shielding pigments P1 to P7 and P9 were measured by the method described in the specification.

[Preparation of Composition (Light-Shielding Composition)]

Compositions A1 to A10, B1, and B2 were prepared as light-shielding compositions using the light-shielding pigments obtained by the aforementioned method.

Moreover, the compositions A1 to A10 were used in Examples 1 to 10, respectively, and the compositions B1 and B2 were used in Comparative Examples 1 and 2, respectively.

<Preparation of Composition A1>

In the preparation of the composition A1, a dispersion composition was first produced, and mixed with other components to obtain a composition (light-shielding composition).

(Production of Dispersion Composition)

Resin (Dispersant) A

A resin (dispersant) A used in the preparation of the dispersion composition was synthesized by the following method.

Synthesis Example A1: Synthesis of Macromonomer A-1

ε-Caprolactone (1,044.2 g), δ-valerolactone (184.3 g), and 2-ethyl-1-hexanol (71.6 g) were introduced into a three-neck flask having a capacity of 3,000 mL to obtain a mixture. Next, the mixture was stirred bile blowing nitrogen. Subsequently, Disperbyk111 (12.5 g, produced by BYK-Chemie GmbH, phosphoric acid resin) was added to the mixture, and the obtained mixture was heated to 90° C. After 6 hours, disappearance of a signal derived from 2-ethyl-1-hexanol in the mixture was confirmed using $^1$H-nuclear magnetic resonance (NMR), and then the mixture was heated to 110° C. A polymerization reaction was continued at 110° C. for 12 hours under nitrogen, then disappearance of signals derived from ε-caprolactone and-valerolactone was confirmed by ¹H-NMR, and a molecular weight of the obtained compound was measured by the GPC method. After confirming that the molecular weight of the compound reached a desired value, 2,6-di-t-butyl-4-methylphenol (0.35 g) was added to the mixture containing the compound, and then 2-methacryloyloxyethyl isocyanate (87.0 g) was added dropwise to the obtained mixture over 30 minutes. Six hours after the completion of the dropwise addition, disappearance of a signal derived from 2-methacryloyloxyethyl isocyanate (MOI) was confirmed by ¹H-NMR, and then propylene glycol monomethyl ether acetate (PGMEA) (1,387.0 g) was added to the mixture to obtain a macromonomer A-1 solution (2,770 g) having a concentration of 50% by mass. A weight-average molecular weight of the obtained macromonomer A-1 was 6,000.

Synthesis of Resin (Dispersant) A

The macromonomer A-1 solution (200.0 g), MAA (methacrylic acid, 60.0 g), BzMA (benzyl methacrylate, 40.0 g), and PGMEA (366.7 g) were introduced into a three-neck flask having a capacity of 1,000 mL to obtain a mixture. The mixture was stirred while blowing nitrogen. Next, the mixture was heated to 75° C. while flowing nitrogen into the flask. Subsequently, dodecyl mercaptan (5.85 g) and V-601 (produced by FUJIFILM Wako Pure Chemical Corporation, polymerization initiator, 1.48 g) were sequentially added to the mixture, and a polymerization reaction was initiated. The mixture was heated at 75° C. for 2 hours, and then V-601 (1.48 g) was further added to the mixture. After 2 hours, V-601 (1.48 g) was further added to the mixture. The reaction was further performed for 2 hours, and then the mixture was heated to 90° C. and stirred for 3 hours. The polymerization reaction was completed by the operation.

After the completion of the reaction, tetrabutylammonium bromide (TBAB, 7.5 g) and p-methoxyphenol (MEHQ, 0.13 g) were added under air, and then glycidyl methacrylate (GMA, 66.1 g) was added dropwise. After the completion of the dropwise addition, the reaction was continued for 7 hours under air, and then the completion of the reaction was confirmed by measuring an acid value. PGMEA (643.6 g) was added to the obtained mixture to obtain a solution of a resin (dispersant) A of 20% by mass. In the obtained resin (dispersant) A, a weight-average molecular weight was 35,000, and an acid value was 50 mg KOH/mg.

Method for Preparing Dispersion Composition

Respective components were mixed so as to satisfy the following compositional ratio (ratio of parts by mass), and the obtained mixture was dispersed under the following dispersion conditions using NPM-Pilot manufactured by Shinmaru Enterprises Corporation to obtain a dispersion composition.

Light-Shielding Pigment P: 25 Parts by Mass
Solution of 20% by mass resin (dispersant) A in PGMEA: 37.5 parts by mass
Propylene glycol monomethyl ether acetate: 10.5 parts by mass
Butyl acetate: 27 parts by mass The dispersion conditions are as follows.
Bead size: ϕ0.05 mm, (zirconia beads manufactured by NIKKATO CORPORATION, YTZ)
Bead filling rate: 65% by volume
Circumferential speed of mill: 10 m/sec
Circumferential speed of separator: 11 m/s
Amount of mixed solution subjected to dispersion treatment: 15 kg
Circulation flow rate (pump supply rate): 90 kg/hour
Temperature of treatment liquid: 19° C. to 21° C.
Coolant: water
Treatment time: 22 hours (Composition of Composition A1)

The aforementioned dispersion composition was mixed with other components described below to obtain the composition A1.

The above dispersion composition: 76 parts by mass
Alkali-soluble resin RD-F8, produced by NIPPON SHOKUBAI CO., LTD., solid content of 40% by mass (solvent: propylene glycol monomethyl ether): 4.3 parts by mass (The alkali-soluble resin was used as a solution (resin solution) containing a resin)

Polymerizable compound M-1: KAYARAD DPHA, produced by Nippon Kayaku Co., Ltd.: 6.8 parts by mass
Polymerization initiator I-1: Oxime compound represented by Formula (I-1): 2.0 parts by mass

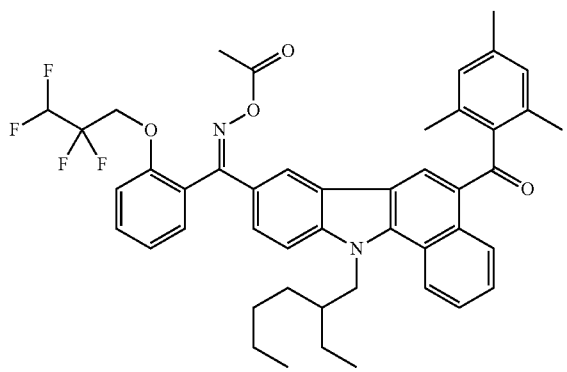

I-1

Polymerization Inhibitor p-Methoxyphenol: 0.0002 Parts by Mass

Surfactant Surfactant represented by the following formula (weight-average molecular weight (Mw)=15,311): 0.01 parts by mass (Here, in the following formula, structural units represented by Formulae (A) and (B) are 62% by mole and 38% by mole, respectively. In the structural unit represented by Formula (B), a, b, and c each satisfy relationships of a+c=14 and b=17.)

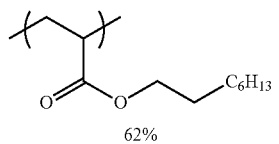

(A)

-continued (B)

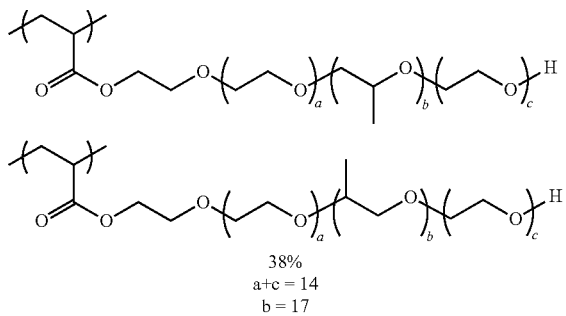

38%
a+c = 14
b = 17

Solvent PGMEA: Propylene glycol monomethyl ether acetate: 10.9 parts by mass

<Preparation of Other Compositions>

(Preparation of Composition A2)

The composition A2 was prepared in the same manner as in the preparation of the composition A1, except that the light-shielding pigment P2 was used instead of the light-shielding pigment P1 in the preparation of the composition A1.

(Preparation of Composition A3)

The composition A3 was prepared in the same manner as in the preparation of the composition A1, except that the light-shielding pigment P3 was used instead of the light-shielding pigment P1 in the preparation of the composition A1.

(Preparation of Composition A4)

The composition A4 was prepared in the same manner as in the preparation of the composition A1, except that a resin B having no graft structure was used instead of the resin A in the preparation of the composition A1.

Furthermore, the resin B was added in a form of a resin solution (ACRYBASE FF-187, solid content of 40% by mass, produced by FUJIKURA KASEI CO., LTD.) containing the resin B. In this case, a content of the resin B (solid content) in the composition was adjusted to be the same as the content (solid content) of the resin A in the composition A1.

Moreover, the addition amount of the solvent (PGMEA) was adjusted so that the concentration of the solid content in the entire composition was also the same as that of the composition A1.

(Preparation of Composition A5)

The composition A5 was prepared in the same manner as in the preparation of the composition A1, except that a resin C having no an ethylenically unsaturated group and obtained by the following synthetic method was used instead of the resin A in the preparation of the composition A1.

Synthesis of Resin C

The macromonomer A-1 solution (200.0 g), MAA (60.0 g), BzMA (40.0 g), and PGMEA (366.7 g), which were used in the synthesis of the resin A, were introduced into a three-neck flask having a capacity of 1,000 mL to obtain a mixture. The mixture was stirred while blowing nitrogen. Next, the mixture was heated to 75° C. while flowing nitrogen into the flask. Subsequently, dodecyl mercaptan (5.85 g) and V-601 (1.48 g) were sequentially added to the mixture, and a polymerization reaction was initiated. The mixture was heated at 75° C. for 2 hours, and then V-601 (1.48 g) was further added to the mixture. After 2 hours, V-601 (1.48 g) was further added to the mixture. The reaction was further performed for 2 hours, and then the mixture was heated to 90° C. and stirred for 3 hours. The polymerization reaction was completed by the operation, and then the solid content was purified to obtain a dispersant C.

Thereafter, the dispersant C was used as a solution (solvent: PGMEA) of 20% by mass in the preparation of the dispersion composition.

(Preparation of Composition A6)

The composition A6 was prepared in the same manner as in the preparation of the composition A1, except that a polymerization initiator I-2 (trade name "B-CIM", produced by Hodogaya Chemical Co., Ltd.), which does not correspond to an oxime compound represented by the following formula, was used instead of the polymerization initiator I-1 in the preparation of the composition A1.

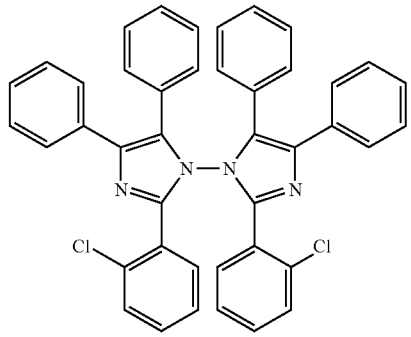 [SMILES: Clc1ccccc1-c1nc(-c2ccccc2)c(-c2ccccc2)n1-n1c(-c2ccccc2Cl)nc(-c2ccccc2)c1-c1ccccc1]

(Preparation of Composition A7)

The composition A7 was prepared in the same manner as in the preparation of the composition A1, except that the light-shielding pigment P4 was used instead of the light-shielding pigment P1 in the preparation of the composition A1.

(Preparation of Composition A8)

The composition A8 was prepared in the same manner as in the preparation of the composition A1, except that the light-shielding pigment P5 was used instead of the light-shielding pigment P1 in the preparation of the composition A1.

(Preparation of Composition A9)

The composition A9 was prepared in the same manner as in the preparation of the composition A1 except that the light-shielding pigment P6 was used instead of the light-shielding pigment P1 in the preparation of the composition A1.

(Preparation of Composition A10)

The composition A10 was prepared in the same manner as in the preparation of the composition A1, except that the light-shielding pigment P7 was used instead of the light-shielding pigment P1 in the preparation of the composition A1.

(Preparation of Composition A11)

A composition A11 was prepared in the same manner as in the preparation of the composition A1, except that M-2 (NK ESTER A-TMMT, produced by Shin-Nakamura Chemical Co., Ltd.) was used instead of the polymerizable compound M-1 in the preparation of the composition A1.

(Preparation of Composition A12)

A composition A12 was prepared in the same manner as in the preparation of the composition A1, except that two types M-1 and M-2 were each used in an amount of 3.4 parts by mass instead of the polymerizable compound M-1 (6.8 parts by mass) in the preparation of the composition A1.

(Preparation of Composition A13)

A composition A13 was prepared in the same manner as in the preparation of the composition A1, except that a polymerization initiator I-3 (IRGACURE OXE02, produced by Ciba Specialty Chemicals Inc.) corresponding to an oxime compound represented by the following formula was used instead of the polymerization initiator I-1 in the preparation of the composition A1.

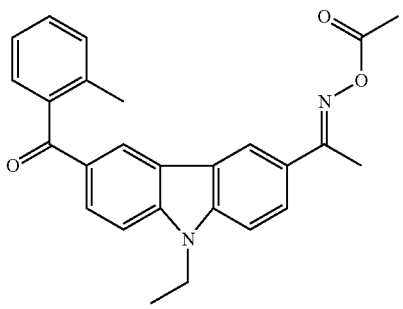 [SMILES: CCn1c2ccc(C(=O)c3ccccc3C)cc2c2cc(/C(C)=N/OC(C)=O)ccc21]

(Preparation of Composition A14)

A composition A14 was prepared in the same manner as in the preparation of the composition A1, except that a polymerization initiator I-4 (IRGACURE 379, produced by Ciba Specialty Chemicals Inc.), which does not correspond to an oxime compound represented by the following formula, was used instead of the polymerization initiator I-1 in the preparation of the composition A1.

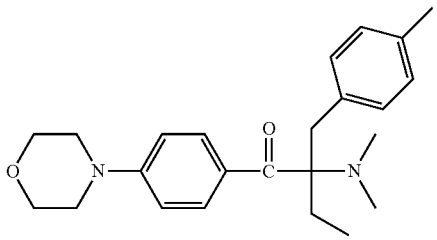 [SMILES: CCC(Cc1ccc(C)cc1)(C(=O)c1ccc(N2CCOCC2)cc1)N(C)C]

(Preparation of Composition B1)

The composition B1 was produced in the same manner as in the production of the composition A1, except that the light-shielding pigment P8 was used instead of the light-shielding pigment P1 in the preparation of the composition A1.

(Preparation of Composition B2)

The composition B2 was produced in the same manner as in the production of the composition A1 except that the light-shielding pigment P9 was used instead of the light-shielding pigment P1 in the preparation of the composition A1.

[Evaluation]

The obtained compositions were used for the following tests and evaluations.

<Temporal Stability (Normal Conditions)>

The temporal stability of each composition was evaluated by the following method.

First, the composition was diluted by two times with propylene glycol monomethyl ether acetate to obtain a diluted solution. Next, 20 mL of the diluted solution was collected, and the collected diluted solution was placed in a 50-mL resin-made container and left to stand for 6 months in an environment of 23° C. as normal conditions.

After being left to stand, 5 g of a supernatant liquid up to a depth of 1 cm from the liquid surface of the diluted solution in the resin-made container was collected, and the concentration of the solid content was measured.

An amount of change in the concentration of the solid content was calculated by comparing the concentration of the solid content in the supernatant liquid with the concentration of the solid content in the composition immediately after preparation. The results were evaluated according to the following standards. As the amount of change in the concentration of the solid content is smaller, the light-shielding pigment in the composition is less likely to be precipitated, and temporal stability is superior.

Moreover, the concentration of the solid content was calculated by the following method. That is, 1 g of the composition or the supernatant liquid was weighed, and heated in an oven at 165° C. for 60 minutes to obtain a solid content. The mass of this solid content was measured, and the concentration of the solid content was calculated based on the following expression.

Concentration (% by mass) of solid content=(mass of solid content/mass of composition or supernatant liquid (1 g))×100

Furthermore, the amount of change was calculated based on the following expression.

Amount of change (%)=concentration (% by mass) of solid content=in composition−concentration (% by mass) of solid content in supernatant liquid/concentration (% by mass) of solid content in composition×100

A: The amount of change in the concentration of the solid content was less than 1%.

B: The amount of change in the concentration of the solid content was equal to or greater than 1% and less than 3%.

C: The amount of change in the concentration of the solid content was equal to or greater than 3% and less than 5%.

D: The amount of change in the concentration of the solid content was equal to or greater than 5%.

<Temporal Stability (Forcing Conditions)>

The temporal stability was evaluated by the same method and standards as the aforementioned evaluation of the temporal stability, except that the conditions for being left to stand were changed from the normal conditions (being left to stand for 6 months in an environment of 23° C.) to forcing conditions (being left to stand for 1 week in an environment of 45° C.).

The test under the forcing conditions is an accelerated test assuming storage for a longer period of time compared to the normal conditions. In a case where the evaluation result of the amount of change under the forcing conditions is A or B, the composition is judged to have excellent long-term temporal stability.

<Light Resistance>

(Production of Substrate for Evaluation)

Each composition was applied onto a glass substrate (75 mm 75 mm square and a thickness of 1.1 mm) with a spin coater (H-360S (trade name), manufactured by MIKASA CO., LTD.). Next, the resultant was pre-baked at 100° C. for 2 minutes using a hot plate to obtain a composition layer.

The obtained composition layer was exposed at 1,000 mJ/cm² using an ultra-high-pressure mercury lamp ("USH-500BY" (trade name)) manufactured by Ushio Inc. Subsequently, the exposed composition layer was heated at 200° C. for 5 minutes using a hot plate in an air atmosphere to obtain a cured film having a film thickness of 1.5 μm. The optical density (OD) of the obtained cured film at wavelengths of 320 to 1,200 nm was measured using a transmission densitometer (X-rite 361T (visual) densitometer).

(Evaluation of Light Resistance)

The cured film produced above was irradiated (30,000.000 lux in total) with light with 100,000 lux over 300 hours using a light resistance tester (Xenon Weather Meter SX75 (trade name) manufactured by Suga Test Instruments Co., Ltd.). A temperature (temperature inside the testing device) of the cured film was set to 63° C. A relative humidity in the testing device was 50%. After the light resistance test, the amount of change in the optical density of the cured film was measured, and the light resistance was evaluated according to the following standards. The test was performed five times for each of the cured films produced under the same conditions, and an average value of the results of three times excluding the maximum value and the minimum value was adopted. Moreover, the amount of change in the optical density is determined by the following expression for a wavelength in which the amount of change in the optical density is largest in a wavelength range of 320 to 1,200 nm.

Amount of change (%)=((optical density before light resistance test−optical density after light resistance test)/optical density before light resistance test×100)

A: The amount of change in the optical density was equal to or less than 3%.

B: The amount of change in the optical density was greater than 3% and equal to or less than 7%.

C: The amount of change in the optical density was greater than 7% and equal to or less than 10%.

D: The amount of change in the optical density was greater than 10%.

<Development Residue Inhibitory>

The composition was applied by a spin coating method to a 200-mm (8-inch) silicon wafer (substrate) sprayed with hexamethyldisilazane in advance to form a composition layer. Moreover, in this case, a heating treatment (pre-baking) was performed for 120 seconds using a hot plate at 100° C., and the rotation speed of the spin coater was adjusted so that the film thickness of the composition layer after drying was 1.5 μm.

The dried composition layer having a film thickness of 1.5 μm was exposed using the i-line stepper exposure device FPA-3000i5+ (manufactured by Canon Inc.) at a wavelength of 365 nm through an island pattern mask having a pattern of 3.0 μm square. Thereafter, the silicon wafer on which the exposed composition layer was formed was placed on a horizontal rotary table of a spin shower developing machine (DW-30 type, manufactured by Chemitronics Co., Ltd.), and subjected to puddle development at 23° C. for 60 seconds using CD-2000 (organic alkaline developer, produced by FUJIFILM Electronic Materials Co., Ltd.). By doing so, a pattern (cured film having a square pixel pattern of 3.0 μm square) was formed on the silicon wafer. The silicon wafer on which the pattern was formed is fixed to the horizontal rotary table by the vacuum chuck method, and subjected to a rinse treatment by supplying pure water in a form of a shower from a spray nozzle from above the rotation center while rotating the silicon wafer at a rotation speed of 50 rpm by a rotation device. Thereafter, the silicon wafer was dried. The obtained silicon wafer was further heated (post-baked) at 200° C. for 300 seconds to obtain a silicon wafer with a pattern-like cured film. For the silicon wafer obtained in the above manner, the substrate surface in an unexposed portion was observed at a magnification of 20,000 times using a scanning electron microscope (manufactured by Hitachi High-Technologies Corporation, trade name "SU8010"), the number of particle-like residues observed in the obtained observation image was counted, and the development residue inhibitory was evaluated in light of the following standards.

A: No development residue was observed in the unexposed portion.

B: 1 to 3 particle-like development residues were observed in the unexposed portion.

C: 4 to 50 particle-like development residues were observed in the unexposed portion.

D: 51 to 100 particle-like development residues were observed in the unexposed portion.

E: At least 101 particle-like development residues were observed in the unexposed portion.

<Rectangularity>

The cross section of the silicon wafer obtained by the same method as described above was observed with a scanning electron microscope, an angle of a side wall (side wall of the square cured film) having a square pixel pattern of 3.0 μm square with respect to the surface of the silicon wafer was measured, and the rectangularity of the pattern was evaluated according to the following evaluation standards.

A: The angle of the side wall was equal to or greater than 80° and less than 100°

B: The angle of the side wall was equal to or greater than 70° and less than 80°, or equal to or greater than 1000 and less than 110°

C: The angle of the side wall was equal to or greater than 60° and less than 70° or equal to or greater than 1100 and less than 120°

D: The angle of the side wall was equal to or greater than 50 and less than 60°, or equal to or greater than 120° and less than 130°

E: The angle of the side wall was less than 50°, or equal to or greater than 130

[Result]

The features of the compositions used in the test and the test results are shown in the table below.

In the table, a column of "Inorganic particles" indicates the type of the inorganic particles used for the light-shielding pigment in the used composition. ZrN indicates zirconium nitride-containing particles, ZrON indicates zirconium oxynitride-containing particles, VN indicates vanadium nitride-containing particles, and NbN indicates niobium nitride-containing particles.

A column of "Coating" indicates the type of the inorganic compound used in the coating of the light-shielding pigment in the used composition. $SiO_2$ indicates that the inorganic compound contains $SiO_2$. ZrSi indicates that the inorganic compound contains zirconium silicide. Moreover, in a case where the inorganic compound contains zirconium silicide, the inorganic compound also contains $SiO_2$.

A column of "Type of resin" indicates the type of the resin (dispersant) used in the composition.

A column of "Graft structure" indicates whether or not a resin which is a graft polymer was used in the composition. A indicates that the resin was used, and B indicates that the resin was not used.

A column of "Ethylenically unsaturated group" indicates whether or not a resin containing an ethylenically unsaturated group was used in the composition. A indicates that the resin was used, and B indicates that the resin was not used.

A column of "Oxime" in a column of "Polymerization initiator" indicates whether or not the polymerization initiator contained in the composition corresponds to an oxime compound. A indicates that the polymerization initiator corresponds to an oxime compound, and B indicates that the polymerization initiator does not correspond to an oxime compound.

It was confirmed that in a case where the specific ratio is equal to or greater than 1.5 and less than 3.0, the temporal stability of the composition is superior (comparison of Examples 1, 3, 9, and 10).

TABLE 1

| | | Light-shielding pigment | | | Resin | | | Poly-merizable com-pound | Polymerization initiator | | Performance evaluation | | | | |
|---|---|---|---|---|---|---|---|---|---|---|---|---|---|---|---|
| | | | | | | | | | | | Temporal stability | | | Development | |
| | Com-posi-tion No. | Inor-ganic par-ticles No. | Coat-ing | Spe-cific ratio | Type of resin | Graft structure | Ethyl-enically unsaturat-ed group | | Type | Oxime | Normal conditions 23° C. 6 months | Forcing conditions 45° C. 1 week | Light resist-ance | residue in-hibitory | Rect-angu-larity |
| Example 1 | A1 | P1 | ZrN | SiO$_2$ | 2.0 | A | A | A | M-1 | I-1 | A | A | A | A | A | A |
| Example 2 | A2 | P2 | ZrN | ZrSi | 2.0 | A | A | A | M-1 | I-1 | A | A | A | A | A | A |
| Example 3 | A3 | P3 | ZrON | SiO$_2$ | 2.0 | A | A | A | M-1 | I-1 | A | A | A | A | A | A |
| Example 4 | A4 | P1 | ZrN | SiO$_2$ | 2.0 | B | B | A | M-1 | I-1 | A | B | B | A | A | A |
| Example 5 | A5 | P1 | ZrN | SiO$_2$ | 2.0 | C | A | B | M-1 | I-1 | A | B | B | A | A | C |
| Example 6 | A6 | P1 | ZrN | SiO$_2$ | 2.0 | A | A | A | M-1 | I-2 | B | A | A | A | B | C |
| Example 7 | A7 | P4 | VN | SiO$_2$ | 2.0 | A | A | A | M-1 | I-1 | A | A | A | A | A | A |
| Example 8 | A8 | P5 | NbN | SiO$_2$ | 2.0 | A | A | A | M-1 | I-1 | A | B | B | A | A | A |
| Example 9 | A9 | P6 | ZrN | SiO$_2$ | 1.1 | A | A | A | M-1 | I-1 | A | A | B | A | A | A |
| Example 10 | A10 | P7 | ZrN | SiO$_2$ | 3.0 | A | A | A | M-1 | I-1 | A | B | B | A | A | A |
| Example 11 | A11 | P1 | ZrN | SiO$_2$ | 2.0 | A | A | A | M-2 | I-1 | A | A | A | A | A | A |
| Example 12 | A12 | P1 | ZrN | SiO$_2$ | 2.0 | A | A | A | M-1/M-2 | I-1 | A | A | A | A | A | A |
| Example 13 | A13 | P1 | ZrN | SiO$_2$ | 2.0 | A | A | A | M-1 | I-3 | A | A | A | A | A | A |
| Example 14 | A14 | P1 | ZrN | SiO$_2$ | 2.0 | A | A | A | M-1 | I-4 | B | A | A | A | B | C |
| Comparative Example 1 | B1 | P8 | ZrN | None | — | A | A | A | M-1 | I-1 | A | C | D | D | A | A |
| Comparative Example 2 | B2 | P9 | ZrN | SiO$_2$ | 0.7 | A | A | A | M-1 | I-1 | A | B | C | A | A | A |

From the results shown in the table, it was confirmed that the objects of the present invention can be achieved by the composition according to the embodiment of the present invention.

It was confirmed that in a case where the composition contains a resin containing an ethylenically unsaturated group, the temporal stability of the composition and the rectangularity of the obtained pattern are superior (comparison of Example 1 and Example 5).

It was confirmed that in a case where the composition contains a resin which is a graft polymer, the temporal stability of the composition is superior (comparison of Example 1 and Example 4).

It was confirmed that in a case where the composition contains a polymerization initiator which is an oxime compound, the development residue inhibitory of the composition and the rectangularity of the obtained pattern are superior (comparison of Example 1 and Example 6).

It was confirmed that in a case where the inorganic particles are zirconium nitride, zirconium oxynitride, or vanadium nitride, the temporal stability of the composition is superior (comparison of Examples 1, 3, 7, and 8).

Moreover, in a case where the same test was performed with the same composition as in Example 1, except that the specific ratio of the light-shielding pigment was changed to 1.5 or 2.5, the same result as in Example 1 was obtained.

In a case where the same test was performed with the same composition as in Example 1, except that a surfactant was not used, the same result as in Example 1 was obtained. Similarly, in a case where the same test was performed with the same composition as in Example 1, except that a polymerization inhibitor was not used, the same result as in Example 1 was obtained.

The light-shielding pigment of Example 1 was changed to titanium nitride (referred to as a "coated titanium nitride" as well) coated with a siloxane resin synthesized according to the method described in WO2018/037913A, and the evaluation was performed in the same manner. As a result, the results were equivalent to those in Example 1, except that the temporal stability under the forcing conditions was C.

Furthermore, in a case where the coated titanium nitride was analyzed in the same manner as the specific ratio, a contained atom number ratio of a total content of titanium atoms to a content of a silicon atom in the surface of the coated titanium nitride was 1.2.

An average primary particle diameter of uncoated titanium nitride used in the production of the coated titanium nitride was 30 nm.

In a case where the light-shielding pigment of Example 1 was replaced with a mixture satisfying P1:titanium black=5:5, 7:3, or 9:1 (the ratio was a weight ratio), and the evaluation was performed in the same manner as in Example 1, the results were equivalent to those in Example 1.

A black matrix, a color filter, and a solid-state imaging element were produced using the composition of Example 1 according to the method described in WO2018/061644A. and as a result, the black matrix, the color filter, and the solid-state imaging element had favorable performances.

EXPLANATION OF REFERENCES

100: Solid-state imaging device
101: Solid-state imaging element
102: Imaging part
103: Cover glass
104: Spacer
105: Laminated substrate
106: Chip substrate
107: Circuit substrate
108: Electrode pad
109: External connection terminal
110: Through electrode
111: Lens layer
112: Lens material
113: Support
114, 115: Light-shielding film
201: Light-receiving element
202: Color filter
203: Microlens
204: Substrate
205b: Blue pixel
205r: Red pixel
205g: Green pixel
205bm: Black matrix
206: p-well layer
207: Reading gate part
208: Vertical electric charge transfer path
209: Element separation region
210: Gate insulating film
211: Vertical electric charge transfer electrode
212: Light-shielding film
213, 214: Insulating film
215: Planarization film
300: Infrared sensor
310: Solid-state imaging element
311: Infrared absorption filter
312: Color filter
313: Infrared transmission filter
314: Resin film
315: Microlens
316: Planarization film

What is claimed is:

1. A light-shielding composition comprising:
   a light-shielding pigment;
   a resin;
   a polymerizable compound which is a low-molecular-weight compound containing an ethylenically unsaturated group; and
   a polymerization initiator,
   wherein the light-shielding pigment contains an inorganic particle, and an inorganic compound coating the inorganic particle,
   the inorganic particle contains one or more nitrogen-containing metal compounds selected from the group consisting of zirconium nitride, zirconium oxynitride, vanadium nitride, vanadium oxynitride, niobium nitride, and niobium oxynitride,
   the inorganic compound contains a silicon atom, and
   a contained atom number ratio of a total content of metallic atoms, which are selected from the group consisting of a zirconium atom, a vanadium atom, and a niobium atom, to a content of the silicon atom in a surface of the light-shielding pigment, as determined by X-ray photoelectron spectroscopy, is greater than 1.0.

2. The light-shielding composition according to claim 1, wherein the nitrogen-containing metal compound is one or more selected from the group consisting of zirconium nitride and zirconium oxynitride.

3. The light-shielding composition according to claim 1, wherein the inorganic compound contains $SiO_2$.

4. The light-shielding composition according to claim 1, wherein the nitrogen-containing metal compound is one or more selected from the group consisting of zirconium nitride and zirconium oxynitride, and
the inorganic compound contains zirconium silicide.

5. The light-shielding composition according to claim 1, wherein the contained atom number ratio is equal to or greater than 1.5 and less than 3.0.

6. The light-shielding composition according to claim 1, wherein the resin is a graft polymer.

7. The light-shielding composition according to claim 1, wherein the resin contains an ethylenically unsaturated group.

8. The light-shielding composition according to claim 1, wherein the polymerization initiator is an oxime compound.

9. A cured film formed of the light-shielding composition according to claim 1.

10. A color filter comprising:
the cured film according to claim 9.

11. A light-shielding film comprising:
the cured film according to claim 9.

12. A solid-state imaging element comprising:
the cured film according to claim 9.

13. An image display device comprising:
the cured film according to claim 9.

* * * * *